(12) United States Patent
Kubota et al.

(10) Patent No.: US 11,394,014 B2
(45) Date of Patent: Jul. 19, 2022

(54) DISPLAY UNIT, DISPLAY MODULE, AND ELECTRONIC DEVICE

(71) Applicant: Semiconductor Energy Laboratory Co., Ltd., Atsugi (JP)

(72) Inventors: Daisuke Kubota, Atsugi (JP); Ryo Hatsumi, Hadano (JP); Ryo Yamauchi, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 142 days.

(21) Appl. No.: 17/001,809

(22) Filed: Aug. 25, 2020

(65) Prior Publication Data

US 2021/0066669 A1 Mar. 4, 2021

(30) Foreign Application Priority Data

Aug. 29, 2019 (JP) .............................. JP2019-156895

(51) Int. Cl.
*H01L 27/32* (2006.01)
*H01L 51/52* (2006.01)

(52) U.S. Cl.
CPC ...... *H01L 51/5284* (2013.01); *H01L 27/3218* (2013.01); *H01L 27/3234* (2013.01); *H01L 51/5246* (2013.01); *H01L 2251/5338* (2013.01)

(58) Field of Classification Search
None
See application file for complete search history.

(56) References Cited

U.S. PATENT DOCUMENTS

| | | |
|---|---|---|
| 2005/0253790 A1 | 11/2005 | Uchida |
| 2008/0252223 A1 | 10/2008 | Toyoda et al. |
| 2010/0134735 A1 | 6/2010 | Nakamura et al. |
| 2010/0220041 A1 | 9/2010 | Smith |
| 2013/0075761 A1 | 3/2013 | Akiyama |
| 2014/0350366 A1 | 11/2014 | Akiyama |
| 2016/0174847 A1 | 6/2016 | Tsuchiya |
| 2017/0330920 A1 | 11/2017 | Tanaka et al. |

(Continued)

FOREIGN PATENT DOCUMENTS

| | | |
|---|---|---|
| CN | 108962951 A | 12/2018 |
| JP | 2003-330383 A | 11/2003 |

(Continued)

*Primary Examiner* — Suberr L Chi
(74) *Attorney, Agent, or Firm* — Robinson Intellectual Property Law Office; Eric J. Robinson

(57) ABSTRACT

A display unit having a function of sensing light is provided. The display unit includes a first and second light-emitting devices, a light-receiving device, and a light-blocking layer. The first and second light-emitting devices emit a first color. The light enters the light-receiving device through a first opening of the light-blocking layer. In a top view, |a−b| of a difference between the shortest distance a from the first light-emitting device to the light-receiving device and the shortest distance b from the second light-emitting device to the light-receiving device is smaller than |c−d| of a difference between the shortest distance c from the first light-emitting device to the first opening and the shortest distance d from the second light-emitting device to the first opening. In the top view, c is shorter than d. Alternatively, a light-emitting and light-receiving device can be used.

26 Claims, 29 Drawing Sheets

(56) References Cited

U.S. PATENT DOCUMENTS

| | | | |
|---|---|---|---|
| 2019/0013368 A1 | 1/2019 | Chung et al. | |
| 2021/0126077 A1* | 4/2021 | Chae | H01L 27/3276 |
| 2021/0142722 A1* | 5/2021 | Yan | G09G 3/3225 |

FOREIGN PATENT DOCUMENTS

| | | |
|---|---|---|
| JP | 2014-197522 A | 10/2014 |
| JP | 2018-037356 A | 3/2018 |

* cited by examiner

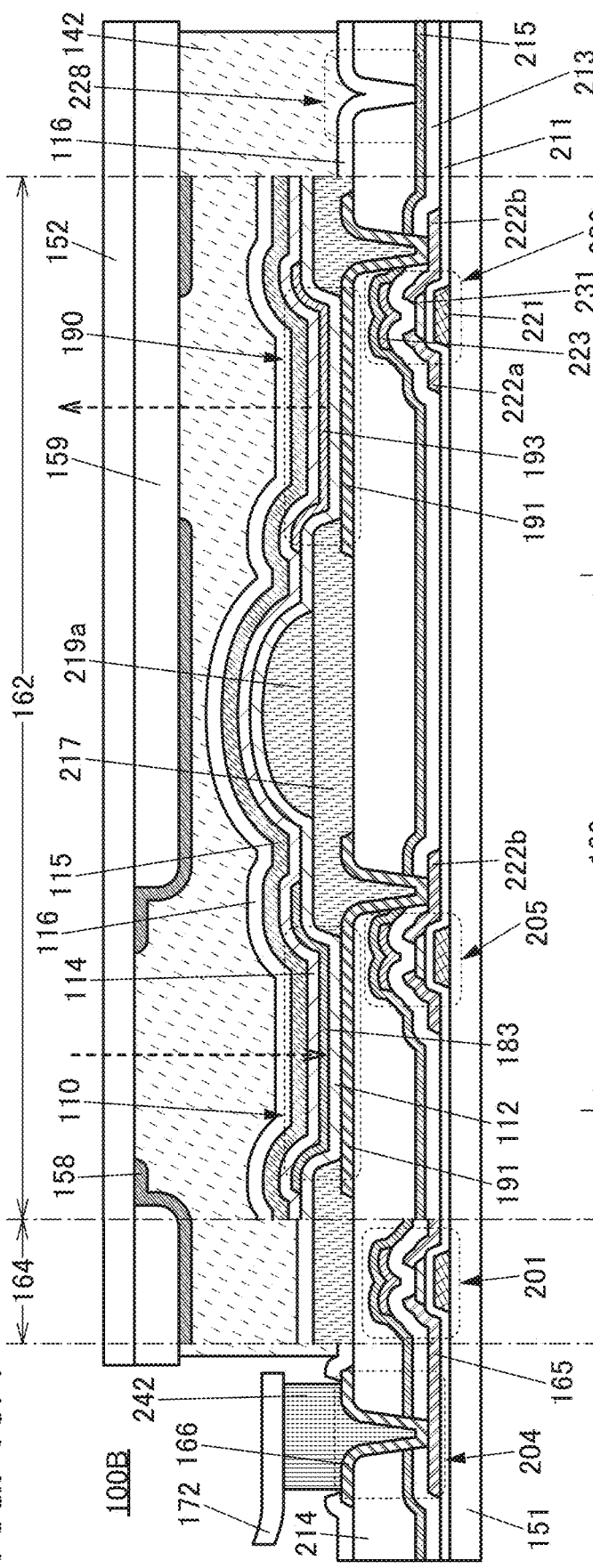
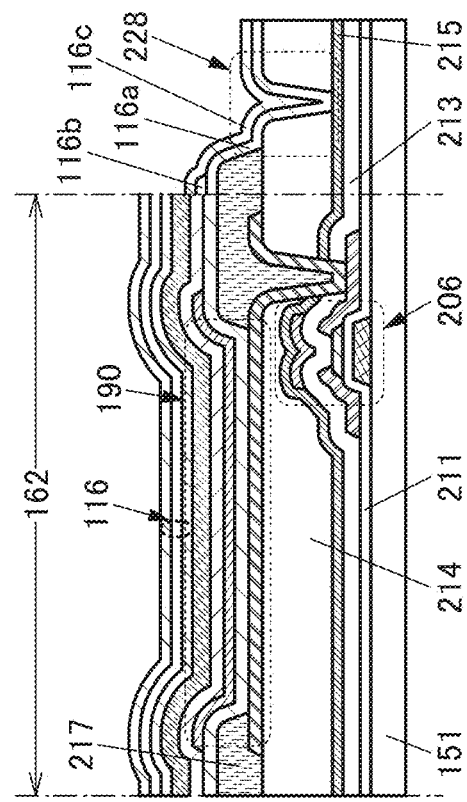
FIG. 19A
FIG. 19B

DISPLAY UNIT, DISPLAY MODULE, AND ELECTRONIC DEVICE

BACKGROUND OF THE INVENTION

1. Field of the Invention

One embodiment of the present invention relates to a display unit, a display module, and an electronic device. One embodiment of the present invention relates to a display unit including a light-receiving device (also referred to as a light-receiving element) and a light-emitting device (also referred to as a light-emitting element). Furthermore, one embodiment of the present invention relates to a display unit including a light-emitting and light-receiving device (also referred to as a light-emitting and light-receiving element) and a light-emitting device.

Note that one embodiment of the present invention is not limited to the above technical field. Examples of the technical field of one embodiment of the present invention include a semiconductor device, a display unit, a light-emitting unit, a power storage device, a memory device, an electronic device, a lighting device, an input device (e.g., a touch sensor), an input/output device (e.g., a touch panel), a method for driving any of them, and a method for manufacturing any of them.

2. Description of the Related Art

Recent display units have been expected to be applied to a variety of uses. Examples of uses for a large display unit include a television device for home use (also referred to as a TV or a television receiver), digital signage, and a public information display (PID). In addition, a smartphone and a tablet terminal including a touch panel are being developed as portable information terminals.

Light-emitting units including light-emitting devices have been developed as display units, for example. Light-emitting devices utilizing electroluminescence (hereinafter referred to as EL; such devices are also referred to as EL devices or EL elements) have features such as ease of reduction in thickness and weight, high-speed response to input signals, and driving with low DC voltage, and have been used in display units. For example, Patent Document 1 discloses a flexible light-emitting unit using an organic EL device (also referred to as an organic EL element).

REFERENCE

[Patent Document 1] Japanese Published Patent Application No. 2014-197522

SUMMARY OF THE INVENTION

An object of one embodiment of the present invention is to provide a display unit having a function of sensing light. An object of one embodiment of the present invention is to increase the resolution of a display unit having a function of sensing light. An object of one embodiment of the present invention is to provide a highly convenient display unit. An object of one embodiment of the present invention is to provide a multifunctional display unit. An object of one embodiment of the present invention is to provide a display unit with a high aperture ratio. An object of one embodiment of the present invention is to provide a novel display unit. An object of one embodiment of the present invention is to improve the manufacturing yield of a display unit having a function of sensing light. An object of one embodiment of the present invention is to reduce the number of steps for manufacturing a display unit having a function of sensing light. An object of one embodiment of the present invention is to reduce the manufacturing cost of a display unit having a function of sensing light.

Note that the description of these objects does not disturb the existence of other objects. One embodiment of the present invention does not need to achieve all of these objects. Other objects can be derived from the description of the specification, the drawings, and the claims.

One embodiment of the present invention is a display unit including a first light-emitting device, a second light-emitting device, a light-receiving device, and a light-blocking layer. In the display unit, the first light-emitting device and the second light-emitting device emit light of a first color. Light enters the light-receiving device through a first opening of the light-blocking layer. In a top view (plan view), an absolute value $|a-b|$ of a difference between a shortest distance a from the first light-emitting device to the light-receiving device and a shortest distance b from the second light-emitting device to the light-receiving device is smaller than an absolute value $|c-d|$ of a difference between a shortest distance c from the first light-emitting device to the first opening and a shortest distance d from the second light-emitting device to the first opening. In the top view, the shortest distance c is shorter than the shortest distance d. The shortest distance a is preferably equal to or substantially equal to the shortest distance b.

Among light-emitting devices that emit light of the first color, the first light-emitting device is preferably the closest to the light-receiving device.

The first light-emitting device preferably includes a first pixel electrode, a first light-emitting layer, and a common electrode. The light-receiving device preferably includes a second pixel electrode, an active layer, and the common electrode. The active layer preferably includes an organic compound. The first light-emitting layer is preferably positioned between the first pixel electrode and the common electrode. The active layer is preferably positioned between the second pixel electrode and the common electrode. The first light-emitting device and the light-receiving device preferably further include a common layer. The common layer is preferably positioned between the first pixel electrode and the common electrode and between the second pixel electrode and the common electrode.

The display unit of one embodiment of the present invention preferably further includes a resin layer and a substrate. The resin layer and the light-blocking layer are preferably each positioned between the common electrode and the substrate.

The resin layer preferably includes a second opening overlapping the light-receiving device. The resin layer preferably further includes a portion overlapping the first light-emitting device. The light-blocking layer preferably includes a portion positioned between the common electrode and the resin layer. The light-blocking layer preferably covers at least part of the second opening and at least part of a side surface of the resin layer exposed at the second opening.

Furthermore, the resin layer is preferably provided in an island shape and preferably includes a portion overlapping the first light-emitting device. The light-blocking layer preferably includes a portion positioned between the common electrode and the resin layer. At least part of light having passed through the substrate preferably enters the light-receiving device without passing through the resin layer. The light-blocking layer preferably covers at least part of a side surface of the resin layer.

The display unit of one embodiment of the present invention preferably further includes an adhesive layer. The adhesive layer is preferably positioned between the common electrode and the substrate. The resin layer and the light-blocking layer are preferably each positioned between the adhesive layer and the substrate. The adhesive layer preferably includes a first portion overlapping the light-receiving device and a second portion overlapping the first light-emitting device. The first portion is thicker than the second portion.

The display unit of one embodiment of the present invention preferably includes a plurality of such light-receiving devices. The display unit of one embodiment of the present invention is preferably configured to operate in a mode where all the light-receiving devices are used for image capturing and a mode where some of the light-receiving devices are used for image capturing.

Instead of the aforementioned light-receiving device, a light-emitting and light-receiving device that emits light of a second color and has a light-receiving function may be included in the display unit of one embodiment of the present invention.

One embodiment of the present invention is a display unit including a first light-emitting device, a second light-emitting device, a light-emitting and light-receiving device, and a light-blocking layer. In the display unit, the first light-emitting device and the second light-emitting device emit light of a first color. The light-emitting and light-receiving device emits light of a second color. Light enters the light-emitting and light-receiving device through a first opening of the light-blocking layer. In a top view, an absolute value |a−b| of a difference between a shortest distance a from the first light-emitting device to the light-emitting and light-receiving device and a shortest distance b from the second light-emitting device to the light-emitting and light-receiving device is smaller than an absolute value |c−d| of a difference between a shortest distance c from the first light-emitting device to the first opening and a shortest distance d from the second light-emitting device to the first opening. In the top view, the shortest distance c is shorter than the shortest distance d. The shortest distance a is preferably equal to or substantially equal to the shortest distance b.

Among light-emitting devices that emit light of the first color, the first light-emitting device is preferably the closest to the light-emitting and light-receiving device.

The first light-emitting device preferably includes a first pixel electrode, a first light-emitting layer, and a common electrode. The light-emitting and light-receiving device preferably includes a second pixel electrode, a second light-emitting layer, an active layer, and the common electrode. The active layer preferably includes an organic compound. The first light-emitting layer is preferably positioned between the first pixel electrode and the common electrode. The second light-emitting layer and the active layer are preferably each positioned between the second pixel electrode and the common electrode. The first light-emitting device and the light-emitting and light-receiving device preferably further include a common layer. The common layer is preferably positioned between the first pixel electrode and the common electrode and between the second pixel electrode and the common electrode.

The display unit of one embodiment of the present invention preferably further includes a resin layer and a substrate. The resin layer and the light-blocking layer are preferably each positioned between the common electrode and the substrate.

The resin layer preferably includes a second opening overlapping the light-emitting and light-receiving device. The resin layer preferably includes a portion overlapping the first light-emitting device. The light-blocking layer preferably includes a portion positioned between the common electrode and the resin layer. The light-blocking layer preferably covers at least part of the second opening and at least part of a side surface of the resin layer exposed at the second opening.

Furthermore, the resin layer is preferably provided in an island shape and preferably includes a portion overlapping the first light-emitting device. The light-blocking layer preferably includes a portion positioned between the common electrode and the resin layer. At least part of light having passed through the substrate preferably enters the light-emitting and light-receiving device without passing through the resin layer. The light-blocking layer preferably covers at least part of a side surface of the resin layer.

The display unit of one embodiment of the present invention preferably further includes an adhesive layer. The adhesive layer is preferably positioned between the common electrode and the substrate. The resin layer and the light-blocking layer are preferably each positioned between the adhesive layer and the substrate. The adhesive layer preferably includes a first portion overlapping the light-emitting and light-receiving device and a second portion overlapping the first light-emitting device. The first portion is preferably thicker than the second portion.

The display unit of one embodiment of the present invention includes a plurality of such light-emitting and light-receiving devices.

The display unit of one embodiment of the present invention is preferably configured to operate in a mode where all the light-emitting and light-receiving devices are used for image capturing and a mode where some of the light-emitting and light-receiving devices are used for image capturing.

Furthermore, the display unit of one embodiment of the present invention is preferably configured to operate in a first mode for performing display, a second mode for performing image capturing, and a third mode for simultaneously performing display and image capturing. In the first mode, display is preferably performed using the first light-emitting device, the second light-emitting device, and all the light-emitting and light-receiving devices. In the second mode, image capturing is preferably performed by light emission by each of the first light-emitting device and the second light-emitting device and light reception by all the light-emitting and light-receiving devices. In the third mode, image capturing is preferably performed by light emission by the first light-emitting device and light reception by part of the light-emitting and light-receiving devices and display is preferably performed using the second light-emitting device and the other light-emitting and light-receiving devices.

The display unit of one embodiment of the present invention preferably has flexibility.

One embodiment of the present invention is a module including the display unit having any of the above structures. For example, the module is provided with a connector such as a flexible printed circuit (FPC) or a tape carrier package (TCP), or an integrated circuit (IC) is mounted on the module by a chip on glass (COG) method, a chip on film (COF) method, or the like.

One embodiment of the present invention is an electronic device including the above-described display module and at least one of an antenna, a battery, a housing, a camera, a speaker, a microphone, and an operation button.

With one embodiment of the present invention, a display unit having a function of sensing light can be provided. With one embodiment of the present invention, the resolution of a display unit having a function of sensing light can be increased. With one embodiment of the present invention, a highly convenient display unit can be provided. With one embodiment of the present invention, a multifunctional display unit can be provided. With one embodiment of the present invention, a display unit with a high aperture ratio can be provided. With one embodiment of the present invention, a novel display unit can be provided.

With one embodiment of the present invention, the manufacturing yield of a display unit having a function of sensing light can be improved. With one embodiment of the present invention, the number of steps for manufacturing a display unit having a function of sensing light can be reduced. With one embodiment of the present invention, the manufacturing cost of a display unit having a function of sensing light can be reduced.

Note that the description of these effects does not disturb the existence of other effects. One embodiment of the present invention does not necessarily have all of these effects. Other effects can be derived from the description of the specification, the drawings, and the claims.

BRIEF DESCRIPTION OF THE DRAWINGS

In the accompanying drawings:

FIGS. 19A and 19B are cross-sectional views each illustrating an example of a display unit;

DETAILED DESCRIPTION OF THE INVENTION

Figure 1A:
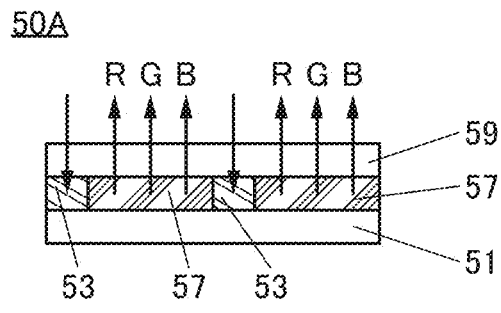
FIGS. 1A to 1F are cross-sectional views each illustrating an example of a display unit.

Embodiments will be described in detail with reference to the drawings. Note that the present invention is not limited to the following description, and it will be readily appreciated by those skilled in the art that modes and details of the present invention can be modified in various ways without departing from the spirit and scope of the present invention. Therefore, the present invention should not be construed as being limited to the description in the following embodiments.

Note that in structures of the invention described below, the same portions or portions having similar functions are denoted by the same reference numerals in different drawings, and the description thereof is not repeated. The same hatching pattern is used for portions having similar functions, and the portions are not denoted by specific reference numerals in some cases.

The position, size, range, or the like of each component illustrated in drawings does not represent the actual position, size, range, or the like in some cases for easy understanding. Therefore, the disclosed invention is not necessarily limited to the position, size, range, or the like disclosed in the drawings.

Note that the term "film" and the term "layer" can be interchanged with each other depending on the case or circumstances. For example, the term "conductive layer" can be replaced with the term "conductive film". As another example, the term "insulating film" can be replaced with the term "insulating layer".

Embodiment 1

In this embodiment, a display unit of one embodiment of the present invention will be described with reference to FIGS. 1A to 1K to FIGS. 21A and 21B.

The display unit of one embodiment of the present invention includes a first light-emitting device, a second light-emitting device, a light-receiving device, and a light-blocking layer. The first light-emitting device and the second light-emitting device emit light of a first color. Light enters the light-receiving device through a first opening of the light-blocking layer. In a top view, an absolute value |a−b| of a difference between a shortest distance a from the first light-emitting device to the light-receiving device and a shortest distance b from the second light-emitting device to the light-receiving device is smaller than an absolute value |c−d| of a difference between a shortest distance c from the first light-emitting device to the first opening and a shortest distance d from the second light-emitting device to the first opening. In the top view, the shortest distance c is shorter than the shortest distance d.

The display unit of one embodiment of the present invention includes a first light-emitting device, a second light-emitting device, a light-emitting and light-receiving device, and a light-blocking layer. The first light-emitting device and the second light-emitting device emit light of a first color. The light-emitting and light-receiving device emits light of a second color. Light enters the light-emitting and light-receiving device through a first opening of the light-blocking layer. In a top view, an absolute value |a−b| of a difference between a shortest distance a from the first light-emitting device to the light-emitting and light-receiving device and a shortest distance b from the second light-emitting device to the light-emitting and light-receiving device is smaller than an absolute value |c−d| of a difference between a shortest distance c from the first light-emitting device to the first opening and a shortest distance d from the second light-emitting device to the first opening. In the top view, the shortest distance c is shorter than the shortest distance d.

In the top view, the first light-emitting device is positioned closer to the first opening than the second light-emitting device is. Therefore, the light-receiving device (or the light-emitting and light-receiving device) is more likely to receive light which is emitted by the first light-emitting device and then reflected or scattered by an object than to receive light which is emitted by the second light-emitting device and then reflected or scattered by an object.

The display unit of one embodiment of the present invention is a structure suitable for a driving method or the like in which much light coming from a particular light-emitting device is required to enter the light-receiving device (or the light-emitting and light-receiving device). For example, much light coming from the light-emitting device used as a light source can enter the light-receiving device or the light-emitting and light-receiving device in the display unit of one embodiment of the present invention.

In the case where touch sensing is performed while an image is displayed on the display unit, lighting and non-lighting of the light-emitting device can be made to repeat periodically in some pixels, and image display can be performed in the other pixels, for example. A difference in detection intensity of the light-receiving device or the light-emitting and light-receiving device between a lighting period and a non-lighting period is obtained, so that the influence of ambient light can be removed and touch sensing accuracy can be increased. In this case, it is preferable that much light coming from the light-emitting devices included in the pixels where lighting and non-lighting repeat enter the light-receiving device (or the light-emitting and light-receiving device). Furthermore, the amount of incident light coming from the light-emitting devices included in the pixels used for displaying an image is preferably small. Thus, lighting and non-lighting preferably repeat in the first light-emitting device, and light emission is preferably performed on the basis of image data in the second light-emitting device.

In the top view, the shortest distance a from the first light-emitting device to the light-receiving device (or the light-emitting and light-receiving device) may be different from the shortest distance b from the second light-emitting device to the light-receiving device (or the light-emitting and light-receiving device). Alternatively, the shortest distance a may be equal to or substantially equal to the shortest distance b.

In this specification and the like, "Distance A is substantially equal to Distance B" includes cases where a difference between Distance A and Distance B occurs owing to a manufacturing error generated when manufacturing is performed so that Distance A can be equal to Distance B.

The position, top surface shape, size, and the like of the devices such as the light-emitting device, the light-receiving device, or the light-emitting and light-receiving device may be adjusted in order to control light incident on the light-receiving device (or the light-emitting and light-receiving device).

The layout flexibility of the device itself might be low because the layout needs to be determined in consideration of the resolution of the display unit, the aperture ratio of pixels, design margin, and the like. In particular, as the resolution of the display unit is higher, the layout flexibility of the device itself is lowered. In consideration of the above facts, it is preferable to control light incident on the light-receiving device (or the light-emitting and light-receiving device) by adjusting the position of the opening (the above-described first opening) which is of the light-blocking layer and provided in a position overlapping with the light-receiving device (or the light-emitting and light-receiving device). Thus, the resolution and manufacturing yield of the display unit can be increased. Since a change in the layout of the device itself for the purpose of controlling light incident on the light-receiving device (or the light-emitting and light-receiving device) is not necessary, the display unit having a high aperture ratio of pixels can be manufactured with a high yield.

Note that in this specification and the like, the position overlapping with the light-emitting device refers specifically to a position overlapping with a light-emitting region of the light-emitting device. Similarly, the position overlapping with the light-receiving device refers to a position overlapping with a light-receiving region of the light-receiving device. The position overlapping with the light-emitting and light-receiving device refers to a position overlapping with a light-emitting and light-receiving region of the light-emitting and light-receiving device.

As described above, the display unit of one embodiment of the present invention may include light-receiving devices and light-emitting devices, or alternatively may include light-emitting and light-receiving devices and light-emitting devices.

First, the display unit including light-receiving devices and light-emitting devices is described.

The display unit of one embodiment of the present invention includes light-receiving devices and light-emitting devices in a display portion. In the display unit of one embodiment of the present invention, the light-emitting devices are arranged in a matrix in the display portion, and an image can be displayed on the display portion. Furthermore, the light-receiving devices are arranged in a matrix in the display portion, and the display portion has one or both of an image capturing function and a sensing function. The display portion can be used as an image sensor or a touch sensor. That is, by sensing light at the display portion, an image can be captured or the approach or contact of an object (e.g., a finger or a stylus) can be sensed. Furthermore, in the display unit of one embodiment of the present invention, the light-emitting devices can be used as a light source of the sensor. Accordingly, a light-receiving portion and a light source do not need to be provided separately from the display unit; hence, the number of components of an electronic device can be reduced.

In the display unit of one embodiment of the present invention, when an object reflects (or scatters) light emitted by the light-emitting device included in the display portion, the light-receiving device can sense the reflected light (or the scattered light); thus, image capturing and touch (including near touch) sensing are possible even in a dark place.

The display unit of one embodiment of the present invention has a function of displaying an image using the light-emitting devices. That is, the light-emitting devices function as display devices (also referred to as display elements).

As the light-emitting devices, EL devices such as organic light-emitting diodes (OLEDs) and quantum-dot light-emitting diodes (QLEDs) are preferably used. Examples of a light-emitting substance included in the EL device include a substance exhibiting fluorescence (a fluorescent material), a substance exhibiting phosphorescence (a phosphorescent material), an inorganic compound (e.g., a quantum dot material), and a substance exhibiting thermally activated delayed fluorescence (a thermally activated delayed fluorescent (TADF) material). A light-emitting diode (LED) such as a micro-LED can be used as the light-emitting device.

The display unit of one embodiment of the present invention has a function of sensing light using the light-receiving devices.

When the light-receiving devices are used as an image sensor, the display unit can capture an image using the light-receiving devices. For example, the display unit of this embodiment can be used as a scanner.

For example, data on biological information of a fingerprint, a palm print, or the like can be acquired with the image sensor. That is, a biological authentication sensor can be incorporated in the display unit of this embodiment. When the display unit incorporates a biological authentication sensor, the number of components of an electronic device can be reduced as compared to the case where a biological authentication sensor is provided separately from the display unit; thus, the size and weight of the electronic device can be reduced.

When the light-receiving devices are used as the touch sensor, the display unit can sense the approach or contact of an object with the use of the light-receiving devices.

As the light-receiving devices, PN photodiodes or PIN photodiodes can be used, for example. The light-receiving devices function as photoelectric conversion devices (also referred to as photoelectric conversion elements) that sense light entering the light-receiving devices and generate electric charge. The amount of electric charge generated from the light-receiving devices depends on the amount of light incident on the light-receiving devices.

It is particularly preferable to use an organic photodiode including a layer containing an organic compound as the light-receiving device. An organic photodiode, which is easily made thin, lightweight, and small in area and has a high degree of freedom for shape and design, can be used in a variety of display units.

In one embodiment of the present invention, organic EL devices are used as the light-emitting devices, and organic photodiodes are used as the light-receiving devices. The organic EL devices and the organic photodiodes can be formed over one substrate. Thus, the organic photodiodes can be incorporated in the display unit including the organic EL devices.

If all the layers of the organic EL devices and the organic photodiodes are formed separately, the number of film formation steps becomes extremely large. Since a large number of layers can be shared between the organic photodiodes and the organic EL devices, forming the common layers concurrently can prevent the increase in the number of film formation steps.

For example, one of a pair of electrodes (a common electrode) can be a layer shared by the light-receiving devices and the light-emitting devices. As another example, at least one of a hole-injection layer, a hole-transport layer, an electron-transport layer, and an electron-injection layer is preferably shared by the light-receiving devices and the light-emitting devices. As another example, active layers of the light-receiving devices and light-emitting layers of the light-emitting devices are separately formed, and the other layers can be shared by the light-receiving devices and the light-emitting devices. In other words, the light-receiving devices can be manufactured by only replacing the light-emitting layers of the light-emitting devices with active layers. When the light-receiving devices and the light-emitting devices include common layers in such a manner, the number of film formation steps and the number of masks can be reduced, thereby reducing the number of manufacturing steps and the manufacturing cost of the display unit. Furthermore, the display unit including the light-receiving devices can be manufactured using an existing manufacturing apparatus and an existing manufacturing method for the display unit.

Note that a layer shared by the light-receiving devices and the light-emitting devices may have a different function depending on which devices the layer is in. In this specification, the name of a component is based on its function in the light-emitting devices. For example, a hole-injection layer functions as a hole-injection layer in the light-emitting devices and functions as a hole-transport layer in the light-receiving devices. Similarly, an electron-injection layer functions as an electron-injection layer in the light-emitting devices and functions as an electron-transport layer in the light-receiving devices. A layer shared by the light-receiving devices and the light-emitting devices may have the same function in both the light-receiving devices and the light-emitting devices. The hole-transport layer functions as a hole-transport layer in both of the light-emitting devices and the light-receiving devices, and the electron-transport layer functions as an electron-transport layer in both of the light-emitting devices and the light-receiving devices.

Next, a display unit including light-emitting and light-receiving devices and light-emitting devices is described.

When a subpixel including a light-receiving device is provided in a display unit in addition to a subpixel including a light-emitting device, the aperture ratio of pixels might be lowered or an increase in the resolution of the display unit might become difficult.

In view of this, instead of the light-emitting device, a light-emitting and light-receiving device is provided in a subpixel which emits light of any color in a display unit of one embodiment of the present invention. The light-emitting and light-receiving device has both a function of emitting light (a light-emitting function) and a function of receiving light (a light-receiving function). For example, in the case where a pixel includes three subpixels of red, green, and blue, at least one of the subpixels includes a light-emitting and light-receiving device and the other subpixels each include a light-emitting device. The use of the light-emitting and light-receiving device serving as both a light-emitting device and a light-receiving device can provide a light-receiving function for the pixel without increasing the number of subpixels included in the pixel. Thus, the display portion of the display unit can be provided with one or both of an image capturing function and a sensing function while keeping the aperture ratio of pixels (aperture ratio of subpixels) and the resolution of the display unit.

In the display unit of one embodiment of the present invention, the light-emitting and receiving devices and the light-emitting devices are arranged in a matrix in the display portion, and an image can be displayed on the display portion. The display portion can be used as an image sensor or a touch sensor. In the display unit of one embodiment of the present invention, the light-emitting devices can be used as a light source of the sensor. Accordingly, a light-receiving portion and a light source do not need to be provided separately from the display unit; hence, the number of components of an electronic device can be reduced.

In the display unit of one embodiment of the present invention, when an object reflects (or scatters) light emitted by the light-emitting device included in the display portion, the light-emitting and light-receiving device can sense the reflected light (or the scattered light); thus, image capturing and touch (including near touch) sensing are possible even in a dark place.

The light-emitting and light-receiving device can be manufactured by combining an organic EL device and an organic photodiode. For example, by adding an active layer of an organic photodiode to a layered structure of an organic EL device, the light-emitting and light-receiving device can be manufactured. Furthermore, in the light-emitting and light-receiving device formed of a combination of an organic EL device and an organic photodiode, layers common to the organic EL device and the organic photodiode are formed together, so that an increase in the number of film formation steps can be prevented.

For example, one of a pair of electrodes (a common electrode) can be a layer shared by the light-emitting and light-receiving devices and the light-emitting devices. As another example, at least one of a hole-injection layer, a hole-transport layer, an electron-transport layer, and an electron-injection layer is preferably shared by the light-emitting and light-receiving devices and the light-emitting devices. As another example, the light-emitting and light-receiving devices and the light-emitting devices can have the same structure except for active layers of the light-emitting devices. In other words, the light-emitting and light-receiving devices can be manufactured by only adding the active layers of the light-receiving devices to the light-emitting devices. When the light-emitting and light-receiving devices and the light-emitting devices include common layers in such a manner, the number of film formation steps and the number of masks can be reduced, thereby reducing the number of manufacturing steps and the manufacturing cost of the display unit. Furthermore, the display unit including the light-emitting and light-receiving devices can be manufactured using an existing manufacturing apparatus and an existing manufacturing method for the display unit.

Note that layers included in the light-emitting and light-receiving devices might have different functions between the case where the light-emitting and light-receiving devices function as the light-receiving devices and the case where the light-emitting and light-receiving devices function as the light-emitting devices. In this specification, the name of a component is based on its function of the case where the light-emitting and light-receiving devices function as the light-emitting devices. For example, a hole-injection layer functions as a hole-injection layer in the case where the light-emitting and light-receiving devices function as the light-emitting devices, and functions as a hole-transport layer in the case where the light-emitting and light-receiving devices function as the light-receiving devices. Similarly, an electron-injection layer functions as an electron-injection layer in the case where the light-emitting and light-receiving devices function as the light-emitting devices, and functions as an electron-transport layer in the case where the light-emitting and light-receiving devices function as the light-receiving devices. A layer included in the light-emitting and light-receiving devices may have the same function in both the case where the light-emitting and light-receiving devices function as the light-receiving devices and the case where the light-emitting and light-receiving devices function as the light-emitting devices. The hole-transport layer functions as a hole-transport layer in both the cases. The electron-transport layer functions as an electron-transport layer in both the cases.

The display unit of this embodiment has a function of displaying images using the light-emitting devices and the light-emitting and light-receiving devices. That is, the light-emitting devices and the light-emitting and light-receiving devices function as display devices.

The display unit of this embodiment has a function of sensing light using the light-emitting and light-receiving devices. The light-emitting and light-receiving device can sense light having a shorter wavelength than light emitted by the light-emitting and light-receiving device itself.

When the light-emitting and light-receiving devices are used as an image sensor, the display unit of this embodiment can capture an image using the light-emitting and light-receiving devices. For example, the display unit of this embodiment can be used as a scanner.

When the light-emitting and light-receiving devices are used as the touch sensor, the display unit of this embodiment can sense the approach or contact of an object with the use of the light-emitting and light-receiving devices.

The light-emitting and light-receiving devices function as photoelectric conversion devices that sense light entering the light-emitting and light-receiving devices and generate electric charge. The amount of electric charge generated from the light-emitting and light-receiving devices depends on the amount of light incident on the light-emitting and light-receiving devices.

The light-emitting and light-receiving device can be manufactured by adding an active layer of the light-receiving device to the above-described structure of the light-emitting device.

A PN or PIN photodiode structure can be applied to the light-emitting and light-receiving device, for example.

It is particularly preferable to use an active layer of an organic photodiode including a layer containing an organic compound as the light-emitting and light-receiving device. An organic photodiode, which is easily made thin, lightweight, and small in area and has a high degree of freedom for shape and design, can be used in a variety of display units.

The display unit of one embodiment of the present invention is more specifically described below with reference to drawings.

[Display Unit]

FIGS. 1A to 1F are cross-sectional views each illustrating a display unit of one embodiment of the present invention.

A display unit 50A illustrated in FIG. 1A includes a layer 53 including a light-receiving device and a layer 57 including a light-emitting device between a substrate 51 and a substrate 59.

Figure 1B:
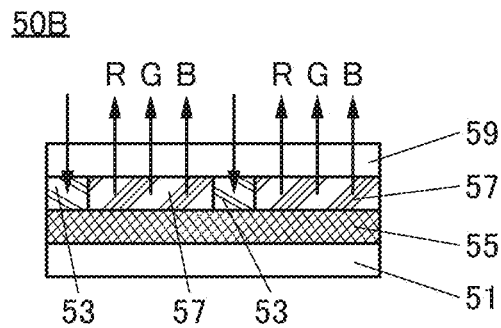

A display unit 50B illustrated in FIG. 1B includes the layer 53 including a light-receiving device, a layer 55 including transistors, and the layer 57 including a light-emitting device between the substrate 51 and the substrate 59.

In the display unit 50A and the display unit 50B, red (R) light, green (G) light, and blue (B) light are emitted from the layer 57 including a light-emitting device.

The light-receiving device included in the layer 53 including a light-receiving device can sense incident light coming from the outside of the display unit 50A or the display unit 50B.

Figure 1C:
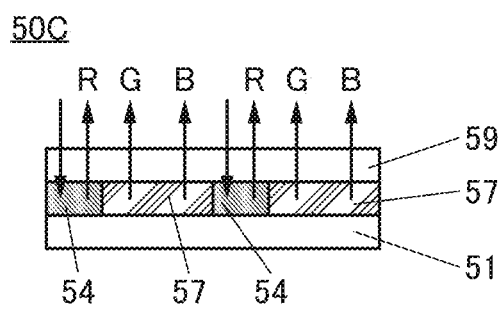

A display unit 50C illustrated in FIG. 1C includes a layer 54 including a light-emitting and light-receiving device and the layer 57 including a light-emitting device between the substrate 51 and the substrate 59.

Figure 1D:
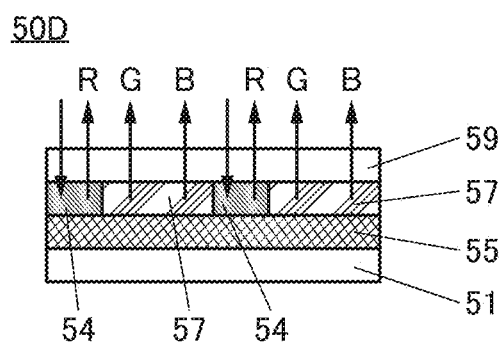

A display unit 50D illustrated in FIG. 1D includes the layer 54 including a light-emitting and light-receiving device, the layer 55 including transistors, and the layer 57 including a light-emitting device between the substrate 51 and the substrate 59.

In the display unit 50C and the display unit 50D, green (G) light and blue (B) light are emitted from the layer 57 including a light-emitting device, and red (R) light is emitted from the layer 54 including a light-emitting and light-receiving device. In the display unit of one embodiment of the present invention, the color of light emitted from the layer 54 including a light-emitting and light-receiving device is not limited to red. Furthermore, the color of light emitted from the layer 57 including a light-emitting device is not limited to the combination of green and blue.

The light-emitting and light-receiving device included in the layer 54 including a light-emitting and light-receiving device can sense incident light coming from the outside of the display unit 50C or the display unit 50D. The light-emitting and light-receiving device can sense one or both of green (G) light and blue (B) light, for example.

The layer 55 including transistors includes a transistor electrically connected to the light-receiving device or the light-emitting and light-receiving device and a transistor electrically connected to the light-emitting device. The layer 55 including transistors may further include a wiring, an electrode, a terminal, a capacitor, a resistor, or the like.

Figure 1E:
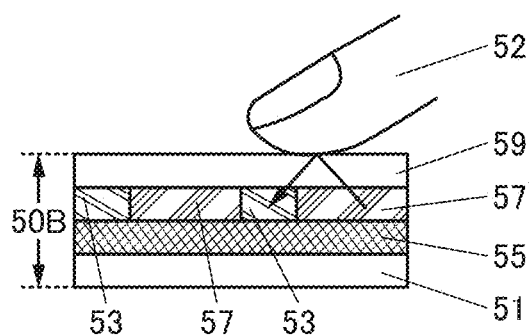

The display unit of one embodiment of the present invention may have a function of sensing an object such as a finger that is touching the display unit. For example, after light emitted by the light-emitting device in the layer 57 including a light-emitting device is reflected by a finger 52 that is touching the display unit 50B as illustrated in FIG. 1E, the light-receiving device in the layer 53 including a light-receiving device senses the reflected light. Thus, the touch of the finger 52 on the display unit 50B can be detected. Furthermore, in the display unit 50D, after light emitted by the light-emitting device in the layer 57 including a light-emitting device is reflected by a finger that is touching the display unit 50D, the light-emitting and light-receiving device in the layer 54 including a light-emitting and light-receiving device can sense the reflected light. Although a case where light emitted by the light-emitting device is reflected by an object is described below as an example, light might be scattered by an object.

Figure 1F:
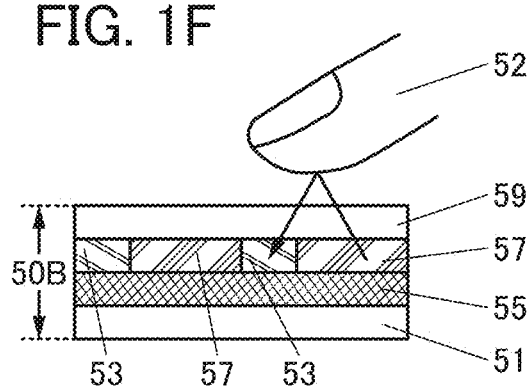

The display unit of one embodiment of the present invention may have a function of sensing an object that is approaching (but is not touching) the display unit as illustrated in FIG. 1F or capturing an image of such an object.

[Pixel]

The display unit of one embodiment of the present invention includes a plurality of pixels arranged in a matrix. Each of the pixels includes a plurality of subpixels. One subpixel includes one light-emitting device, one light-emitting and light-receiving device, or one light-receiving device.

The plurality of pixels each include one or more of a subpixel including a light-emitting device, a subpixel including a light-receiving device, and a subpixel including a light-emitting and light-receiving device.

For example, a pixel includes a plurality of (e.g., three or four) subpixels each including a light-emitting device and a subpixel including a light-receiving device.

The light-receiving device may be provided in all the pixels or in some of the pixels. In addition, one pixel may include a plurality of light-receiving devices. One light-receiving device may be provided over a plurality of pixels. The resolution of the light-receiving device may be different from that of the light-emitting device.

In the case where a pixel includes three subpixels including a light-emitting device, the three subpixels can be of three colors of RGB or of three colors of yellow (Y), cyan (C), and magenta (M). In the case where a pixel includes four subpixels including a light-emitting device, the four subpixels can be of four colors of R, G, B, and white (W) or of four colors of R, G, B, and Y.

FIG. 1G, FIG. 1H, FIG. 1J, and FIG. 1K illustrate examples of a pixel which includes a plurality of subpixels each including a light-emitting device and a subpixel including a light-receiving device. Note that the arrangement of subpixels is not limited to the illustrated order in this embodiment. For example, the positions of the subpixels (B) and (G) may be reversed.

Figure 1G:
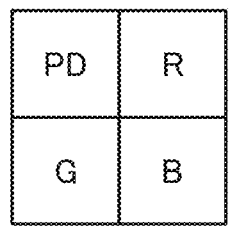
FIG. 1G, FIG. 1H, FIG. 1J, and FIG. 1K are top views each illustrating an example of a pixel.
Figure 1H:
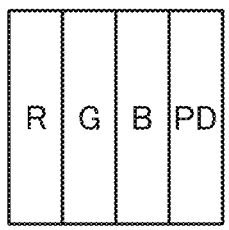
Figure 1J:
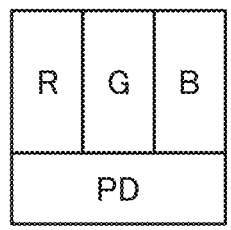

The pixels illustrated in FIG. 1G, FIG. 1H, and FIG. 1J each include a subpixel (PD) having a light-receiving function, a subpixel (R) which emits red light, a subpixel (G) which emits green light, and a subpixel (B) which emits blue light.

Matrix arrangement is applied to the pixel illustrated in FIG. 1G, and stripe arrangement is applied to the pixel illustrated in FIG. 1H. FIG. 1J illustrates an example in which a subpixel (R) which emits red light, a subpixel (G) which emits green light, and a subpixel (B) which emits blue light are arranged laterally in one row and a subpixel (PD)

having a light-receiving function is positioned under the three subpixels. In other words, in FIG. 1J, the subpixels (R), (G), and (B) are arranged in the same row, which is different from the row in which the subpixel (PD) is positioned.

Figure 1K:
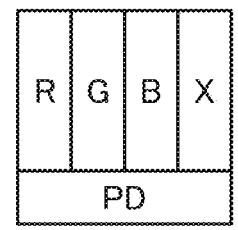

The pixel illustrated in FIG. 1K includes a subpixel (X) which emits light of a color other than RGB, in addition to the structure of the pixel illustrated in FIG. 1J. The light of a color other than RGB can be white (W) light, yellow (Y) light, cyan (C) light, magenta (M) light, or infrared light (IR). In the case where the subpixel (X) emits infrared light, the subpixel (PD) having a light-receiving function preferably has a function of sensing infrared light. The subpixel (PD) having a function of receiving light may have a function of sensing both visible light and infrared light. The wavelength of light that the light-receiving device senses can be determined depending on the application of the sensor.

Alternatively, for example, a pixel includes a plurality of subpixels including a light-emitting device and a subpixel including a light-emitting and light-receiving device.

The display unit including the light-emitting and light-receiving device does not need a change of pixel arrangement for incorporation of a light-receiving function into pixels, the display portion can be provided with one or both of an image capturing function and a sensing function without reductions in aperture ratio and resolution.

The light-emitting and light-receiving device may be provided in all the pixels or in some of the pixels. In addition, one pixel may include a plurality of light-emitting and light-receiving devices.

FIGS. 2A to 2D illustrate examples of a pixel which includes a plurality of subpixels each including a light-emitting device and a subpixel including a light-emitting and light-receiving device.

Figure 2A:
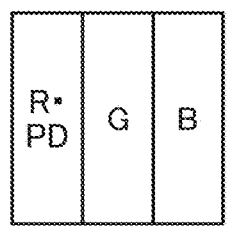
FIGS. 2A to 2G are top views each illustrating an example of a pixel.

A pixel illustrated in FIG. 2A employs stripe arrangement and includes a subpixel (R•PD) which emits red light and has a light-receiving function, a subpixel (G) which emits green light, and a subpixel (B) which emits blue light. In a display unit including a pixel composed of three subpixels of RGB, a light-emitting device used in the R subpixel can be replaced with a light-emitting and light-receiving device, so that the display unit can have a light-receiving function in the pixel.

Figure 2B:
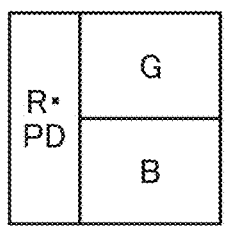

A pixel illustrated in FIG. 2B includes a subpixel (R•PD) which emits red light and has a light-receiving function, a subpixel (G) which emits green light, and a subpixel (B) which emits blue light. The subpixel (R•PD) is provided in a column different from the column where the subpixels (G) and (B) are positioned. The subpixels (G) and (B) are alternately arranged in the same column; one is provided in an odd-numbered row and the other is provided in an even-numbered row. The color of the subpixel positioned in a column different from the column where the subpixels of the other colors are positioned is not limited to red (R) and may be green (G) or blue (B).

Figure 2E:
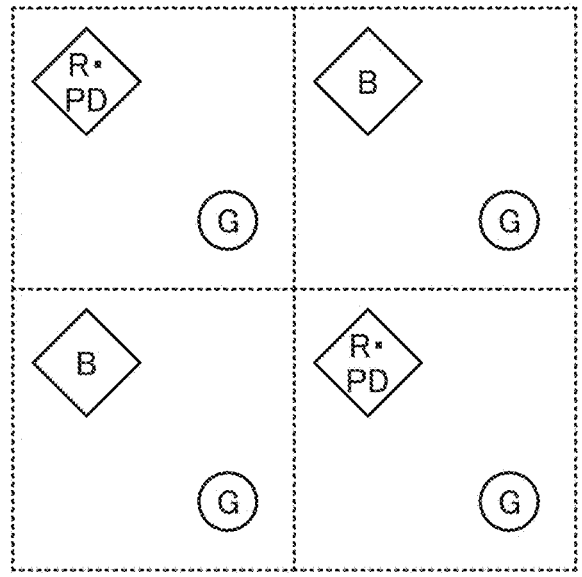
Figure 2C:
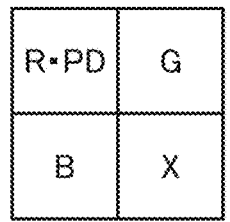

A pixel illustrated in FIG. 2C employs matrix arrangement and includes a subpixel (R•PD) which emits red light and has a light-receiving function, a subpixel (G) which emits green light, a subpixel (B) which emits blue light, and a subpixel (X) which emits light of a color other than RGB. Also in a display unit including a pixel composed of four subpixels of RGBX, a light-emitting device used in the R subpixel can be replaced with a light-emitting and light-receiving device, so that the display unit can have a light-receiving function in the pixel.

Figure 2D:
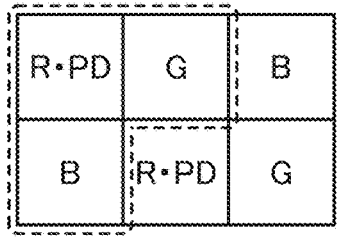

FIG. 2D illustrates two pixels, each of which is composed of three subpixels surrounded by dotted lines. The pixels illustrated in FIG. 2D each include a subpixel (R•PD) which emits red light and has a light-receiving function, a subpixel (G) which emits green light, and a subpixel (B) which emits blue light. In the pixel on the left in FIG. 2D, the subpixel (G) is positioned in the same row as the subpixel (R•PD), and the subpixel (B) is positioned in the same column as the subpixel (R•PD). In the pixel on the right in FIG. 2D, the subpixel (G) is positioned in the same row as the subpixel (R•PD), and the subpixel (B) is positioned in the same column as the subpixel (G). In every odd-numbered row and every even-numbered row of the pixel layout illustrated in FIG. 2D, the subpixel (R•PD), the subpixel (G), and the subpixel (B) are repeatedly arranged. In addition, subpixels of different colors are arranged in the odd-numbered row and the even-numbered row in every column.

Figure 2F:
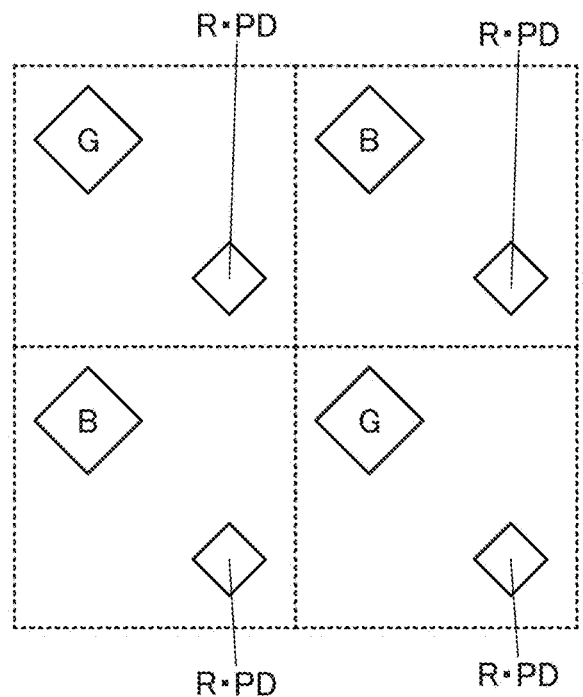

FIG. 2E illustrates four pixels which employ pentile arrangement; adjacent two pixels each have a different combination of two subpixels that emit light of different colors. Note that the shape of the subpixels illustrated in FIG. 2E indicates a top-surface shape of the light-emitting devices and the light-emitting and light-receiving devices included in the subpixels. FIG. 2F is a variation of the pixel arrangement of FIG. 2E.

The upper left pixel and the lower-right pixel in FIG. 2E each include a subpixel (R•PD) which emits red light and has a light-receiving function and a subpixel (G) which emits green light. The lower-left pixel and the upper-right pixel in FIG. 2E each include a subpixel (G) which emits green light and a subpixel (B) which emits blue light.

The upper left pixel and the lower-right pixel in FIG. 2F each include a subpixel (R•PD) which emits red light and has a light-receiving function and a subpixel (G) which emits green light. The lower-left pixel and the upper-right pixel in FIG. 2F each include a subpixel (R•PD) which emits red light and has a light-receiving function and a subpixel (B) which emits blue light.

In FIG. 2E, the subpixel (G) which emits green light is provided in each pixel. In FIG. 2F, the subpixel (R•PD) which emits red light and has a light-receiving function is provided in each pixel. The structure illustrated in FIG. 2F achieves higher-resolution image capturing than the structure illustrated in FIG. 2E because of having a subpixel having a light-receiving function in each pixel. Thus, the accuracy of biometric authentication can be increased, for example.

The top-surface shape of the light-emitting devices and the light-emitting and light-receiving devices is not particularly limited and can be a circular shape, an elliptical shape, a polygonal shape, a polygonal shape with rounded corners, or the like. The top-surface shape of the light-emitting devices included in the subpixels (G) is a circular in the example in FIG. 2E and square in the example in FIG. 2F. The top surface shape of the light-emitting devices and the light-emitting and light-receiving devices may vary depending on the color thereof, or the light-emitting devices and the light-emitting and light-receiving devices of some colors or every color may have the same top-surface shape.

The aperture ratio of subpixels may vary depending on the color of the subpixels, or may be the same among the subpixels of some colors or every color. For example, the aperture ratio of a subpixel of a color provided in each pixel (the subpixel (G) in FIG. 2E, and the subpixel (R•PD) in FIG. 2F) may be made lower than those of subpixels of the other colors.

Figure 2G:
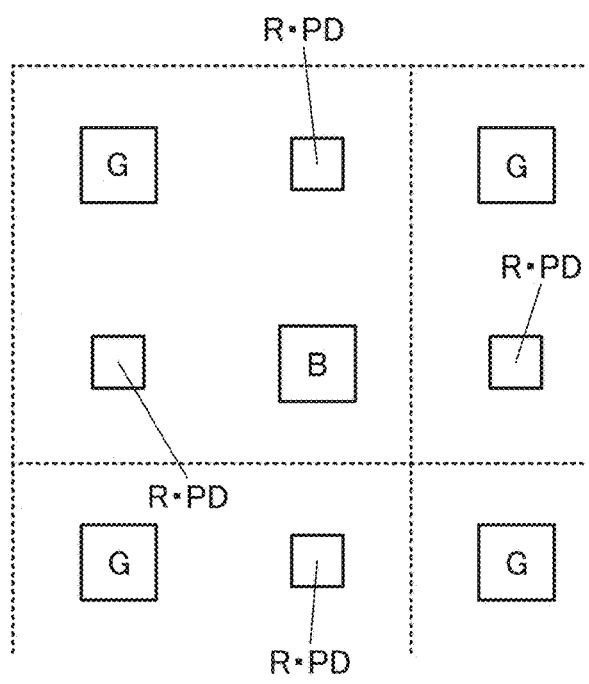

FIG. 2G is a variation of the pixel arrangement of FIG. 2F. Specifically, the structure of FIG. 2G is obtained by rotating the structure of FIG. 2F by 45°. Although one pixel is regarded as being formed of two subpixels in FIG. 2F, one pixel can be regarded as being formed of four subpixels as illustrated in FIG. 2G.

In the description with reference to FIG. 2G, one pixel is regarded as being formed of four subpixels surrounded by dotted lines. A pixel includes two subpixels (R•PD), one subpixel (G), and one subpixel (B). The pixel including a plurality of subpixels having a light-receiving function allows high-resolution image capturing. Thus, the accuracy of biometric authentication can be increased. For example, the resolution of image capturing can be the square root of 2 times the resolution of display.

A display unit which employs the structure illustrated in FIG. 2F or FIG. 2G includes p (p is an integer greater than or equal to 2) first light-emitting devices, q (q is an integer greater than or equal to 2) second light-emitting devices, and r (r is an integer greater than p and q) light-emitting and light-receiving devices. The following are satisfied: r=2p, r=p+q. Either the first light-emitting devices or the second light-emitting devices emit green light, and the other light-emitting devices emit blue light. The light-emitting and light-receiving devices emit red light and have a light-receiving function.

In the case where touch sensing is performed with the light-emitting and light-receiving devices, for example, it is preferable that light emitted by a light source be hard for a user to recognize. Since blue light has low visibility than green light, light-emitting devices which emit blue light are preferably used as a light source. Accordingly, the light-emitting and light-receiving devices preferably have a function of receiving blue light.

As described above, the display unit of this embodiment can employ any of various types of pixel arrangements.

[Touch Panel]

Next, the case where the display unit of this embodiment functions as a touch panel is described.

With the display unit of this embodiment, an image of a fingerprint, a palm print, or the like is captured and biometric authentication can be performed. To strengthen the security function, high resolution is required in capturing an image of a fingerprint or a palm print. Thus, imaging data obtained with the light-receiving device or the light-emitting and light-receiving device is preferably read out one (pixel) by one (pixel) from all the pixels.

In the case where the display unit is configured to function as a touch panel, a resolution as high as that required for biometric authentication is not required; on the other hand, a high-speed reading operation is required.

For example, touch sensing is performed all at once in a plurality of pixels to increase the driving frequency. The pixels in which simultaneous reading is performed can be determined as appropriate to be 4 pixels (2×2 pixels), 9 pixels (3×3 pixels), or 16 pixels (4×4 pixels), for example, Alternatively, touch sensing is performed using only some pixels to increase the driving frequency. For example, pixels used for touch sensing can be determined as appropriate to be 1 pixel out of 4 pixels (2×2 pixels), 1 pixel out of 9 pixels (3×3 pixels), 1 pixel out of 16 pixels (4×4 pixels), 1 pixel out of 100 pixels (10×10 pixels), or 1 pixel out of 900 pixels (30×30 pixels), for example.

Figure 3A:
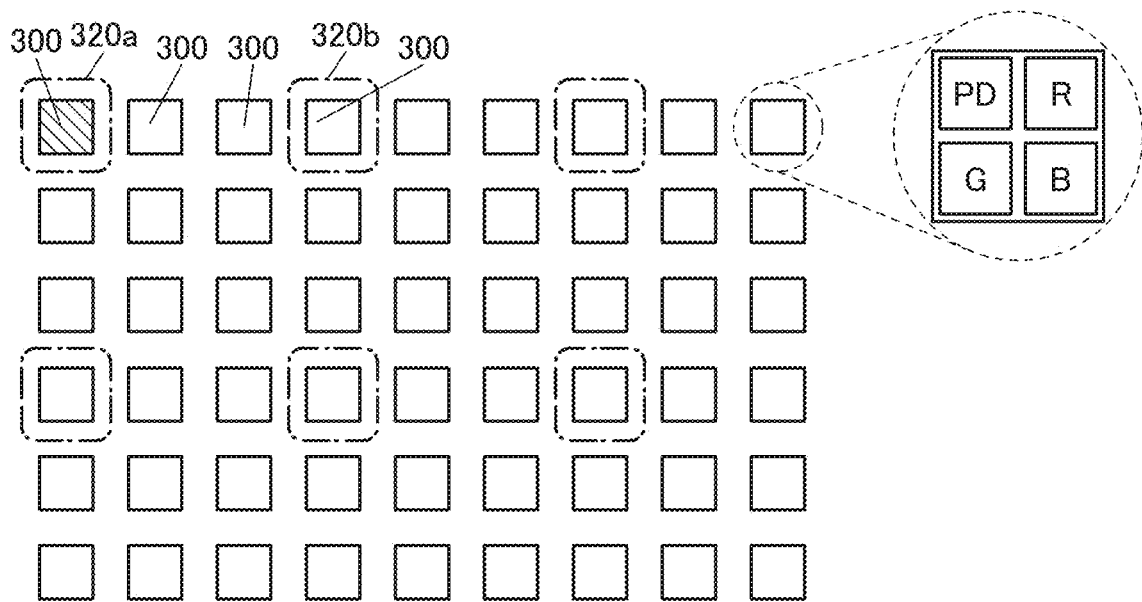
FIGS. 3A and 3B are views each illustrating an example of a method for driving a display unit.
Figure 3B:
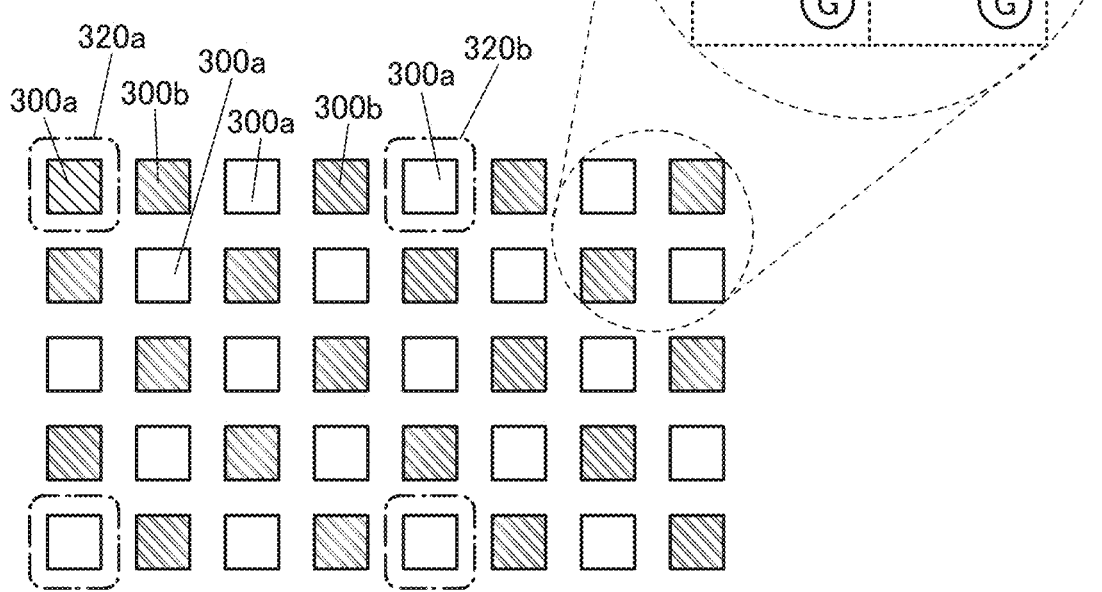

FIGS. 3A and 3B illustrate examples of touch sensing using some pixels.

FIG. 3A illustrates an example where the structure illustrated in FIG. 1G is applied to pixels 300.

The pixels 300 each include the subpixel (PD) having a light-receiving function, the subpixel (R) which emits red light, the subpixel (G) which emits green light, and the subpixel (B) which emits blue light. Target pixels 320 which are a reading target are only the pixels 300 surrounded by dashed-dotted lines. FIG. 3A illustrates an example in which the number of target pixels 320 used for touch sensing is 1 pixel out of 9 pixels (3×3 pixels); however, the number of target pixels 320 is not particularly limited. First, imaging data of a target pixel 320a is read out, and imaging data of a target pixel 320b is then read out. Imaging data is not read from the pixels 300 positioned between the target pixel 320a and the target pixel 320b. Thus, the number of reading operations can be reduced from the number of reading operations needed in the case where imaging data is read one by one from all the pixels, and the driving frequency can be increased.

Note that the pixels 300 may take turns serving as the target pixels 320 at a certain number of times or at regular time intervals. For example, in the case where one out of 9 pixels is the target pixel 320, the target pixel 320 may shift one row by one row or one column by one column so that three pixels can serve as the target pixel 320 in turn. Alternatively, all the nine pixels may serve as the target pixel 320 in turn.

FIG. 3B illustrates an example to which the structure illustrated in FIG. 2E is applied, where a pixel 300a and a pixel 300b are alternately arranged.

The pixel 300a includes the subpixel (R•PD) which has a light-receiving function and the subpixel (G) which emits green light. The pixel 300b includes the subpixel (G) which emits green light and the subpixel (B) which emits blue light. The target pixels 320 which are a reading target are only the pixels 300a surrounded by dashed-dotted lines. FIG. 3B illustrates an example in which the number of target pixels 320 used for touch sensing is 1 pixel out of 16 pixels (4×4 pixels); however, the number of target pixels 320 is not particularly limited. First, imaging data of the target pixel 320a is read out, and imaging data of the target pixel 320b is then read out. Imaging data is not read from the pixels 300a positioned between the target pixel 320a and the target pixel 320b. Thus, the number of reading operations can be reduced from the number of reading operations needed in the case where imaging data is read one by one from all the pixels, and the driving frequency can be increased.

Note that when only a particular pixel 300a is used as the target pixel 320, the degradation degree of the light-emitting and light-receiving device may vary between the pixels 300a. Therefore, it is preferable that the pixels 300a take turns serving as the target pixel 320 at a certain number of times or at regular time intervals.

The display unit of one embodiment of the present invention preferably has two or more kinds of operation modes of the light-receiving device or the light-emitting and light-receiving device so that switching therebetween is possible. For example, switching between a mode of performing reading from all the pixels and a mode of performing reading from part of the pixels is preferably possible. Thus, image capturing at a high resolution can be performed in fingerprint image capturing, and touch sensing at a high driving frequency can be performed in displaying an image. The operation mode is changed in accordance with the usage, so that the functionality of the display unit can be increased.

Furthermore, the influence of ambient light which is noise in touch sensing is preferably removed.

For example, lighting and non-lighting of the light-emitting device are made to repeat periodically in some pixels, and a difference in detection intensity of the light-receiving device or the light-emitting and light-receiving device between a lighting period and a non-lighting period is obtained, so that the influence of ambient light can be removed. Preferably, the number of pixels where lighting and non-lighting repeat be two or more within the range not affecting images displayed on the display unit. Furthermore, a light-emitting device is preferably switched between a lighting period and a non-lighting period at intervals of one frame; for example, a lighting pixel and a non-lighting pixel may be exchanged between an odd-numbered frame and an even-numbered frame. Note that the emission color in the lighting period is not particularly limited.

Figure 4A:
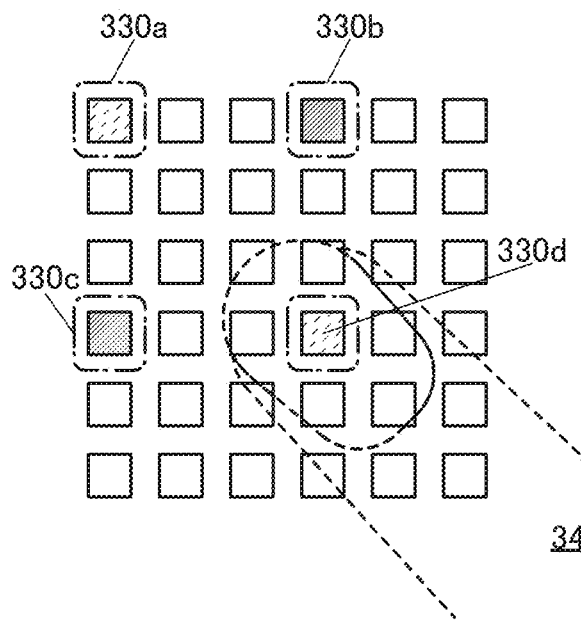
FIGS. 4A to 4F are views each illustrating an example of a method for driving a display unit.
Figure 4B:
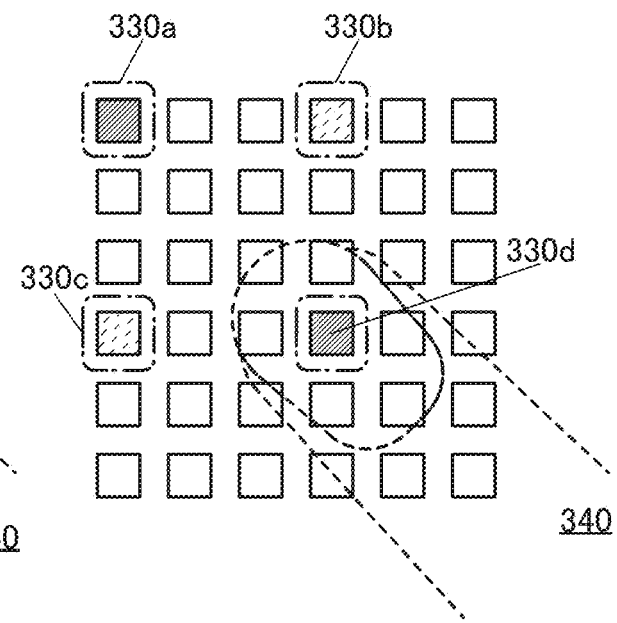

FIGS. 4A and 4B illustrate arrangement examples in which 1 pixel out of 9 pixels (3×3 pixels) is a pixel where lighting and non-lighting repeat.

FIG. 4A illustrates an example in which a pixel 330a and a pixel 330d are in a non-lighting state and a pixel 330b and a pixel 330c are in a lighting state. FIG. 4B illustrates an example in which the pixel 330a and the pixel 330d are in a lighting state and the pixel 330b and the pixel 330c are in a non-lighting state.

The pixel 330d is positioned in a portion touched by a finger 340 in the display unit, and the pixels 330a to 330c are positioned in a portion not touched by the finger 340.

Figure 4C:
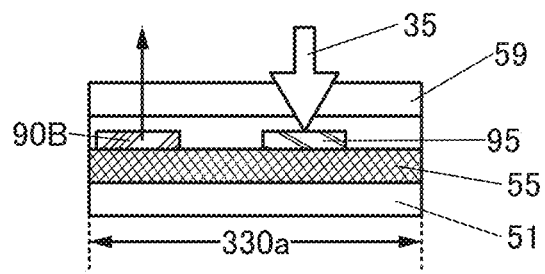
Figure 4D:
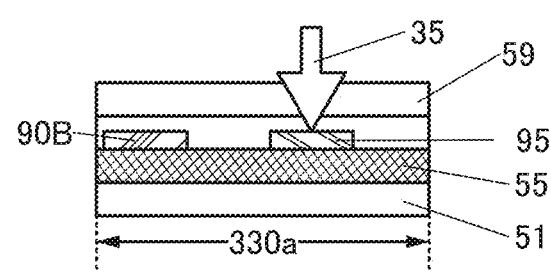
Figure 4E:
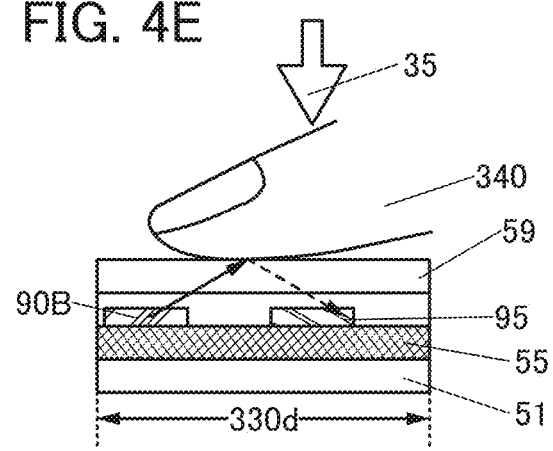
Figure 4F:
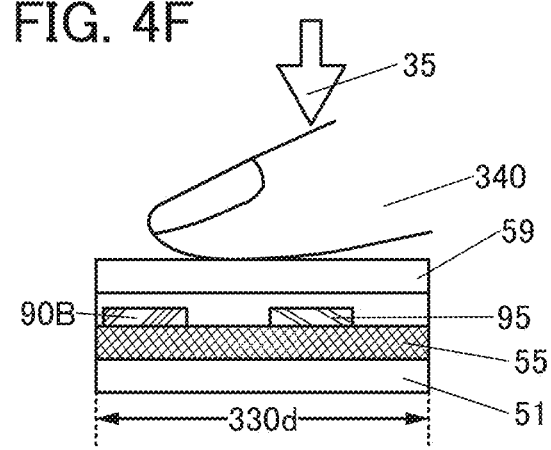

FIGS. 4C and 4D are cross-sectional views of the pixel 330a in the display unit, and FIGS. 4E and 4F are cross-sectional views of the pixel 330d.

The display unit illustrated in FIGS. 4C to 4F includes the layer 55 including transistors, a light-emitting device 90B, and a light-receiving device 95 between the substrate 51 and the substrate 59. Here, a case where the light-emitting device 90B emits blue light and the light-receiving device 95 absorbs blue light is taken as an example. Note that the emission color of the light-emitting device is not limited, and light with a wavelength that the light-receiving device absorbs can be selected as appropriate. The display unit may include the light-emitting and light-receiving device instead of the light-receiving device.

FIGS. 4C and 4E illustrate the display unit in a state where the light source is lighting (the light-emitting device 90B is emitting light), and FIGS. 4D and 4F illustrate the display unit in a state where the light source is non-lighting (the light-emitting device 90B is not emitting light).

FIG. 4C illustrates a state in which the finger is not touching the pixel 330a and light emitted by the light-emitting device 90B does not enter the light-receiving device 95. In FIG. 4D, the light-emitting device 90B is not emitting light and light from the light-emitting device 90B does not enter the light-receiving device 95. As illustrated in FIGS. 4C and 4D, in both the lighting period and the non-lighting period of the light source, ambient light 35 enters the light-receiving device 95. Accordingly, when the light amount of the ambient light 35 is constant, the detection intensity of the light-receiving device 95 included in the pixel 330a does not change between the lighting period and the non-lighting period of the light source.

FIGS. 4E and 4F illustrate a state in which the ambient light 35 is blocked by the finger 340 and does not reach the light-receiving device 95 in both the lighting period and the non-lighting period of the light source. In the lighting period of the light source, light emitted by the light-emitting device 90B is reflected by the finger 340 and then enters the light-receiving device 95 as illustrated in FIG. 4E. In FIG. 4F, the light-emitting device 90B is not emitting light and light from the light-emitting device 90B does not enter the light-receiving device 95. Accordingly, the detection intensity of the light-receiving device 95 included in the pixel 330d changes between the lighting period and the non-lighting period of the light source.

At the light-receiving device 95, the change in detection intensity for the ambient light 35 between the lighting period and the non-lighting period of the light source is small, and the change in detection intensity derived from an object such as the finger 340 between the lighting period and the non-lighting period of the light source is large. Utilizing this difference in detection intensity between the lighting period and the non-lighting period, the influence of ambient light can be removed and an object can be sensed at high accuracy.

[Top-View Layout]

Figure 5A:
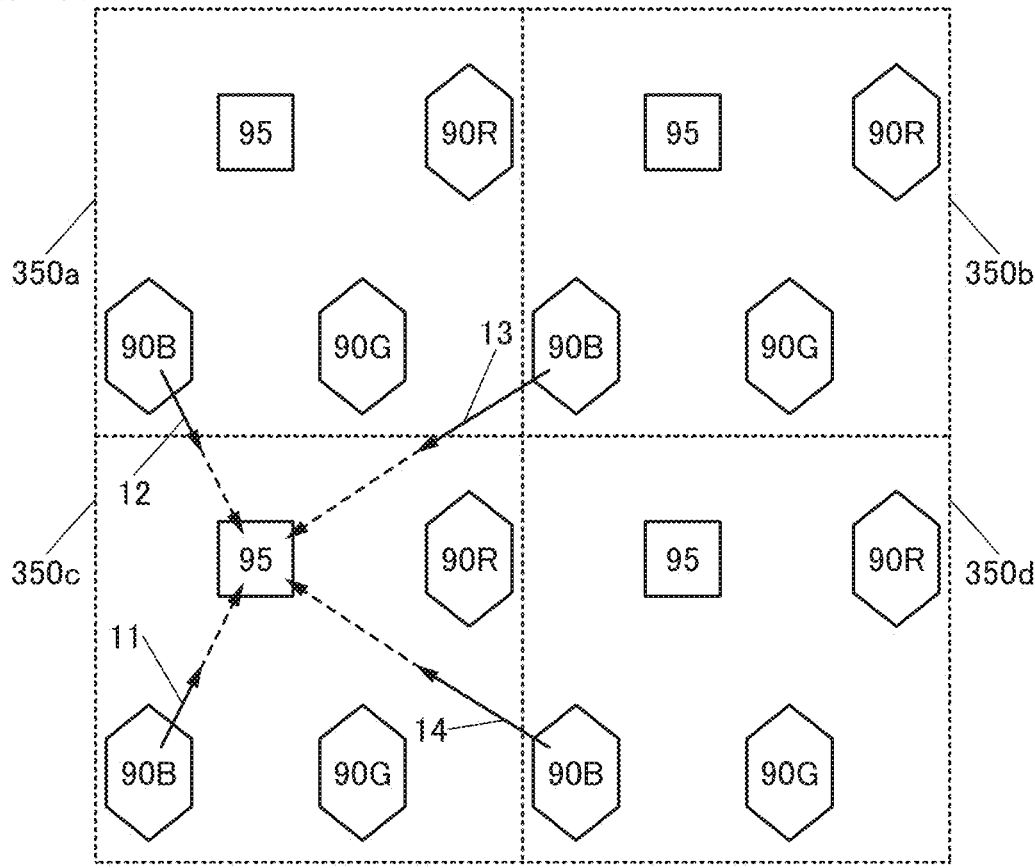
FIG. 5A is a top view illustrating an example of a display unit.
Figure 5B:
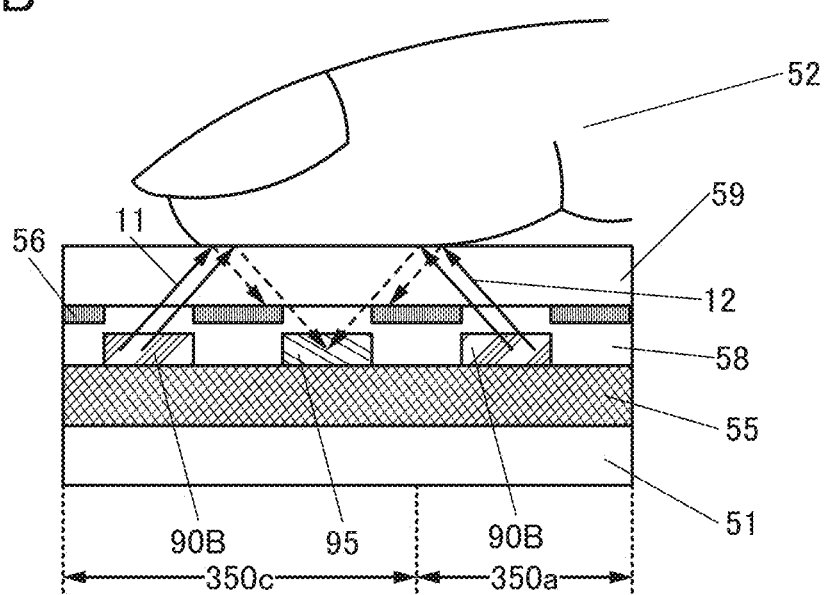
FIG. 5B is a cross-sectional view illustrating an example of a display unit.

FIG. 5A illustrates a top-view layout of four pixels in a display unit. Each of the pixels includes a light-emitting device 90R which emits red light, a light-emitting device 90G which emits green light, the light-emitting device 90B which emits blue light, and the light-receiving device 95 which absorbs at least blue light. FIG. 5B is a cross-sectional view of an upper-left pixel 350a and a lower-left pixel 350c illustrated in FIG. 5A.

In FIG. 5A, a row corresponding to an upper row of pixels is provided with the light-receiving devices 95 and the light-emitting devices 90R which are alternately arranged at regular intervals. A row corresponding to a lower row of pixels is provided with the light-emitting devices 90B and the light-emitting devices 90G which are alternately arranged at regular intervals. The light-emitting devices 90R, 90G, and 90B and the light-receiving device 95 are arranged in a staggered manner.

In FIG. 5A, light 11 emitted by the light-emitting device 90B included in the lower-left pixel 350c and reflected by the finger 52 (see FIG. 5B), light 12 emitted by the light-emitting device 90B included in the upper-left pixel 350a and reflected by the finger 52, light 13 emitted by the light-emitting device 90B included in an upper-right pixel 350b and reflected by the finger 52, and light 14 emitted by the light-emitting device 90B included in a lower-right pixel 350d and reflected by the finger 52 enter the light-receiving device 95 included in the lower-left pixel 350c.

In FIG. 5A, the shortest distance a from the light-emitting device 90B of the pixel 350a to the light-receiving device 95 of the pixel 350c is equal to the shortest distance b from the light-emitting device 90B of the pixel 350c to the light-receiving device 95 of the pixel 350c. Furthermore, in FIG. 5A, the center distance between the light-emitting device 90B of the pixel 350a and the light-receiving device 95 of the pixel 350c is equal to the center distance between the light-emitting device 90B of the pixel 350c and the light-receiving device 95 of the pixel 350c. In this specification and the like, "two equal distances" means two exactly the same distances or two substantially the same distances.

The light-emitting device 90B of the pixel 350a and the light-emitting device 90B of the pixel 350c are both the closest to the light-receiving device 95 of the pixel 350c among light-emitting devices that emit blue light.

As illustrated in FIG. 5B, the layer 55 including transistors, the light-emitting device 90B, and the light-receiving device 95 are provided over the substrate 51. The substrate 59 is provided with a light-blocking layer 56. A space 58 between the substrate 51 and the substrate 59 can be filled with an inert gas, a resin, or the like.

In FIGS. 5A and 5B, the shape and size of an opening of the light-blocking layer 56 are the same as those of a light-emitting region of the light-emitting device and a light-receiving region of the light-receiving device. Thus, in a top view, the shortest distance c from the light-emitting device 90B of the pixel 350a to the opening which is of the light-blocking layer 56 and provided in a position overlapping with the light-receiving device 95 of the pixel 350c is equal to the shortest distance d from the light-emitting device 90B of the pixel 350c to the opening. Furthermore, in the top view, the center distance between the light-emitting device 90B of the pixel 350a and the opening is equal to the center distance between the light-emitting device 90B of the pixel 350c and the opening.

Moreover, in FIGS. 5A and 5B, the absolute value |a−b| of the difference between the shortest distance a from the light-emitting device 90B of the pixel 350a to the light-receiving device 95 of the pixel 350c and the shortest distance b from the light-emitting device 90B of the pixel 350c to the light-receiving device 95 of the pixel 350c is equal to the absolute value |c−d| of the difference between the shortest distance c from the light-emitting device 90B of the pixel 350a to the opening which is of the light-blocking layer 56 and provided in a position overlapping with the light-receiving device 95 of the pixel 350c and the shortest distance d from the light-emitting device 90B of the pixel 350c to the opening.

Furthermore, in the top view, the shortest distance from the light-emitting device 90B to the light-receiving device 95 and the shortest distance from the light-emitting device 90B to the opening which is of the light-blocking layer 56 and provided in a position overlapping with the light-receiving device 95 are equal to each other in each pixel. In the top view, the center distance between the light-emitting device 90B and the light-receiving device 95 is equal to the center distance between the light-emitting device 90B and the opening in each pixel. Furthermore, in the top view, the center of the light-receiving device 95 and the center of the opening are in the same position (or substantially in the same position).

In the structure illustrated in FIGS. 5A and 5B, the same or similar amounts of reflected light of the light 11 and reflected light of the light 12 enter the light-receiving device 95 included in the lower-left pixel 350c. In some cases, it is required that much light coming from a specific light-emitting device enter the light-receiving device (or the light-emitting and light-receiving device). For example, in the case where lighting and non-lighting repeat in some pixels while image display is performed in many pixels as described above, much light coming from light-emitting devices included in the pixels where lighting and non-lighting repeat preferably enter the light-receiving device or the light-emitting and light-receiving device.

Top-view pixel layouts of display units in which much light coming from a specific light-emitting device enters the light-receiving device or the light-emitting and light-receiving device are described below with reference to FIGS. 6A and 6B, FIGS. 7A and 7B, FIGS. 8A to 8C, and FIGS. 9A to 9C.

Figure 6A:
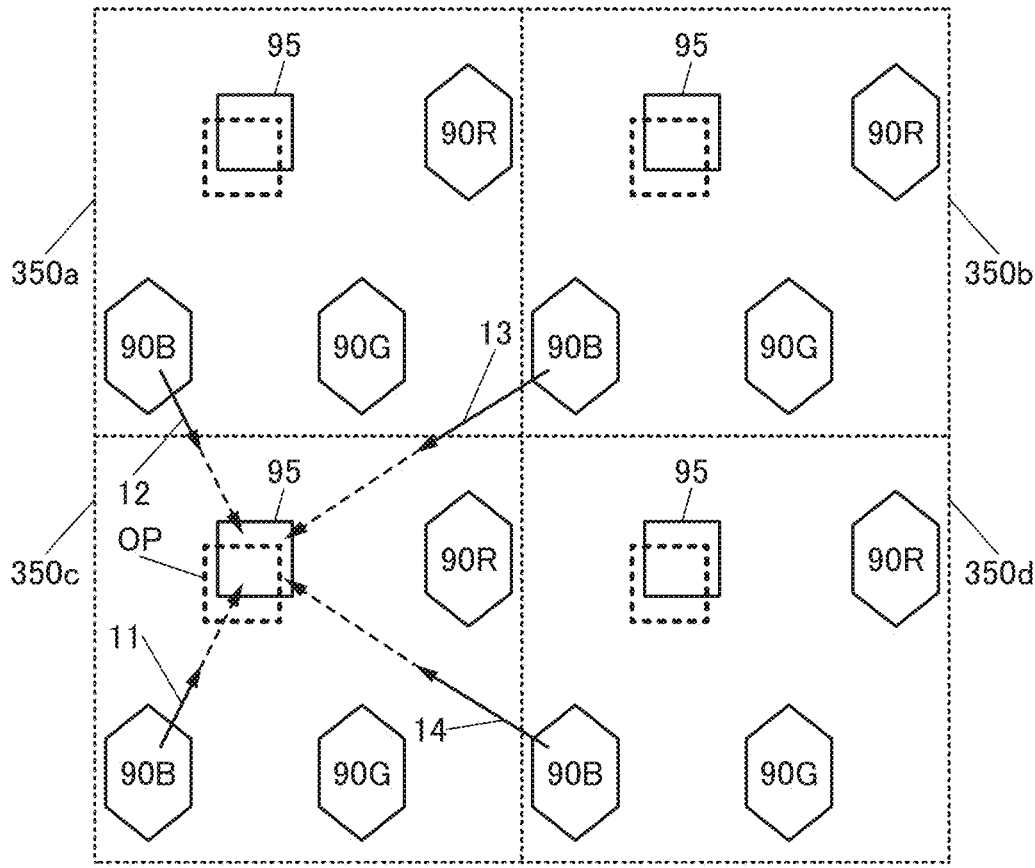
FIG. 6A is a top view illustrating an example of a display unit.
Figure 6B:
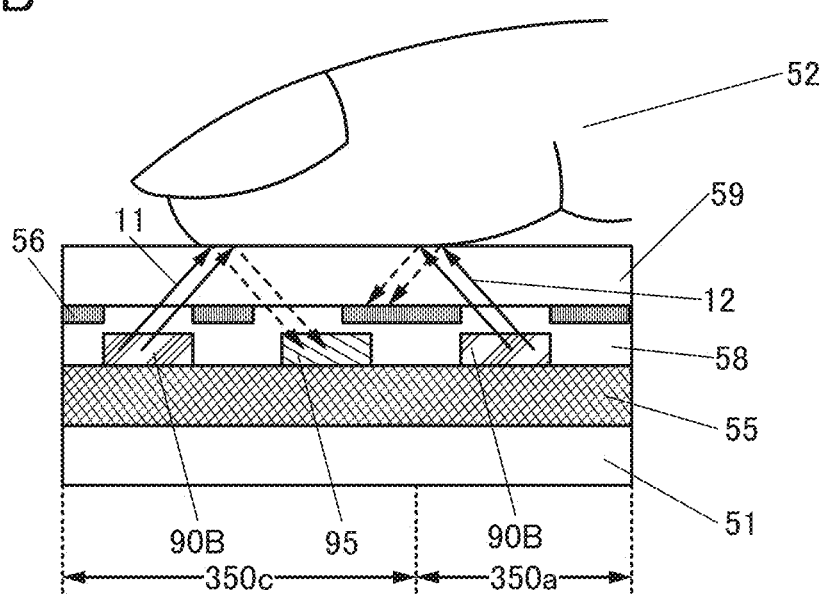
FIG. 6B is a cross-sectional view illustrating an example of a display unit.
Figure 7A:
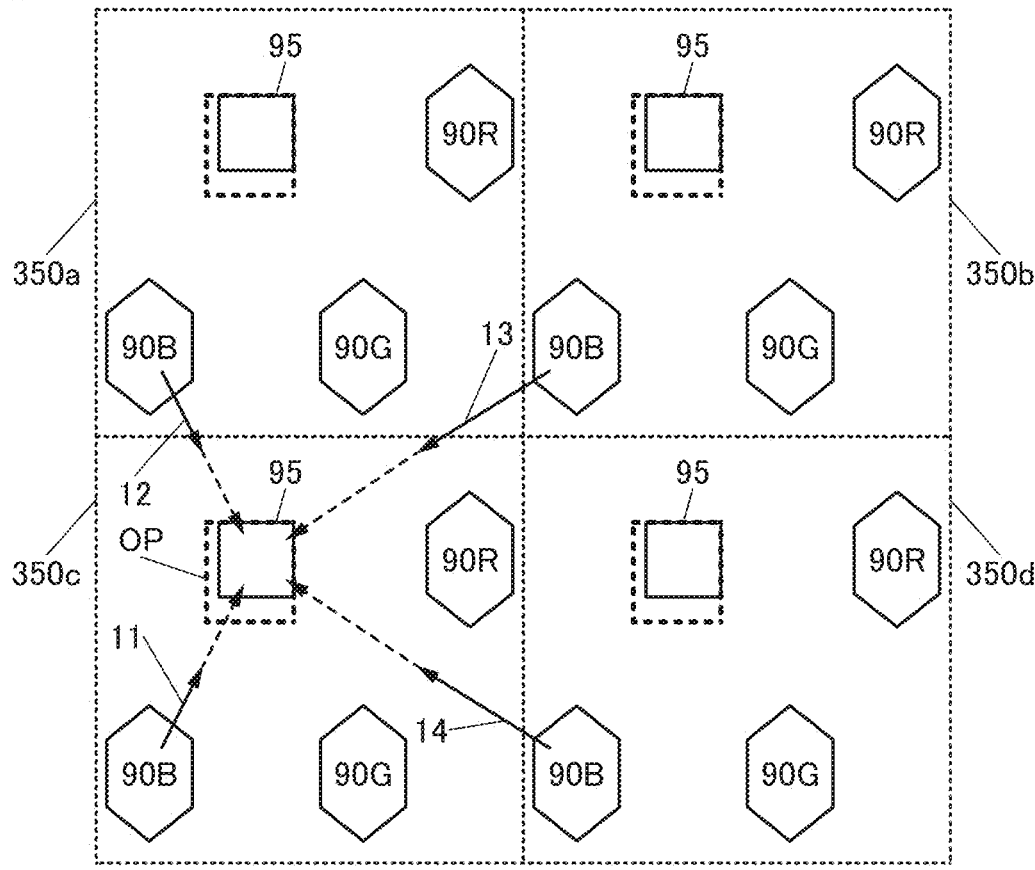
FIG. 7A is a top view illustrating an example of a display unit.
Figure 7B:
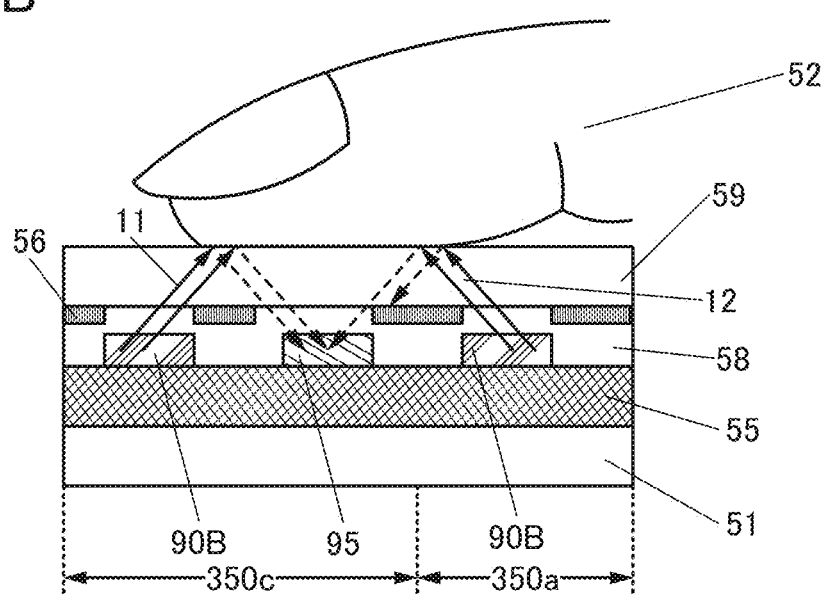
FIG. 7B is a cross-sectional view illustrating an example of a display unit.

FIGS. 6A and 6B illustrate an example in which an opening OP which is of the light-blocking layer 56 and provided in a position overlapping with the light-receiving device 95 is shifted to the light-emitting device 90B side from the position illustrated in FIGS. 5A and 5B, in each pixel. FIGS. 7A and 7B illustrate an example in which the opening OP expands to the light-emitting device 90B side as compared with the opening OP in FIGS. 5A and 5B, in each pixel.

The positional relation of the light-emitting devices 90R, 90G, and 90B and the light-receiving device 95 in each pixel in FIG. 6A and FIG. 7A is similar to that in FIG. 5A.

In FIG. 6A and FIG. 7A, the shortest distance c from the light-emitting device 90B of the pixel 350c to the opening OP which is of the light-blocking layer 56 and provided in a position overlapping with the light-receiving device 95 of the pixel 350c is shorter than the shortest distance d from the light-emitting device 90B of the pixel 350a to the opening OP. In FIG. 6A and FIG. 7A, the center distance between the light-emitting device 90B of the pixel 350c and the opening OP is shorter than the center distance between the light-emitting device 90B of the pixel 350a and the opening OP. Furthermore, in the top view, the shortest distance from the light-emitting device 90B to the opening OP is shorter than the shortest distance from the light-emitting device 90B to the light-receiving device 95 in each pixel. Furthermore, in the top view, the center distance between the light-emitting device 90B and the opening OP is shorter than the center distance between the light-emitting device 90B and the light-receiving device 95 in each pixel. In the top view, the center position of the light-receiving device 95 is different from the center position of the opening.

In FIGS. 6A and 6B, the absolute value |a−b| of the difference between the shortest distance a from the light-emitting device 90B of the pixel 350a to the light-receiving device 95 of the pixel 350c and the shortest distance b from the light-emitting device 90B of the pixel 350c to the light-receiving device 95 of the pixel 350c is smaller than the absolute value |c−d| of the difference between the shortest distance c from the light-emitting device 90B of the pixel 350a to the opening which is of the light-blocking layer 56 and provided in a position overlapping with the light-receiving device 95 of the pixel 350c and the shortest distanced from the light-emitting device 90B of the pixel 350c to the opening.

In the top view, the light-emitting device 90B of the pixel 350c is closer to the opening OP than the light-emitting device 90B of the pixel 350a is; therefore, as illustrated in FIG. 6B and FIG. 7B, the light-receiving device 95 of the pixel 350c is more likely to receive the light 11 emitted by the light-emitting device 90B of the pixel 350c and reflected by an object than to receive the light 12 emitted by the light-emitting device 90B of the pixel 350a and reflected by an object.

The use of the structure illustrated in FIGS. 6A and 6B or the structure illustrated in FIGS. 7A and 7B allows much light coming from a specific light-emitting device to enter the light-receiving device.

As illustrated in FIGS. 6A and 6B and FIGS. 7A and 7B, it is preferable to control light incident on the light-receiving device by adjusting the position of the opening (the above-described opening OP) which is of the light-blocking layer and provided in a position overlapping with the light-receiving device. Since a change in the layout of the device itself for the purpose of controlling light incident on the light-receiving device is not necessary, the display unit having a high aperture ratio of pixels can be manufactured with a high yield. Thus, the resolution and manufacturing yield of the display unit can be increased.

Figure 8A:
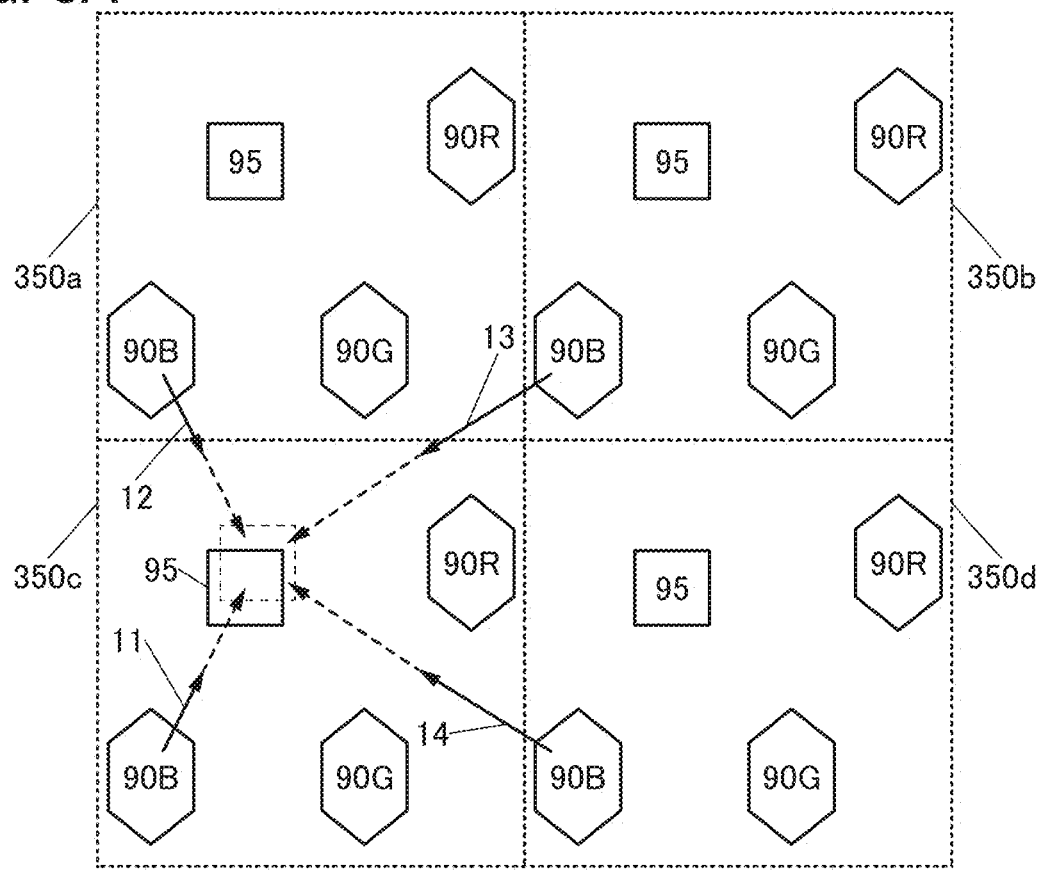
FIGS. 8A and 8C are top views each illustrating an example of a display unit.
Figure 8B:
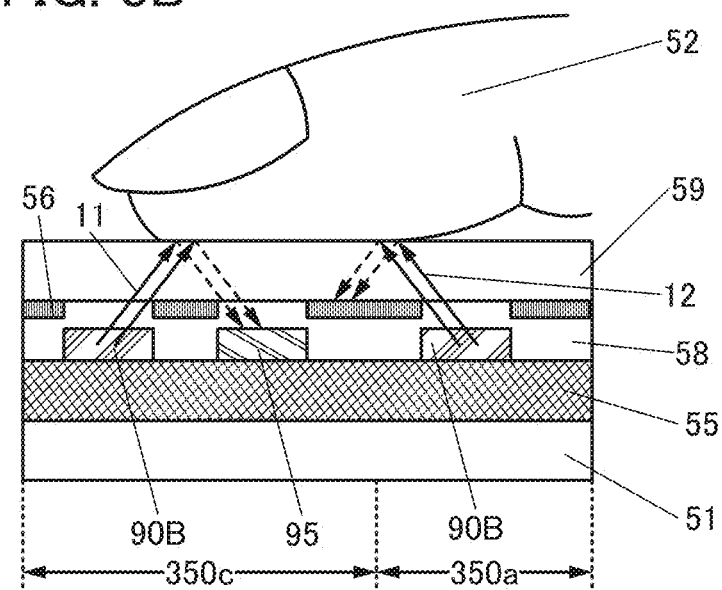
FIG. 8B is a cross-sectional view illustrating an example of a display unit.
Figure 8C:
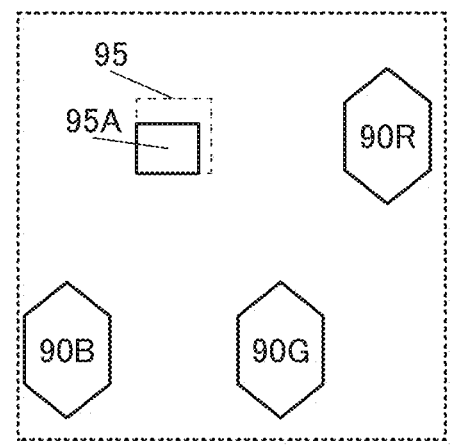

FIGS. 8A and 8B illustrate an example in which the light-receiving device 95 itself is shifted to the light-emitting device 90B side from the position illustrated in FIGS. 5A and 5B in a pixel. FIG. 8C illustrates an example in which the size of the opening OP is reduced from the size illustrated in FIG. 5A so that the opening OP on the light-emitting device 90B side can remain in the pixel 350c (see a light-receiving device 95A).

In FIGS. 8A and 8C, the shortest distance from the light-emitting device 90B of the pixel 350c to the light-receiving device 95 of the pixel 350c is shorter than the shortest distance from the light-emitting device 90B of the pixel 350a to the light-receiving device 95 of the pixel 350c. In FIGS. 8A and 8C, the center distance between the light-emitting device 90B of the pixel 350c and the light-receiving device 95 of the pixel 350c is shorter than the center distance between the light-emitting device 90B of the pixel 350a and the light-receiving device 95 of the pixel 350c.

In FIGS. 8A to 8C, the shape and size of an opening of the light-blocking layer 56 are the same as those of a light-emitting region of the light-emitting device and a light-receiving region of the light-receiving device. Thus, in the top view, the shortest distance from the light-emitting device 90B of the pixel 350c to the opening which is of the light-blocking layer 56 and provided in a position overlapping with the light-receiving device 95 of the pixel 350c is shorter than the shortest distance from the light-emitting device 90B of the pixel 350a to the opening. Furthermore, in the top view, the center distance between the light-emitting device 90B of the pixel 350c and the opening is shorter than the center distance between the light-emitting device 90B of the pixel 350a and the opening.

Furthermore, in the top view, the shortest distance from the light-emitting device 90B to the light-receiving device 95 and the shortest distance from the light-emitting device 90B to the opening which is of the light-blocking layer 56 and provided in a position overlapping with the light-receiving device 95 are equal to each other in each pixel. In the top view, the center distance between the light-emitting device 90B and the light-receiving device 95 is equal to the center distance between the light-emitting device 90B and the opening in each pixel. Furthermore, in the top view, the center of the light-receiving device 95 and the center of the opening are in the same position (or substantially in the same position).

The adjustment of the position of the devices such as the light-emitting device, the light-receiving device, or the light-emitting and light-receiving device as illustrated in FIGS. 8A to 8C allows much light coming from a specific light-emitting device to enter the light-receiving device.

Figure 9A:
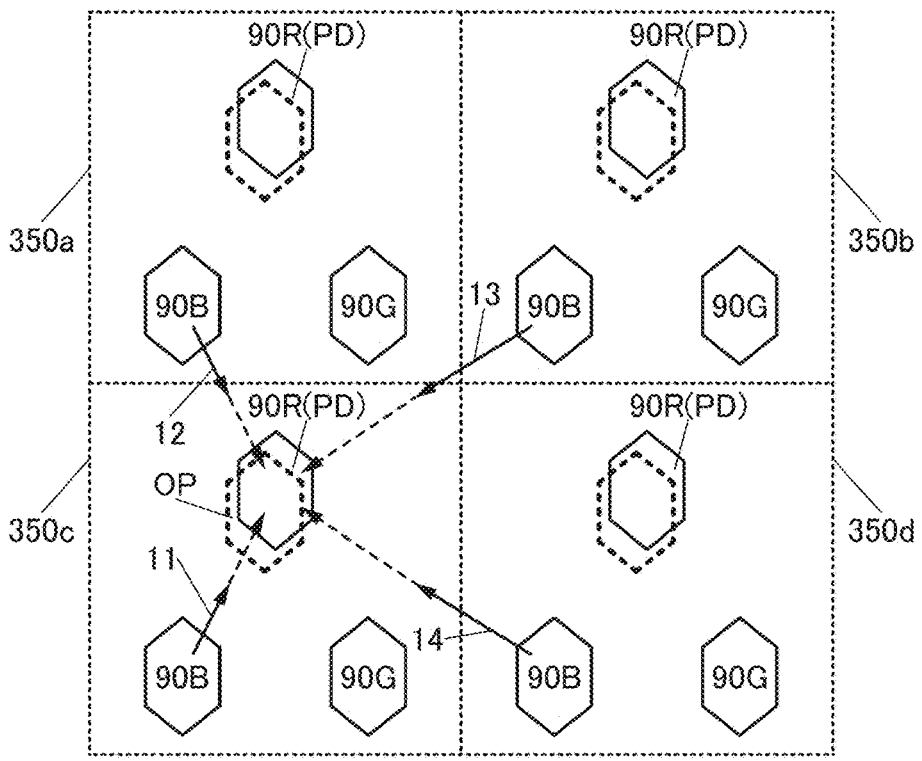
FIGS. 9A to 9C are top views each illustrating an example of a display unit.
Figure 9B:
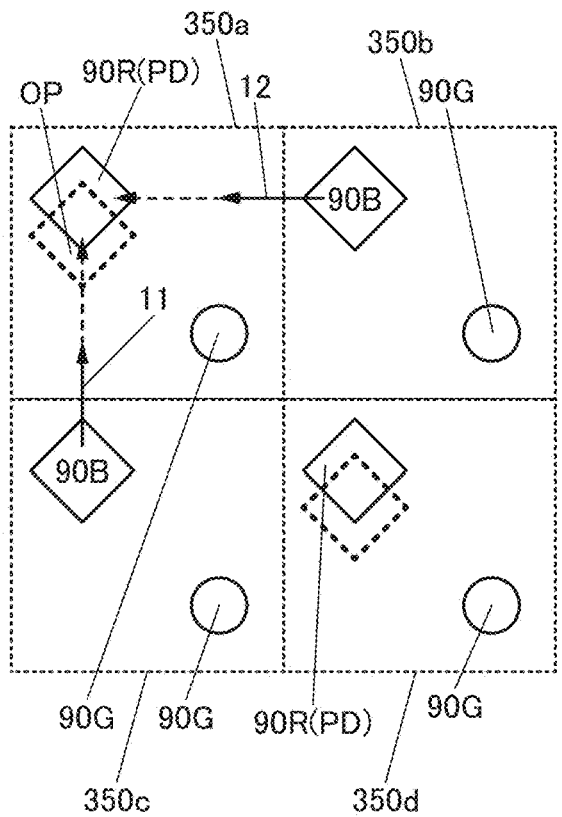
Figure 9C:
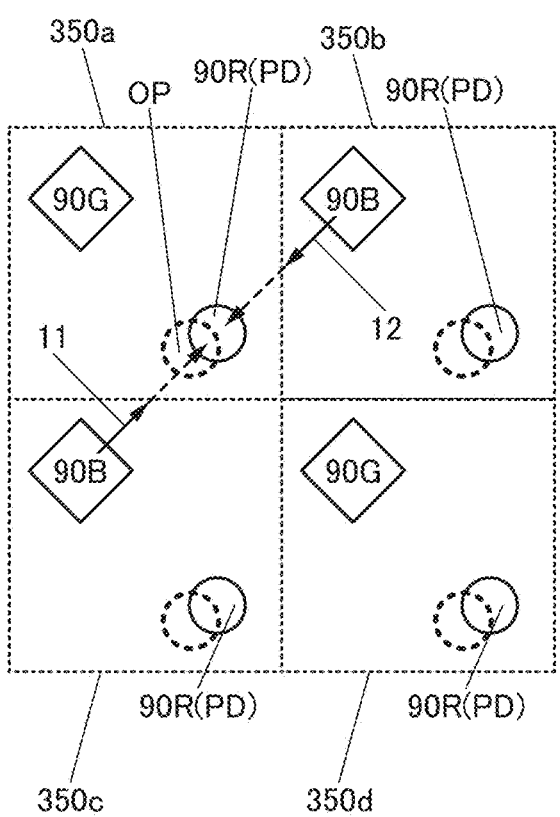

FIGS. 9A to 9C illustrate a top-view layout of four pixels in display units including light-emitting and light-receiving devices.

The pixels in FIG. 9A each include a light-emitting and light-receiving device 90R(PD) which emits red light and has a light-receiving function, the light-emitting device 90G which emits green light, and the light-emitting device 90B which emits blue light. The light-emitting and light-receiving device 90R(PD) absorbs at least blue light.

In FIG. 9A, a row corresponding to an upper row of pixels is provided with the light-emitting and light-receiving devices 90R(PD), and a row corresponding to a lower row of pixels is provided with the light-emitting devices 90B and the light-emitting devices 90G which are alternately arranged at regular intervals.

In FIG. 9A, the light 11 emitted by the light-emitting device 90B included in the lower-left pixel 350c and reflected by an object, the light 12 emitted by the light-emitting device 90B included in the upper-left pixel 350a and reflected by the object, the light 13 emitted by the light-emitting device 90B included in the upper-right pixel 350b and reflected by the object, and the light 14 emitted by the light-emitting device 90B included in the lower-right pixel 350d and reflected by the object enter the light-emitting and light-receiving device 90R(PD) included in the lower-left pixel 350c.

In FIG. 9A, the shortest distance a from the light-emitting device 90B of the pixel 350a to the light-emitting and light-receiving device 90R(PD) of the pixel 350c is equal to the shortest distance b from the light-emitting device 90B of the pixel 350c to the light-emitting and light-receiving device 90R(PD) of the pixel 350c. Furthermore, in FIG. 9A, the center distance between the light-emitting device 90B of the pixel 350a and the light-emitting and light-receiving device 90R(PD) of the pixel 350c is equal to the center distance between the light-emitting device 90B of the pixel 350c and the light-emitting and light-receiving device 90R (PD) of the pixel 350c.

The light-emitting device 90B of the pixel 350a and the light-emitting device 90B of the pixel 350c are both the closest to the light-emitting and light-receiving device 90R (PD) of the pixel 350c among light-emitting devices that emit blue light.

In FIG. 9A, the shortest distance c from the light-emitting device 90B of the pixel 350c to the opening OP of the light-blocking layer is shorter than the shortest distance d from the light-emitting device 90B of the pixel 350a to the opening OP. Furthermore, the center distance between the light-emitting device 90B of the pixel 350c and the opening OP is shorter than the center distance between the light-emitting device 90B of the pixel 350a and the opening OP. Furthermore, in the top view, the shortest distance from the light-emitting device 90B to the opening OP is shorter than the shortest distance from the light-emitting device 90B to the light-emitting and light-receiving device 90R(PD) in each pixel. Furthermore, in the top view, the center distance between the light-emitting device 90B and the opening OP is shorter than the center distance between the light-emitting device 90B and the light-emitting and light-receiving device 90R(PD) in each pixel. In the top view, the center position of the light-emitting and light-receiving device 90R(PD) is different from the center position of the opening.

In FIG. 9A, the absolute value |a−b| of the difference between the shortest distance a from the light-emitting device 90B of the pixel 350a to the light-emitting and light-receiving device 90R(PD) of the pixel 350c and the shortest distance b from the light-emitting device 90B of the pixel 350c to the light-emitting and light-receiving device 90R(PD) of the pixel 350c is smaller than the absolute value |c−d| of the difference between the shortest distance c from the light-emitting device 90B of the pixel 350a to the opening which is of the light-blocking layer 56 and provided in a position overlapping with the light-emitting and light-receiving device 90R(PD) of the pixel 350c and the shortest distance d from the light-emitting device 90B of the pixel 350c to the opening.

In the top view, the light-emitting device 90B of the pixel 350c is closer to the opening OP than the light-emitting device 90B of the pixel 350a is; therefore, the light-emitting and light-receiving device 90R(PD) of the pixel 350c is more likely to receive the light 11 emitted by the light-emitting device 90B of the pixel 350c and reflected by an object than to receive the light 12 emitted by the light-emitting device 90B of the pixel 350a and reflected by an object.

The pixels in FIG. 9B employ pentile arrangement in a manner similar to that of the pixels in FIG. 2E.

In FIG. 9B, the upper-left pixel 350a and the lower-right pixel 350d each include the light-emitting and light-receiving device 90R(PD) which emits red light and has a light-receiving function and the light-emitting device 90G which emits green light. The upper-right pixel 350b and the lower-left pixel 350c in FIG. 9B each include the light-emitting device 90G which emits green light and the light-emitting device 90B which emits blue light.

The pixels in FIG. 9C employ the arrangement similar to that employed in the pixels in FIG. 2F.

In FIG. 9C, the upper-left pixel 350*a* and the lower-right pixel 350*d* each include the light-emitting and light-receiving device 90R(PD) which emits red light and has a light-receiving function and the light-emitting device 90G which emits green light. The upper-right pixel 350*b* and the lower-left pixel 350*c* in FIG. 9C each include the light-emitting and light-receiving device 90R(PD) which emits red light and has a light-receiving function and the light-emitting device 90B which emits blue light.

In FIGS. 9B and 9C, the light 11 emitted by the light-emitting device 90B included in the lower-left pixel 350*c* and reflected by an object and the light 12 emitted by the light-emitting device 90B included in the upper-right pixel 350*b* and reflected by the object enter the light-emitting and light-receiving device 90R(PD) included in the upper-left pixel 350*a*.

In FIGS. 9B and 9C, the shortest distance a from the light-emitting device 90B of the pixel 350*c* to the light-emitting and light-receiving device 90R(PD) of the pixel 350*a* is equal to the shortest distance b from the light-emitting device 90B of the pixel 350*b* to the light-emitting and light-receiving device 90R(PD) of the pixel 350*a*. Furthermore, in FIGS. 9B and 9C, the center distance between the light-emitting device 90B of the pixel 350*c* and the light-emitting and light-receiving device 90R(PD) of the pixel 350*a* is equal to the center distance between the light-emitting device 90B of the pixel 350*b* and the light-emitting and light-receiving device 90R(PD) of the pixel 350*a*.

The light-emitting device 90B of the pixel 350*b* and the light-emitting device 90B of the pixel 350*c* are both the closest to the light-emitting and light-receiving device 90R(PD) of the pixel 350*a* among light-emitting devices that emit blue light.

In FIGS. 9B and 9C, the shortest distance c from the light-emitting device 90B of the pixel 350*c* to the opening OP of the light-blocking layer is shorter than the shortest distance d from the light-emitting device 90B of the pixel 350*b* to the opening OP. Furthermore, in FIGS. 9B and 9C, the center distance between the light-emitting device 90B of the pixel 350*c* and the opening OP is shorter than the center distance between the light-emitting device 90B of the pixel 350*b* and the opening OP. In FIGS. 9B and 9C, the center position of the light-emitting and light-receiving device 90R(PD) is different from the center position of the opening OP.

In FIGS. 9B and 9C, the absolute value |a−b| of the difference between the shortest distance a from the light-emitting device 90B of the pixel 350*c* to the light-emitting and light-receiving device 90R(PD) of the pixel 350*a* and the shortest distance b from the light-emitting device 90B of the pixel 350*b* to the light-emitting and light-receiving device 90R(PD) of the pixel 350*a* is smaller than the absolute value |c−d| of the difference between the shortest distance c from the light-emitting device 90B of the pixel 350*c* to the opening which is of the light-blocking layer 56 and provided in a position overlapping with the light-emitting and light-receiving device 90R(PD) of the pixel 350*a* and the shortest distance d from the light-emitting device 90B of the pixel 350*b* to the opening.

In the top view, the light-emitting device 90B of the pixel 350*c* is closer to the opening OP than the light-emitting device 90B of the pixel 350*b* is; therefore, the light-emitting and light-receiving device 90R(PD) of the pixel 350*a* is more likely to receive the light 11 emitted by the light-emitting device 90B of the pixel 350*c* and reflected by an object than to receive the light 12 emitted by the light-emitting device 90B of the pixel 350*b* and reflected by an object.

The use of the structure illustrated in FIGS. 9A to 9C allows much light coming from a specific light-emitting device to enter the light-emitting and light-receiving device.

As illustrated in FIGS. 9A to 9C, it is preferable to control light incident on the light-emitting and light-receiving device by adjusting the position of the opening (the above-described opening OP) which is of the light-blocking layer and provided in a position overlapping with the light-emitting and light-receiving device. Since a change in the layout of the device itself for the purpose of controlling light incident on the light-emitting and light-receiving device is not necessary, the display unit having a high aperture ratio of pixels can be manufactured with a high yield. Thus, the resolution and manufacturing yield of the display unit can be increased.

[Device Structure]

Next, detailed structures of the light-emitting device, the light-receiving device, and the light-emitting and light-receiving device which can be used in the display unit of one embodiment of the present invention are described.

The display unit of one embodiment of the present invention can have any of the following structures: a top-emission structure in which light is emitted in a direction opposite to the substrate where the light-emitting device is formed, a bottom-emission structure in which light is emitted toward the substrate where the light-emitting device is formed, and a dual-emission structure in which light is emitted toward both surfaces.

In this embodiment, a top-emission display unit is described as an example.

In this specification and the like, unless otherwise specified, in describing a structure including a plurality of elements (e.g., light-emitting devices and light-emitting layers), letters are not added when a common part of the elements is described. For example, when a common part of a light-emitting layer 63R, a light-emitting layer 63G, and the like is described, the light-emitting layers are simply referred to as the light-emitting layer 63, in some cases.

Figure 10:
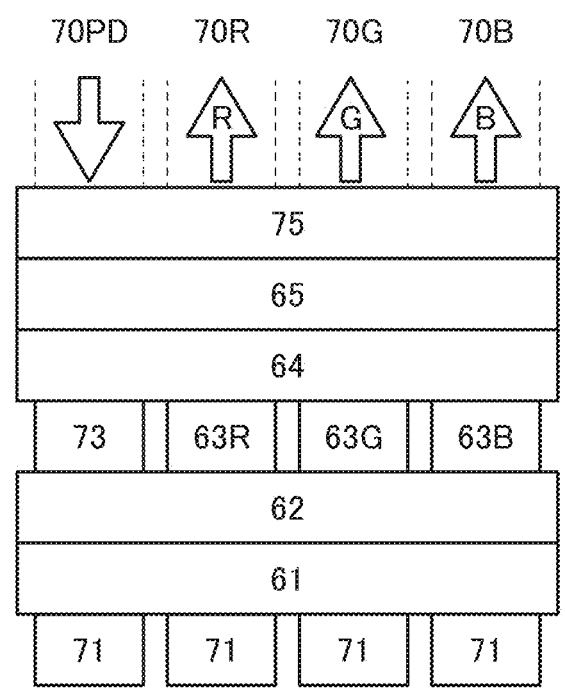
FIG. 10 is a cross-sectional view illustrating an example of a display unit.

A display unit 10A illustrated in FIG. 10 includes a light-receiving device 70PD, a light-emitting device 70R which emits red (R) light, a light-emitting device 70G which emits green (G) light, and a light-emitting device 70B which emits blue (B) light.

Each of the light-emitting devices includes a pixel electrode 71, a hole-injection layer 61, a hole-transport layer 62, a light-emitting layer, an electron-transport layer 64, an electron-injection layer 65, and a common electrode 75 which are stacked in this order. The light-emitting device 70R includes the light-emitting layer 63R, the light-emitting device 70G includes the light-emitting layer 63G, and the light-emitting device 70B includes a light-emitting layer 63B. The light-emitting layer 63R includes a light-emitting substance which emits red light, the light-emitting layer 63G includes a light-emitting substance which emits green light, and the light-emitting layer 63B includes a light-emitting substance which emits blue light. The pixel electrodes 71 included in the light-emitting devices are electrically insulated (separated) from each other. The common electrode 75 is used in common for the light-emitting devices.

The light-emitting devices are electroluminescent devices which emit light to the common electrode 75 side on voltage application between the pixel electrodes 71 and the common electrode 75.

The light-receiving device 70PD includes the pixel electrode 71, the hole-injection layer 61, the hole-transport layer 62, an active layer 73, the electron-transport layer 64, the electron-injection layer 65, and the common electrode 75 which are stacked in this order.

The light-receiving device 70PD is a photoelectric conversion device that receives light incident from the outside of the display unit 10A and converts the light into an electric signal.

This embodiment is described assuming that the pixel electrodes 71 function as anodes and the common electrode 75 functions as a cathode in the light-emitting devices and the light-receiving device. In other words, the light-receiving device is driven by application of reverse bias between the pixel electrode 71 and the common electrode 75, whereby light incident on the light-receiving device can be sensed and electric charge can be generated and extracted as current.

In the display unit of this embodiment, an organic compound is used for the active layer 73 of the light-receiving device 70PD. In the light-receiving device 70PD, the layers other than the active layer 73 can be common to the layers in the light-emitting devices. Therefore, the light-receiving device 70PD can be formed concurrently with the formation of the light-emitting devices only by adding a step of forming the active layer 73 in the manufacturing process of the light-emitting devices. The light-emitting devices and the light-receiving device 70PD can be formed over one substrate. Accordingly, the light-receiving device 70PD can be incorporated into the display unit without a significant increase in the number of manufacturing steps.

The display unit 10A shows an example in which the light-receiving device 70PD and the light-emitting devices have a common structure except that the active layer 73 of the light-receiving device 70PD and the light-emitting layers 63 of the light-emitting devices are separately formed. Note that the structures of the light-receiving device 70PD and the light-emitting devices are not limited thereto. The light-receiving device 70PD and the light-emitting devices may have a separately formed layer in addition to the active layer 73 and the light-emitting layers 63. The light-receiving device 70PD and the light-emitting devices preferably include at least one layer used in common (common layer). Thus, the light-receiving device 70PD can be incorporated into the display unit without a significant increase in the number of manufacturing steps.

A conductive film that transmits visible light is used as the electrode through which light is extracted, which is either the pixel electrode 71 or the common electrode 75. A conductive film that reflects visible light is preferably used as the electrode through which light is not extracted.

The light-emitting devices included in the display unit of this embodiment preferably employ a microcavity structure. Therefore, one of the pair of electrodes of the light-emitting devices is preferably an electrode having properties of transmitting and reflecting visible light (a transflective electrode), and the other is preferably an electrode having a property of reflecting visible light (a reflective electrode). When the light-emitting devices have a microcavity structure, light obtained from the light-emitting layers can be resonated between the electrodes, whereby light emitted from the light-emitting devices can be intensified.

Note that the transflective electrode can have a stacked-layer structure of a reflective electrode and an electrode having a property of transmitting visible light (also referred to as a transparent electrode).

The transparent electrode has a light transmittance higher than or equal to 40%. For example, an electrode having a visible light (light at wavelengths greater than or equal to 400 nm and less than 750 nm) transmittance higher than or equal to 40% is preferably used in the light-emitting devices. The visible light reflectivity of the transflective electrode is higher than or equal to 10% and lower than or equal to 95%, preferably higher than or equal to 30% and lower than or equal to 80%. The visible light reflectivity of the reflective electrode is higher than or equal to 40% and lower than or equal to 100%, preferably higher than or equal to 70% and lower than or equal to 100%. These electrodes preferably have a resistivity of $1\times10^{-2}$ Ωcm or lower. Note that in the case where any of the light-emitting devices emits near-infrared light (light with a wavelength greater than or equal to 750 nm and less than or equal to 1300 nm), the near-infrared light transmittance and reflectivity of these electrodes preferably satisfy the above-described numerical ranges of the visible light transmittance and reflectivity.

The light-emitting devices include at least the light-emitting layer 63. In addition to the light-emitting layer 63, the light-emitting devices may further include one or more layers containing any of a substance with a high hole-injection property, a substance with a high hole-transport property, a hole-blocking material, a substance with a high electron-transport property, a substance with a high electron-injection property, a substance with a bipolar property (a substance with a high electron- and hole-transport property), and the like.

For example, the light-emitting devices and the light-receiving device can share at least one of the hole-injection layer, the hole-transport layer, the electron-transport layer, and the electron-injection layer. Furthermore, at least one of the hole-injection layer, the hole-transport layer, the electron-transport layer, and the electron-injection layer can be separately formed for the light-emitting devices and the light-receiving device.

The hole-injection layer injects holes from an anode to the hole-transport layer and contains a material with a high hole-injection property. As the material with a high hole-injection property, an aromatic amine compound and a composite material containing a hole-transport material and an acceptor material (electron-accepting material) can be used.

In the light-emitting devices, the hole-transport layer transports holes that are injected from the anode by the hole-injection layer, to the light-emitting layer. In the light-receiving device, the hole-transport layer transports holes that are generated in the active layer on the basis of incident light, to the anode. The hole-transport layer contains a hole-transport material. The hole-transport material preferably has a hole mobility of $10^{-6}$ cm$^2$/Vs or higher. Note that other substances can also be used as long as the substances have a hole-transport property higher than an electron-transport property. As the hole-transport material, materials having a high hole-transport property, such as a π-electron rich heteroaromatic compound (e.g., a carbazole derivative, a thiophene derivative, and a furan derivative) and an aromatic amine (a compound having an aromatic amine skeleton), are preferred.

In the light-emitting devices, the electron-transport layer transports electrons that are injected from the cathode by the electron-injection layer, to the light-emitting layer. In the light-receiving device, the electron-transport layer transports electrons that are generated in the active layer on the basis of incident light, to the cathode. The electron-transport layer contains an electron-transport material. The electron-transport material preferably has an electron mobility of $1 \times 10^{-6}$ cm$^2$/Vs or higher. Note that other substances can also be used as long as the substances have an electron-transport property higher than a hole-transport property. As the electron-transport material, any of the following materials having a high electron-transport property can be used, for example: a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative having a quinoline ligand, a benzoquinoline derivative, a quinoxaline derivative, a dibenzoquinoxaline derivative, a pyridine derivative, a bipyridine derivative, a pyrimidine derivative, and a π-electron deficient heteroaromatic compound such as a nitrogen-containing heteroaromatic compound.

The electron-injection layer injects electrons from the cathode to the electron-transport layer and contains a material with a high electron-injection property. As the material with a high electron-injection property, an alkali metal, an alkaline earth metal, or a compound thereof can be used. As the material with a high electron-injection property, a composite material containing an electron-transport material and a donor material (electron-donating material) can also be used.

The light-emitting layer 63 contains a light-emitting substance. The light-emitting layer 63 can contain one or more kinds of light-emitting substances. As the light-emitting substance, a substance whose emission color is blue, violet, bluish violet, green, yellowish green, yellow, orange, red, or the like is appropriately used. Alternatively, as the light-emitting substance, a substance that emits near-infrared light can be used.

Examples of the light-emitting substance include a fluorescent material, a phosphorescent material, a TADF material, and a quantum dot material.

Examples of the fluorescent material include a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative.

Examples of the phosphorescent material include an organometallic complex (particularly an iridium complex) having a 4H-triazole skeleton, a 1H-triazole skeleton, an imidazole skeleton, a pyrimidine skeleton, a pyrazine skeleton, or a pyridine skeleton; an organometallic complex (particularly an iridium complex) having a phenylpyridine skeleton including an electron-withdrawing group as a ligand; a platinum complex; and a rare earth metal complex.

The light-emitting layer 63 may contain one or more kinds of organic compounds (e.g., a host material or an assist material) in addition to the light-emitting substance (guest material). As one or more kinds of organic compounds, one or both of the hole-transport material and the electron-transport material can be used. Alternatively, as one or more kinds of organic compounds, a bipolar material or a TADF material may be used.

The light-emitting layer 63 preferably includes a combination of a hole-transport material and an electron-transport material that easily forms an exciplex and a phosphorescent material. With such a structure, light emission can be efficiently obtained by exciplex-triplet energy transfer (ExTET), which is energy transfer from an exciplex to a light-emitting substance (phosphorescent material). When a combination of materials is selected so as to form an exciplex that exhibits light emission whose wavelength overlaps with the wavelength of a lowest-energy-side absorption band of the light-emitting substance, energy can be transferred smoothly and light emission can be obtained efficiently. With the above structure, high efficiency, low-voltage driving, and a long lifetime of a light-emitting device can be achieved at the same time.

In a combination of materials for forming an exciplex, the highest occupied molecular orbital level (HOMO level) of the hole-transport material is preferably higher than or equal to that of the electron-transport material. The lowest unoccupied molecular orbital level (LUMO level) of the hole-transport material is preferably higher than or equal to that of the electron-transport material. The LUMO levels and the HOMO levels of the materials can be derived from the electrochemical characteristics (the reduction potentials and the oxidation potentials) of the materials that are measured by cyclic voltammetry (CV).

The formation of an exciplex can be confirmed, for example, by a phenomenon in which the emission spectrum of a mixed film in which the hole-transport material and the electron-transport material are mixed is shifted to the longer wavelength side than the emission spectra of each of the materials (or has another peak on the longer wavelength side) observed by comparison of the emission spectra of the hole-transport material, the electron-transport material, and the mixed film of these materials. Alternatively, the formation of an exciplex can be confirmed by a difference in transient response, such as a phenomenon in which the transient photoluminescence (PL) lifetime of the mixed film has more long-lifetime components or has a larger proportion of delayed components than that of each of the materials, observed by comparison of transient PL of the hole-transport material, the electron-transport material, and the mixed film of these materials. The transient PL can be rephrased as transient electroluminescence (EL). That is, the formation of an exciplex can also be confirmed by a difference in transient response observed by comparison of the transient EL of the hole-transport material, the electron-transport material, and the mixed film of the materials.

The active layer 73 includes a semiconductor. Examples of the semiconductor include an inorganic semiconductor such as silicon and an organic semiconductor including an organic compound. This embodiment shows an example in which an organic semiconductor is used as the semiconductor included in the active layer 73. The use of an organic semiconductor is preferable because the light-emitting layer 63 and the active layer 73 can be formed by the same method (e.g., a vacuum evaporation method) and thus the same manufacturing apparatus can be used.

Examples of an n-type semiconductor material included in the active layer 73 are electron-accepting organic semiconductor materials such as fullerene (e.g., $C_{60}$ and $C_{70}$) and fullerene derivatives. Fullerene has a soccer ball shape; this shape is stable in terms of energy. Both the HOMO level and the LUMO level of fullerene are deep (low). Having a deep LUMO level, fullerene has an extremely high electron-accepting property (acceptor property). When π-electron conjugation (resonance) spreads in a plane as in benzene, the electron-donating property (donor property) usually increases. Although π-electrons widely spread in fullerene having a spherical shape, its electron-accepting property is high. The high electron-accepting property efficiently causes rapid charge separation and is useful for light-receiving devices. Both $C_{60}$ and $C_{70}$ have a wide absorption band in the visible light region, and $C_{70}$ is especially preferable because of having a larger π-electron conjugation system and a wider absorption band in the long wavelength region than $C_{60}$.

Other examples of the n-type semiconductor material include a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative, a benzoquinoline derivative, a quinoxaline derivative, a dibenzoquinoxaline derivative, a pyridine derivative, a bipyridine derivative, a pyrimidine derivative, a naphthalene derivative, an anthracene derivative, a coumarin derivative, a rhodamine derivative, a triazine derivative, and a quinone derivative.

Examples of a p-type semiconductor material included in the active layer 73 are electron-donating organic semiconductor materials such as copper(II) phthalocyanine (CuPc), tetraphenyldibenzoperiflanthene (DBP), zinc phthalocyanine (ZnPc), tin phthalocyanine (SnPc), and quinacridone.

Other examples of the p-type semiconductor material include a carbazole derivative, a thiophene derivative, a furan derivative, and a compound having an aromatic amine skeleton. Furthermore, a naphthalene derivative, an anthracene derivative, a pyrene derivative, a triphenylene derivative, a fluorene derivative, a pyrrole derivative, a benzofuran derivative, a benzothiophene derivative, an indole derivative, a dibenzofuran derivative, a dibenzothiophene derivative, an indolocarbazole derivative, a porphyrin derivative, a phthalocyanine derivative, a naphthalocyanine derivative, a quinacridone derivative, a polyphenylene vinylene derivative, a polyparaphenylene derivative, a polyfluorene derivative, a polyvinyl carbazole derivative, a polythiophene derivative, and the like can be given as examples of the p-type semiconductor material.

The HOMO level of the electron-donating organic semiconductor material is preferably shallower (higher) than the HOMO level of the electron-accepting organic semiconductor material. The LUMO level of the electron-donating organic semiconductor material is preferably shallower (higher) than the LUMO level of the electron-accepting organic semiconductor material.

Fullerene having a spherical shape is preferably used as the electron-accepting organic semiconductor material, and an organic semiconductor material having a substantially planar shape is preferably used as the electron-donating organic semiconductor material. Molecules of similar shapes tend to aggregate, and aggregated molecules of similar kinds, which have molecular orbital energy levels close to each other, can increase the carrier-transport property.

For example, the active layer 73 is preferably formed by co-evaporation of an n-type semiconductor and a p-type semiconductor.

Either a low molecular compound or a high molecular compound can be used for the light-emitting devices and the light-receiving device, and an inorganic compound may also be included. Each of the layers included in the light-emitting devices and the light-receiving device can be formed by any of the following methods: an evaporation method (including a vacuum evaporation method), a transfer method, a printing method, an inkjet method, a coating method, and the like.

Figure 11A:
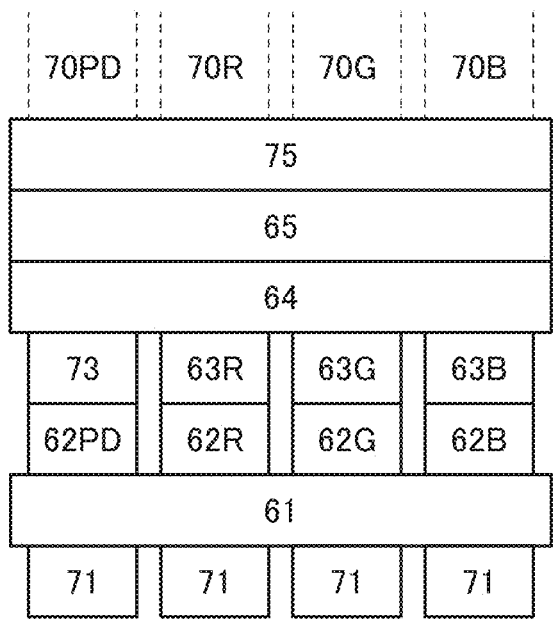
FIGS. 11A to 11D are cross-sectional views each illustrating an example of a display unit.

A display unit 10B illustrated in FIG. 11A is different from the display unit 10A in that the hole-transport layer is formed separately in each device. Note that in the following description of display units, the description of components similar to those of the above-described display units may be omitted.

The light-receiving device 70PD includes a hole-transport layer 62PD, the light-emitting device 70R includes a hole-transport layer 62R, the light-emitting device 70G includes a hole-transport layer 62G, and the light-emitting device 70B includes a hole-transport layer 62B.

The hole-transport layers 62PD, 62R, 62G, and 62B may each have a function of an optical adjustment layer. Specifically, the thickness of the hole-transport layer 62B is preferably adjusted so that the optical distance between the pair of electrodes in the light-emitting device 70B can become an optical distance that intensifies blue light. Similarly, the thickness of the hole-transport layer 62G is preferably adjusted so that the optical distance between the pair of electrodes in the light-emitting device 70G can become an optical distance that intensifies green light. The thickness of the hole-transport layer 62R is preferably adjusted so that the optical distance between the pair of electrodes in the light-emitting device 70R can become an optical distance that intensifies red light. Furthermore, the thickness of the hole-transport layer 62PD is preferably adjusted so that the optical distance between the pair of electrodes in the light-receiving device 70PD can become an optical distance that chiefly intensifies light of a reception-target wavelength. Note that the layer used as the optical adjustment layer is not limited to the hole-transport layer.

Figure 11B:
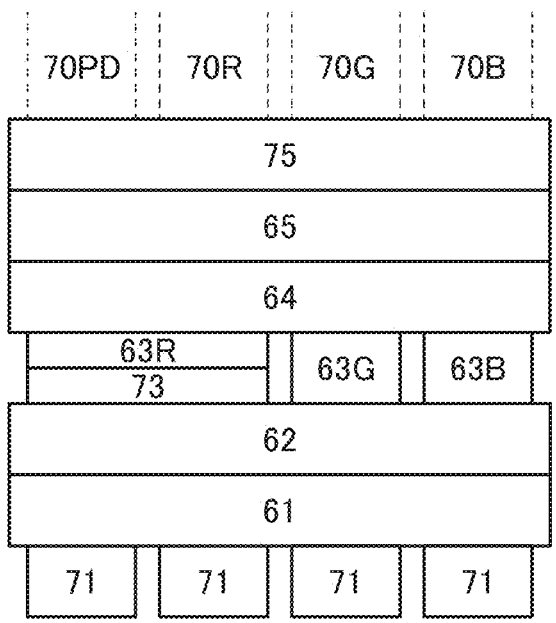

A display unit 10C illustrated in FIG. 11B is different from the display unit 10A in that the light-receiving device 70PD and the light-emitting device 70R have the same structure.

The light-receiving device 70PD and the light-emitting device 70R share the active layer 73 and the light-emitting layer 63R.

Here, the light-receiving device 70PD preferably has the same structure as the light-emitting device which emits light of a wavelength that is longer than the sensing-target light wavelength. For example, the light-receiving device 70PD with a structure for sensing blue light can have a structure similar to that of either or both of the light-emitting device 70R and the light-emitting device 70G. For example, the light-receiving device 70PD with a structure for sensing green light can have a structure similar to that of the light-emitting device 70R.

When the light-receiving device 70PD and the light-emitting device 70R have a common structure, the number of film formation steps and the number of masks can be reduced from those used in the structure where the light-receiving device 70PD and the light-emitting device 70R include separately formed layers. Consequently, the manufacturing steps and the manufacturing costs of the display unit can be reduced.

When the light-receiving device 70PD and the light-emitting device 70R have the common structure, a space provided to allow for misalignment can be reduced as compared with the structure in which the light-receiving device 70PD and the light-emitting device 70R include separately formed layers. Accordingly, the aperture ratio of pixels can be increased and the light extraction efficiency of the display unit can be increased. This can extend the life of the light-emitting device. Furthermore, the display unit can exhibit a high luminance. Moreover, the resolution of the display unit can be increased.

The light-emitting layer 63R includes a light-emitting material that emits red light. The active layer 73 contains an organic compound that absorbs light of a wavelength shorter than that of red light (e.g., either or both of green light and blue light). The active layer 73 preferably contains an organic compound that does not easily absorb red light and that absorbs light of a wavelength shorter than that of red light. In this way, red light can be efficiently extracted from the light-emitting device 70R, and the light-receiving device 70PD can sense light of a wavelength shorter than that of red light at high accuracy.

Although the display unit 10C is an example where the light-emitting device 70R and the light-receiving device 70PD have the same structure, the optical adjustment layer of the light-emitting device 70R may have a thickness different from that of the optical adjustment layer of the light-receiving device 70PD.

Figure 11C:
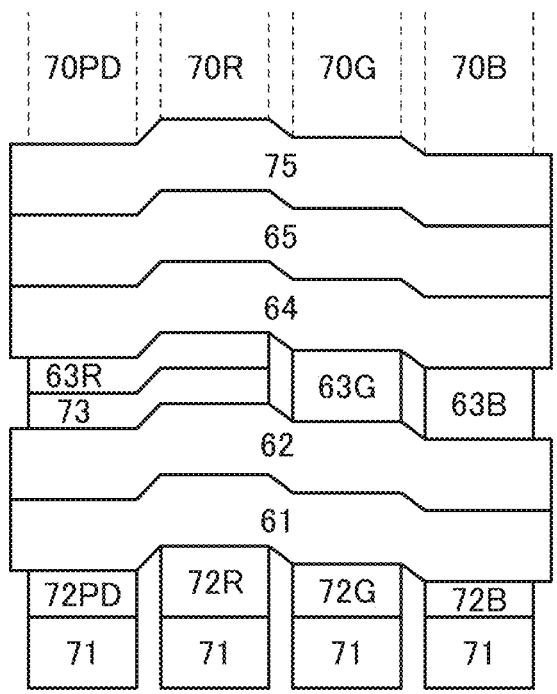

For example, as in a display unit 10D illustrated in FIG. 11C, optical adjustment layers are preferably provided over the pixel electrodes 71 and the thickness of the optical adjustment layers is preferably made to vary between the light-emitting device 70R and the light-receiving device 70PD for optical adjustment.

Specifically, an optical adjustment layer 72R is preferably provided so that the optical distance between the pair of electrodes in the light-emitting device 70R can become an optical distance that intensifies red light, and an optical adjustment layer 72PD is preferably provided so that the optical distance between the pair of electrodes in the light-receiving device 70PD can become an optical distance that intensifies light of a sensing-target wavelength. In this way, red light can be efficiently extracted from the light-emitting device 70R, and the light-receiving device 70PD can sense light at high accuracy.

For example, a reflective electrode can be used as the pixel electrode 71, and a transparent electrode can be used as the optical adjustment layer 72. In this case, the optical adjustment layer 72 can be regarded as part of the pixel electrode 71.

The light-emitting device 70G is preferably optically adjusted with an optical adjustment layer 72G so that the optical distance between the pair of electrodes can become an optical distance that intensifies green light. Similarly, the light-emitting device 70B is preferably optically adjusted with an optical adjustment layer 72B so that the optical distance between the pair of electrodes can become an optical distance that intensifies blue light.

Also in the display unit 10D, the light-receiving device 70PD and the light-emitting device 70R include the active layer 73 and the light-emitting layer 63R in common. Consequently, the manufacturing steps and the manufacturing costs of the display unit can be reduced.

Figure 11D:
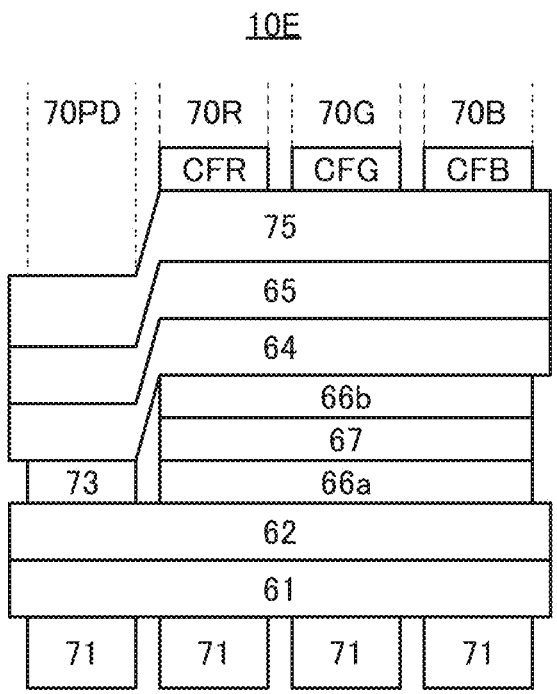

A display unit 10E illustrated in FIG. 11D is different from the display unit 10A in including a light-emitting device with a tandem structure that includes a plurality of EL layers.

The light-receiving device 70PD included in the display unit 10E has a structure similar to that of the light-receiving device 70PD included in the display unit 10A.

The light-emitting devices 70R, 70G, and 70B included in the display unit 10E have a common structure. Light emitted by the light-emitting device 70R is extracted from the display unit 10E through a coloring layer CFR as red light. Furthermore, light emitted by the light-emitting device 70G is extracted from the display unit 10E through a coloring layer CFG as green light. Moreover, light emitted by the light-emitting device 70B is extracted from the display unit 10E through a coloring layer CFB as blue light.

The light-emitting devices 70R, 70G, and 70B included in the display unit 10E include a unit 66a, an intermediate layer 67, and a unit 66b which are stacked in this order over the hole-transport layer 62. The electron-transport layer 64 is provided over the unit 66b.

The unit 66a and the unit 66b each have a single-layer structure or a stacked-layer structure including at least one light-emitting layer. It is preferable that white light be obtained from the combination of lights emitted by two or more light-emitting layers in total included in the unit 66a and the unit 66b. For example, the unit 66a is provided with a light-emitting layer which includes a light-emitting substance that emits blue light, and the unit 66b is provided with a light-emitting layer which includes a light-emitting substance that emits green light and a light-emitting layer which includes a light-emitting substance that emits red light, whereby white light can be emitted from the light-emitting devices as a whole.

The intermediate layer 67 includes at least a charge-generation region. On application of a voltage higher than the threshold voltage of the light-emitting devices to the pair of electrodes, holes and electrons are generated in the intermediate layer 67, holes move to the unit 66b, and electrons move to the unit 66a. The holes injected into the unit 66b are recombined with electrons injected from the common electrode 75 side, so that the light-emitting substance included in the unit 66b emits light. Furthermore, the electrons injected into the unit 66a are recombined with holes injected from the pixel electrode 71 side, so that the light-emitting substance included in the unit 66a emits light. Thus, the holes and electrons generated in the intermediate layer 67 cause light emission in different units. The intermediate layer 67 may include a hole-transport layer or an electron-transport layer in addition to the charge-generation region.

When the light-emitting devices 70R, 70G, and 70B have a common structure, the number of film formation steps and the number of masks can be reduced from those used in the structure where the light-emitting devices 70R, 70G, and 70B include separately formed layers. Consequently, the manufacturing steps and the manufacturing costs of the display unit can be reduced.

When the light-emitting devices 70R, 70G, and 70B have the common structure, a space provided to allow for misalignment can be reduced as compared with the structure in which the light-emitting devices 70R, 70G, and 70B include separately formed layers. Accordingly, the aperture ratio of pixels can be increased and the light extraction efficiency of the display unit can be increased. When the aperture ratio of pixels becomes higher, the luminance of subpixels necessary to obtain a certain luminance in the display unit can be reduced. This can extend the life of the light-emitting device. Furthermore, the display unit can exhibit a high luminance. Moreover, the resolution of the display unit can be increased.

Note that the optical adjustment layers of the light-emitting devices 70R, 70G, and 70B may have different thicknesses from one another.

Figure 12A:
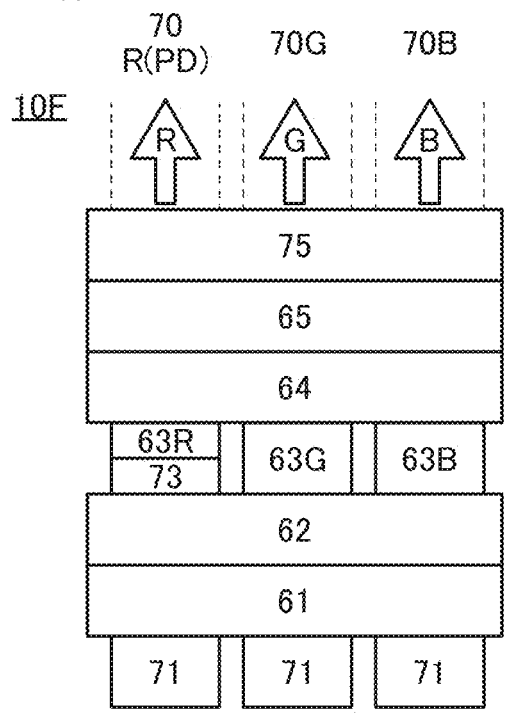
FIGS. 12A and 12B are cross-sectional views each illustrating an example of a display unit.
Figure 12B:
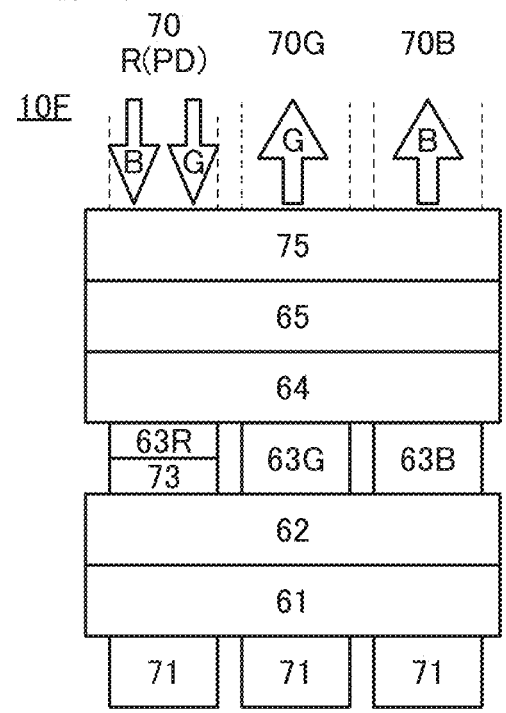

A display unit 10F illustrated in FIGS. 12A and 12B includes a light-emitting and light-receiving device 70R (PD) which emits red (R) light and has a light-receiving function, the light-emitting device 70G which emits green (G) light, and the light-emitting device 70B which emits blue (B) light.

Each of the light-emitting devices includes the pixel electrode 71, the hole-injection layer 61, the hole-transport layer 62, a light-emitting layer, the electron-transport layer 64, the electron-injection layer 65, and the common electrode 75 which are stacked in this order. The light-emitting device 70G includes the light-emitting layer 63G, and the light-emitting device 70B includes a light-emitting layer 63B. The light-emitting layer 63G includes a light-emitting substance which emits green light, and the light-emitting layer 63B includes a light-emitting substance which emits blue light.

The light-emitting and light-receiving device 70R(PD) includes the pixel electrode 71, the hole-injection layer 61, the hole-transport layer 62, the active layer 73, the light-emitting layer 63R, the electron-transport layer 64, the electron-injection layer 65, and the common electrode 75 which are stacked in this order.

Note that the light-emitting and light-receiving device 70R(PD) included in the display unit 10F has the same structure as the light-emitting device 70R and the light-receiving device 70PD included in the display unit 10C. Furthermore, the light-emitting devices 70G and 70B included in the display unit 10F also have the same structures as the light-emitting devices 70G and 70B, respectively, which are included in the display unit 10C.

FIG. 12A illustrates a case where the light-emitting and light-receiving device 70R(PD) functions as a light-emitting device. FIG. 12A illustrates an example in which the light-emitting device 70B emits blue light, the light-emitting device 70G emits green light, and the light-emitting and light-receiving device 70R(PD) emits red light.

FIG. 12B illustrates a case where the light-emitting and light-receiving device 70R(PD) functions as a light-receiving device. FIG. 12B illustrates an example in which blue light emitted by the light-emitting device 70B and green light emitted by the light-emitting device 70G are sensed by the light-emitting and light-receiving device 70R(PD).

The light-emitting device 70B, the light-emitting device 70G, and the light-emitting and light-receiving device 70R(PD) each include the pixel electrode 71 and the common electrode 75. In this embodiment, the case where the pixel electrode 71 functions as an anode and the common electrode 75 functions as a cathode is described as an example.

This embodiment is described assuming that the pixel electrode 71 functions as an anode and the common electrode 75 functions as a cathode in the light-emitting and light-receiving device 70R(PD) in a manner similar to that of the light-emitting devices. In other words, the light-emitting and light-receiving device 70R(PD) is driven by application of reverse bias between the pixel electrode 71 and the common electrode 75, whereby light incident on the light-emitting and light-receiving device 70R(PD) can be sensed and electric charge can be generated and extracted as current.

Note that the light-emitting and light-receiving device 70R(PD) illustrated in FIGS. 12A and 12B has a structure of any of the light-emitting devices to which the active layer 73 is added. Therefore, the light-emitting and light-receiving device 70R(PD) can be formed concurrently with the formation of the light-emitting devices only by adding a step of forming the active layer 73 in the manufacturing process of the light-emitting devices. The light-emitting devices and the light-emitting and light-receiving device can be formed over the same substrate. Thus, one or both of an image capturing function and a sensing function can be provided to the display portion without a significant increase in the number of manufacturing steps.

[Light-Emitting and Light-Receiving Device]

FIGS. 12C to 12F illustrate examples of a stacked-layer structure of the light-emitting and light-receiving device.

The light-emitting and light-receiving device includes at least an active layer and a light-emitting layer between a pair of electrodes.

In addition to the active layer and the light-emitting layer, the light-emitting and light-receiving device may further include one or more layers containing any of a substance with a high hole-injection property, a substance with a high hole-transport property, a substance with a high hole-blocking property, a substance with a high electron-transport property, a substance with a high electron-injection property, a substance with a high electron-blocking property, a substance with a bipolar property (a substance with a high electron- and hole-transport property), and the like.

Figure 12C:
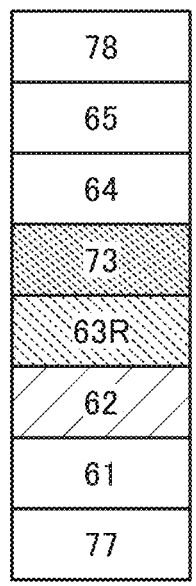
FIGS. 12C to 12F are cross-sectional views each illustrating an example of a light-emitting and light-receiving device.
Figure 12D:
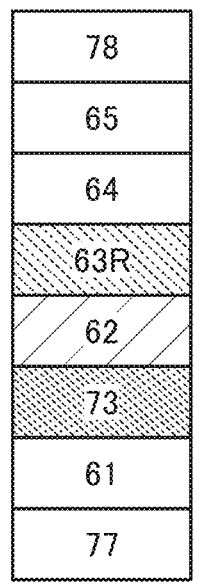

The light-emitting and light-receiving devices illustrated in FIGS. 12C and 12D each include a first electrode 77, the hole-injection layer 61, the hole-transport layer 62, the light-emitting layer 63R, the active layer 73, the electron-transport layer 64, the electron-injection layer 65, and a second electrode 78.

The stacking order of the light-emitting layer 63R and the active layer 73 is not limited. In FIGS. 12A and 12B, the active layer 73 is provided over the hole-transport layer 62, and the light-emitting layer 63R is provided over the active layer 73. In FIG. 12C, the light-emitting layer 63R is provided over the hole-transport layer 62, and the active layer 73 is provided over the light-emitting layer 63R. In FIG. 12D, the hole-transport layer 62 is provided over the active layer 73, and the light-emitting layer 63R is provided over the hole-transport layer 62.

As illustrated in FIGS. 12A to 12C, the active layer 73 and the light-emitting layer 63R may be in contact with each other. As illustrated in FIG. 12D, a buffer layer is preferably provided between the active layer 73 and the light-emitting layer 63R. As the buffer layer, at least one layer of a hole-injection layer, a hole-transport layer, an electron-transport layer, an electron-injection layer, a hole-blocking layer, an electron-blocking layer, and the like can be used. In FIG. 12D, the hole-transport layer 62 is used as the buffer layer.

The buffer layer provided between the active layer 73 and the light-emitting layer 63R can suppress transfer of excitation energy from the light-emitting layer 63R to the active layer 73. Furthermore, the optical path length (cavity length) of the microcavity structure can be adjusted with the buffer layer. Thus, a high emission efficiency can be obtained from the light-emitting and light-receiving device including the buffer layer between the active layer 73 and the light-emitting layer 63R.

Figure 12E:
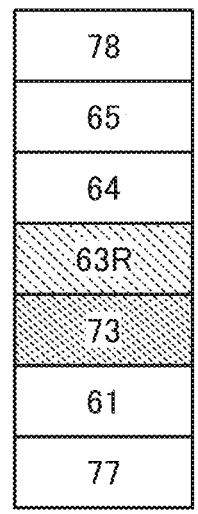

The light-emitting and light-receiving device illustrated in FIG. 12E is different from the light-emitting and light-receiving devices illustrated in FIGS. 12A to 12D in not including the hole-transport layer 62. The light-emitting and light-receiving device may exclude at least one layer of the hole-injection layer 61, the hole-transport layer 62, the electron-transport layer 64, and the electron-injection layer 65. Furthermore, the light-emitting and light-receiving device may include another functional layer such as a hole-blocking layer or an electron-blocking layer.

Figure 12F:
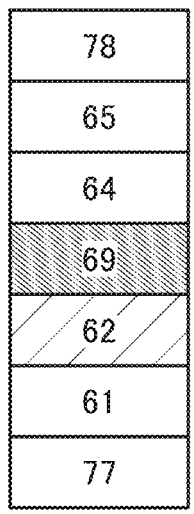

The light-emitting and light-receiving device illustrated in FIG. 12F is different from the light-emitting and light-receiving devices illustrated in FIGS. 12A to 12D in including a layer 69 serving as both a light-emitting layer and an active layer instead of including the active layer 73 and the light-emitting layer 63R.

As the layer 69 serving as both a light-emitting layer and an active layer, a layer containing three materials which are an n-type semiconductor that can be used for the active layer 73, a p-type semiconductor that can be used for the active layer 73, and a light-emitting substance that can be used for the light-emitting layer 63R can be used, for example.

Note that an absorption band on the lowest energy side of an absorption spectrum of a mixed material of the n-type semiconductor and the p-type semiconductor and a maximum peak of an emission spectrum (PL spectrum) of the light-emitting substance preferably do not overlap with each other and are further preferably positioned fully apart from each other.

In the light-emitting and light-receiving device, a conductive film that transmits visible light is used as the electrode through which light is extracted. A conductive film that reflects visible light is preferably used as the electrode through which light is not extracted.

The functions and materials of the layers constituting the light-emitting and light-receiving device are similar to those of the layers constituting the light-emitting devices and the light-receiving device and not described in detail here.

Detailed structures of the display units of one embodiment of the present invention will be described below with reference to FIGS. 13A to 13C, FIGS. 14A to 14C, FIGS. 15A and 15B, and FIGS. 16A and 16B, where the structure in which the center of the light-receiving device or the light-emitting and light-receiving device and the center of the opening of the light-blocking layer are not in the same position in the top view (see FIG. 6A) is employed.

[Display Unit 20A]

Figure 13A:
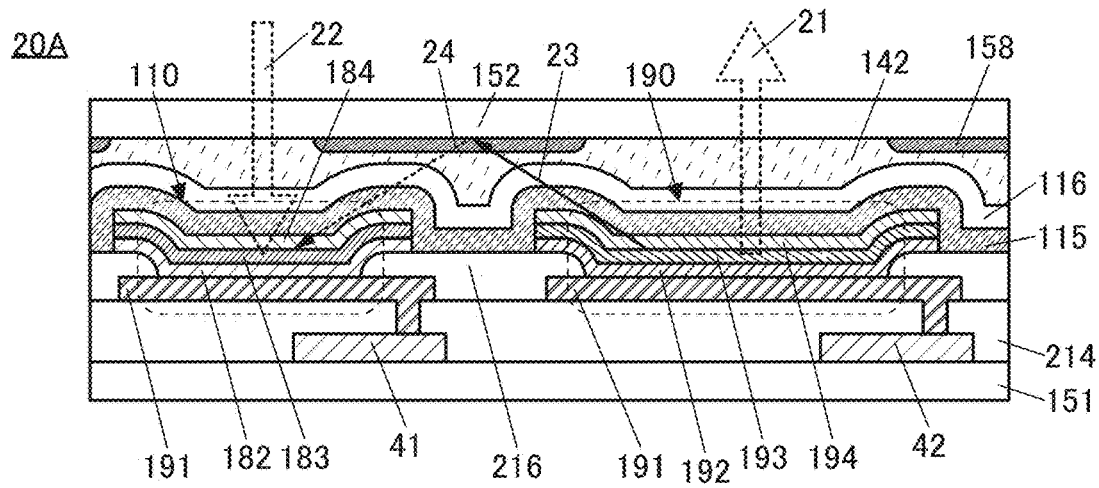
FIGS. 13A to 13C are cross-sectional views each illustrating an example of a display unit.

FIG. 13A is a cross-sectional view of a display unit 20A.

The display unit 20A includes a light-receiving device 110 and a light-emitting device 190.

The light-emitting device 190 includes a pixel electrode 191, a buffer layer 192, a light-emitting layer 193, a buffer layer 194, and a common electrode 115 which are stacked in this order. The buffer layer 192 can include one or both of a hole-injection layer and a hole-transport layer. The light-emitting layer 193 contains an organic compound. The buffer layer 194 can include one or both of an electron-injection layer and an electron-transport layer. The light-emitting device 190 has a function of emitting visible light 21. Note that the display unit 20A may also include a light-emitting device having a function of emitting infrared light.

The light-receiving device 110 includes the pixel electrode 191, a buffer layer 182, an active layer 183, a buffer layer 184, and the common electrode 115 which are stacked in this order. The buffer layer 182 can include a hole-transport layer. The active layer 183 contains an organic compound. The buffer layer 184 can include an electron-transport layer. The light-receiving device 110 has a function of sensing visible light. Note that the light-receiving device 110 may also have a function of sensing infrared light.

This embodiment is described assuming that the pixel electrode 191 functions as an anode and the common electrode 115 functions as a cathode in the light-emitting devices 190 and the light-receiving device 110. In other words, the light-receiving device 110 is driven by application of reverse bias between the pixel electrode 191 and the common electrode 115, whereby light incident on the light-receiving device 110 can be sensed by the display unit 20A and electric charge can be generated and extracted as current.

The pixel electrode 191, the buffer layer 182, the buffer layer 192, the active layer 183, the light-emitting layer 193, the buffer layer 184, the buffer layer 194, and the common electrode 115 may each have a single-layer structure or a stacked-layer structure.

The pixel electrodes 191 are positioned over an insulating layer 214. The pixel electrodes 191 can be formed using the same material in the same step. End portions of the pixel electrodes 191 are covered with a partition 216. Two pixel electrodes 191 adjacent to each other are electrically isolated (electrically separated) from each other by the partition 216.

An organic insulating film is suitable for the partition 216. Examples of materials that can be used for the organic insulating film include an acrylic resin, a polyimide resin, an epoxy resin, a polyamide resin, a polyimide-amide resin, a siloxane resin, a benzocyclobutene-based resin, a phenol resin, and precursors of these resins. The partition 216 is a layer that transmits visible light. Although the details will be described later, a partition 217 that blocks visible light may be provided instead of the partition 216.

The common electrode 115 is a layer shared by the light-receiving device 110 and the light-emitting device 190.

The material, thickness, and the like of the pair of electrodes can be the same between the light-receiving device 110 and the light-emitting device 190. Thus, the manufacturing cost of the display unit can be reduced, and the manufacturing process of the display unit can be simplified.

The display unit 20A includes the light-receiving device 110, the light-emitting device 190, a transistor 41, a transistor 42, and the like between a pair of substrates (a substrate 151 and a substrate 152).

In the light-receiving device 110, the buffer layer 182, the active layer 183, and the buffer layer 184, which are positioned between the pixel electrode 191 and the common electrode 115, can each be referred to as an organic layer (a layer containing an organic compound). The pixel electrode 191 preferably has a function of reflecting visible light. The common electrode 115 has a function of transmitting visible light. Note that in the case where the light-receiving device 110 is configured to sense infrared light, the common electrode 115 has a function of transmitting infrared light. Furthermore, the pixel electrode 191 preferably has a function of reflecting infrared light.

The light-receiving device 110 has a function of sensing light. Specifically, the light-receiving device 110 is a photoelectric conversion device that receives light 22 incident from the outside of the display unit 20A and converts the light 22 into an electric signal. The light 22 can also be expressed as light that is emitted by the light-emitting device 190 and then reflected by an object. The light 22 may enter the light-receiving device 110 through a lens or the like provided in the display device 20A.

In the light-emitting device 190, the buffer layer 192, the light-emitting layer 193, and the buffer layer 194, which are positioned between the pixel electrode 191 and the common electrode 115, can be collectively referred to as an EL layer. Note that the EL layer includes at least a light-emitting layer 193. As described above, the pixel electrode 191 preferably has a function of reflecting visible light. The common electrode 115 has a function of transmitting visible light. Note that when the display unit 20A includes a light-emitting device that emits infrared light, the common electrode 115 has a function of transmitting infrared light. Furthermore, the pixel electrode 191 preferably has a function of reflecting infrared light.

The light-emitting device included in the display unit of this embodiment preferably employs a microcavity structure.

The buffer layer 192 or the buffer layer 194 may function as an optical adjustment layer. By changing the thickness of the buffer layer 192 or the buffer layer 194, light of a particular color can be intensified and taken out from each light-emitting device.

The light-emitting device 190 has a function of emitting visible light. Specifically, the light-emitting device 190 is an electroluminescent device that emits light toward the substrate 152 (see the emitted light 21) when voltage is applied between the pixel electrode 191 and the common electrode 115.

The pixel electrode 191 included in the light-receiving device 110 is electrically connected to a source or a drain of the transistor 41 through an opening provided in the insulating layer 214.

The pixel electrode 191 included in the light-emitting device 190 is electrically connected to a source or a drain of the transistor 42 through an opening provided in the insulating layer 214.

The transistor 41 and the transistor 42 are on and in contact with the same layer (the substrate 151 in FIG. 13A).

At least part of a circuit electrically connected to the light-receiving device 110 is preferably formed using the same material in the same steps as a circuit electrically connected to the light-emitting device 190. Thus, the thickness of the display unit can be reduced and the manufacturing process can be simplified, compared to the case where the two circuits are separately formed.

The light-receiving device 110 and the light-emitting device 190 are preferably covered with a protective layer 116. In FIG. 13A, the protective layer 116 is provided on and in contact with the common electrode 115. Providing the protective layer 116 can inhibit entry of impurities such as water into the light-receiving device 110 and the light-emitting device 190, thereby increasing the reliability of the light-receiving device 110 and the light-emitting device 190. The protective layer 116 and the substrate 152 are attached to each other with an adhesive layer 142.

A light-blocking layer 158 is provided on a surface of the substrate 152 on the substrate 151 side. The light-blocking layer 158 has an opening in a position overlapping with the light-emitting device 190 and an opening in a position overlapping with the light-receiving device 110.

Here, the light-receiving device 110 senses light that is emitted by the light-emitting device 190 and then reflected by an object. However, in some cases, light emitted from the light-emitting device 190 is reflected inside the display unit 20A and enters the light-receiving device 110 without via an object. The light-blocking layer 158 can reduce the influence of such stray light. For example, in the case where the light-blocking layer 158 is not provided, light 23 emitted by the light-emitting device 190 is reflected by the substrate 152 and reflected light 24 enters the light-receiving device 110 in some cases. Providing the light-blocking layer 158 can inhibit entry of the reflected light 24 into the light-receiving device 110. Thus, noise can be reduced, and the sensitivity of the sensor using the light-receiving device 110 can be increased.

For the light-blocking layer 158, a material that blocks light from the light-emitting device can be used. The light-blocking layer 158 preferably absorbs visible light. As the light-blocking layer 158, a black matrix can be formed using a metal material or a resin material containing pigment (e.g., carbon black) or dye, for example. The light-blocking layer 158 may have a stacked-layer structure of a red color filter, a green color filter, and a blue color filter.

[Display Unit 20B]

Figure 13B:
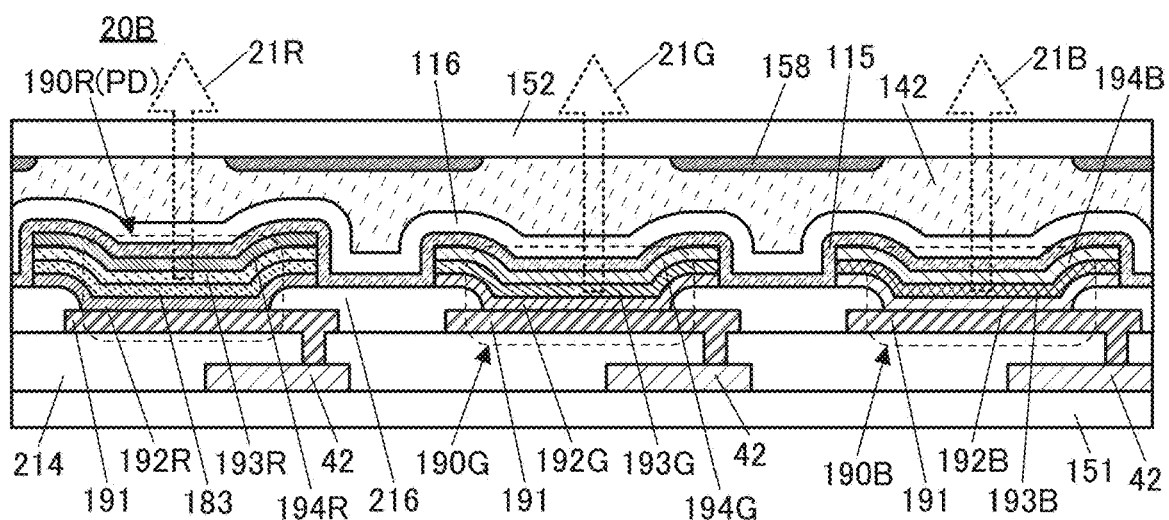
Figure 13C:
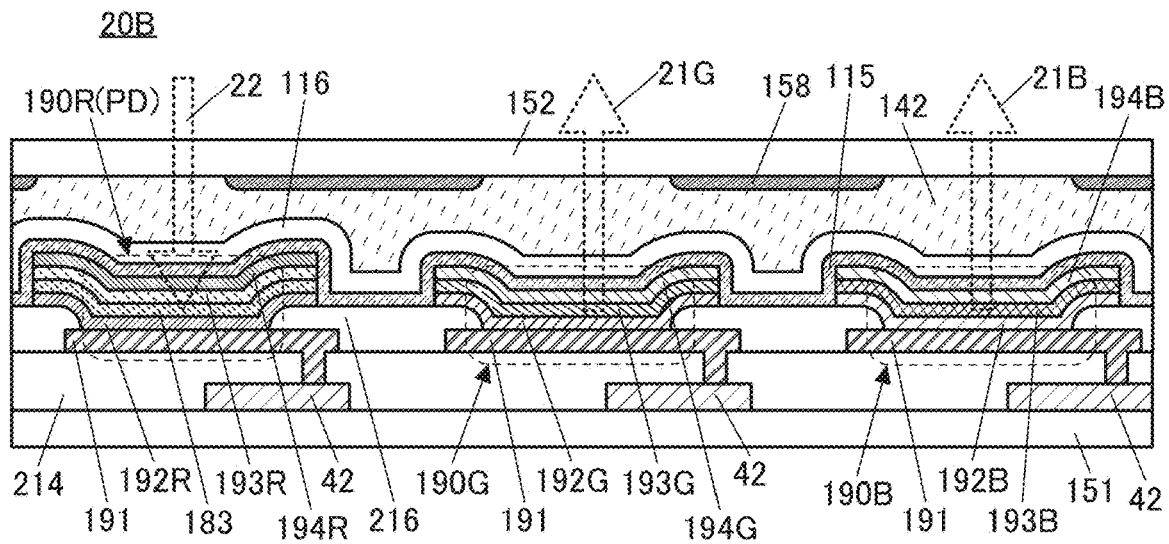

FIGS. 13B and 13C are cross-sectional views of a display unit 20B. Note that in the following description of display units, the description of components similar to those of the above-described display unit may be omitted.

The display unit 20B includes a light-emitting device 190B, a light-emitting device 190G, and a light-emitting and light-receiving device 190R(PD).

The light-emitting device 190B includes the pixel electrode 191, a buffer layer 192B, a light-emitting layer 193B, a buffer layer 194B, and the common electrode 115 which are stacked in this order. The light-emitting device 190B has a function of emitting blue light 21B.

The light-emitting device 190G includes the pixel electrode 191, a buffer layer 192G, a light-emitting layer 193G, a buffer layer 194G, and the common electrode 115 which are stacked in this order. The light-emitting device 190G has a function of emitting green light 21G.

The light-emitting and light-receiving device 190R(PD) includes the pixel electrode 191, a buffer layer 192R, the active layer 183, a light-emitting layer 193R, a buffer layer 194R, and the common electrode 115 which are stacked in this order. The light-emitting and light-receiving device 190R(PD) has a function of emitting red light 21R and a function of sensing the light 22.

FIG. 13B illustrates a case where the light-emitting and light-receiving device 190R(PD) functions as a light-emitting device. FIG. 13B illustrates an example in which the light-emitting device 190B emits blue light, the light-emitting device 190G emits green light, and the light-emitting and light-receiving device 190R(PD) emits red light.

FIG. 13C illustrates a case where the light-emitting and light-receiving device 190R(PD) functions as a light-receiving device. FIG. 13C illustrates an example in which blue light emitted by the light-emitting device 190B and green light emitted by the light-emitting device 190G are sensed by the light-emitting and light-receiving device 190R(PD).

The display unit 20B includes the light-emitting and light-receiving device 190R(PD), the light-emitting device 190G, the light-emitting device 190B, the transistor 42, and the like between the pair of substrates (the substrate 151 and the substrate 152).

The pixel electrodes 191 are positioned over the insulating layer 214. Two pixel electrodes 191 adjacent to each other are electrically isolated from each other by the partition 216. The pixel electrode 191 is electrically connected to a source or a drain of the transistor 42 through an opening provided in the insulating layer 214.

The light-emitting and light-receiving device and the light-emitting devices are preferably covered with the protective layer 116. The protective layer 116 and the substrate 152 are attached to each other with the adhesive layer 142. The light-blocking layer 158 is provided on a surface of the substrate 152 on the substrate 151 side.

[Display Unit 20C]

Figure 14A:
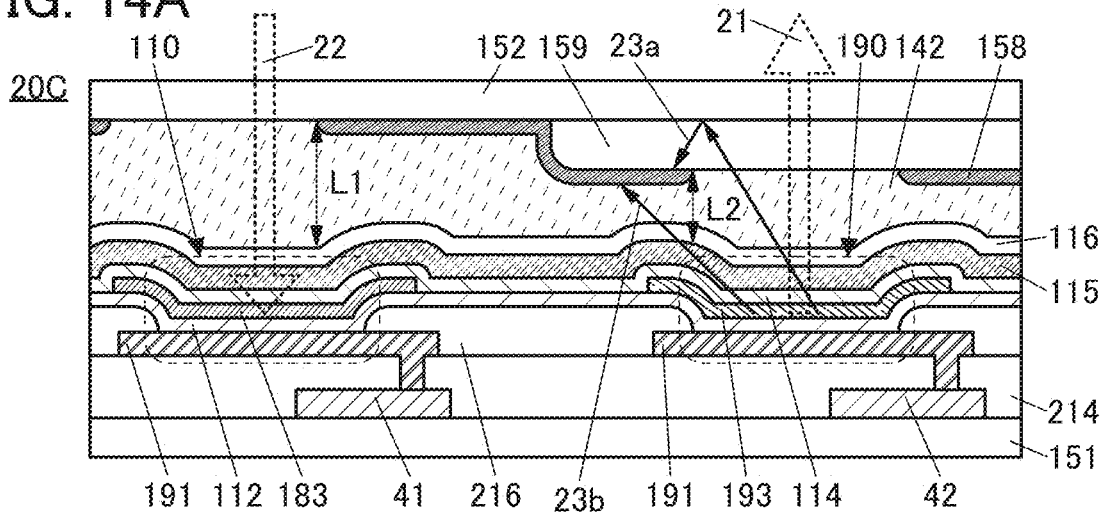
FIG. 14A is a cross-sectional view illustrating an example of a display unit.

FIG. 14A is a cross-sectional view of a display unit 20C.

The display unit 20C includes the light-receiving device 110 and the light-emitting device 190.

The light-emitting device 190 includes the pixel electrode 191, a common layer 112, the light-emitting layer 193, a common layer 114, and the common electrode 115 in this order. The common layer 112 can include one or both of a hole-injection layer and a hole-transport layer. The light-emitting layer 193 contains an organic compound. The common layer 114 can include one or both of an electron-injection layer and an electron-transport layer. The light-emitting device 190 has a function of emitting visible light.

Note that the display unit 20C may also include a light-emitting device having a function of emitting infrared light.

The light-receiving device 110 includes the pixel electrode 191, the common layer 112, the active layer 183, the common layer 114, and the common electrode 115 which are stacked in this order. The active layer 183 contains an organic compound. The light-receiving device 110 has a function of sensing visible light. Note that the light-receiving device 110 may also have a function of sensing infrared light.

The pixel electrode 191, the common layer 112, the active layer 183, the light-emitting layer 193, the common layer 114, and the common electrode 115 may each have a single-layer structure or a stacked-layer structure.

The pixel electrodes 191 are positioned over the insulating layer 214. Two pixel electrodes 191 adjacent to each other are electrically isolated from each other by the partition 216. The pixel electrode 191 is electrically connected to the source or the drain of the transistor 42 through the opening provided in the insulating layer 214.

The common layer 112, the common layer 114, and the common electrode 115 are layers used in common in both the light-receiving device 110 and the light-emitting device 190. At least part of the layers constituting the light-receiving device 110 and the light-emitting device 190 is preferably shared, so that the number of steps for manufacturing the display unit can be reduced.

The display unit 20C includes the light-receiving device 110, the light-emitting device 190, the transistor 41, the transistor 42, and the like between the pair of substrates (the substrate 151 and the substrate 152).

The light-receiving device 110 and the light-emitting device 190 are preferably covered with the protective layer 116. The protective layer 116 and the substrate 152 are attached to each other with the adhesive layer 142.

The resin layer 159 is provided on a surface of the substrate 152 on the substrate 151 side. The resin layer 159 is provided in a position overlapping with the light-emitting device 190 and is not provided in a position overlapping with the light-receiving device 110.

Figure 14B:
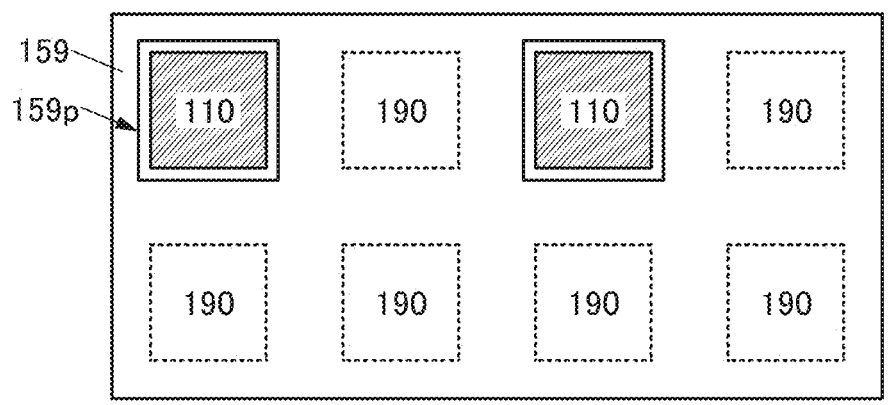
FIGS. 14B and 14C are views each illustrating an example of a top-view layout of a resin layer.
Figure 14C:
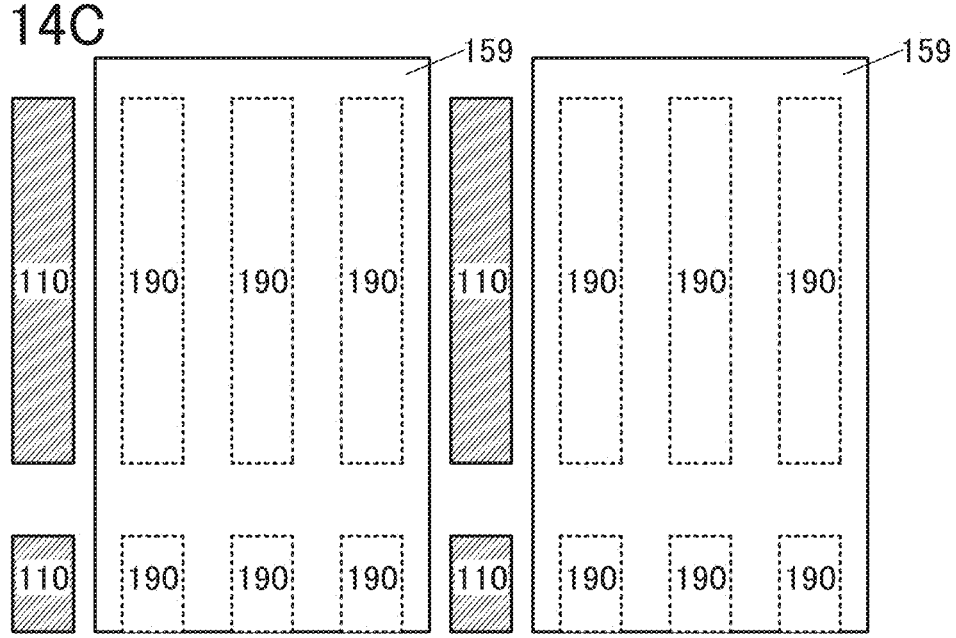

The resin layer 159 can be provided in a position overlapping with the light-emitting device 190 and have an opening 159p in a position overlapping with the light-receiving device 110, as illustrated in FIG. 14B, for example. As another example, as illustrated in FIG. 14C, an island-shaped resin layer 159 can be provided in a position overlapping with the light-emitting device 190 but not in a position overlapping with the light-receiving device 110.

The light-blocking layer 158 is provided on surfaces of the substrate 152 and the resin layer 159 on the substrate 151 side. The light-blocking layer 158 has an opening in a position overlapping with the light-emitting device 190 and an opening in a position overlapping with the light-receiving device 110.

Here, the light-receiving device 110 senses light that is emitted by the light-emitting device 190 and then reflected by an object. However, in some cases, light emitted by the light-emitting device 190 is reflected inside the display unit 20C and enters the light-receiving device 110 without via an object. The light-blocking layer 158 can absorb such stray light and thereby reduce entry of stray light into the light-receiving device 110. For example, the light-blocking layer 158 can absorb stray light 23a that has passed through the resin layer 159 and has been reflected by the surface of the substrate 152 on the substrate 151 side. Moreover, the light-blocking layer 158 can absorb stray light 23b before the stray light 23b reaches the resin layer 159. Thus, stray light incident on the light-receiving device 110 can be reduced. Consequently, noise can be reduced, and the sensitivity of the sensor using the light-receiving device 110 can be increased. It is particularly preferable that the light-blocking layer 158 be positioned close to the light-emitting device 190, in which case stray light can be further reduced. This is preferable also in terms of display quality, because the light-blocking layer 158 provided close to the light-emitting device 190 can reduce viewing angle dependence of display.

With the light-blocking layer 158, the light sensing range of the light-receiving device 110 can be controlled. When the light-blocking layer 158 is positioned apart from the light-receiving device 110, the image-capturing range is narrowed, and the image-capturing resolution can be increased.

In the case where the resin layer 159 has an opening, the light-blocking layer 158 preferably covers at least part of the opening and at least part of a side surface of the resin layer 159 exposed in the opening.

In the case where the resin layer 159 is provided in an island shape, the light-blocking layer 158 preferably covers at least part of a side surface of the resin layer 159.

Since the light-blocking layer 158 is provided along the shape of the resin layer 159 in such a manner, the distance from the light-blocking layer 158 to the light-emitting device 190 (specifically, the light-emitting region of the light-emitting device 190) is shorter than the distance from the light-blocking layer 158 to the light-receiving device 110 (specifically, the light-receiving region of the light-receiving device 110). Accordingly, noise of the sensor can be reduced, the imaging resolution can be increased, and viewing angle dependence of display can be reduced. Thus, both the display quality and imaging quality of the display unit can be increased.

The resin layer 159 transmits light emitted from the light-emitting device 190. Examples of materials for the resin layer 159 include an acrylic resin, a polyimide resin, an epoxy resin, a polyamide resin, a polyimide-amide resin, a siloxane resin, a benzocyclobutene-based resin, a phenol resin, and precursors of these resins. Note that a component provided between the substrate 152 and the light-blocking layer 158 is not limited to the resin layer and may be an inorganic insulating film or the like. As the component becomes thicker, a larger difference occurs between the distance from the light-blocking layer to the light-receiving device and the distance from the light-blocking layer to the light-emitting device. An organic insulating film made of a resin or the like is suitable for the component because it is easily formed to have a large thickness.

In order to compare the distance from the light-blocking layer 158 to the light-receiving device 110 and the distance from the light-blocking layer 158 to the light-emitting device 190, it is possible to use, for example, the shortest distance L1 from an end portion of the light-blocking layer 158 on the light-receiving device 110 side to the common electrode 115 and the shortest distance L2 from an end portion of the light-blocking layer 158 on the light-emitting device 190 side to the common electrode 115. With the shortest distance L2 smaller than the shortest distance L1, generation of stray light from the light-emitting device 190 can be suppressed, and the sensitivity of the sensor using the light-receiving device 110 can be increased. Furthermore, viewing angle dependence of display can be reduced. With the shortest distance L1 larger than the shortest distance L2, the imaging range of the light-receiving device 110 can be narrowed, and the imaging resolution can be increased.

In addition, when the adhesive layer 142 is provided such that a portion overlapping with the light-receiving device 110 is made thicker than a portion overlapping with the light-emitting device 190, a difference can be made between the distance from the light-blocking layer 158 to the light-receiving device 110 and the distance from the light-blocking layer 158 to the light-emitting device 190.

[Display Unit 20D]

Figure 15A:
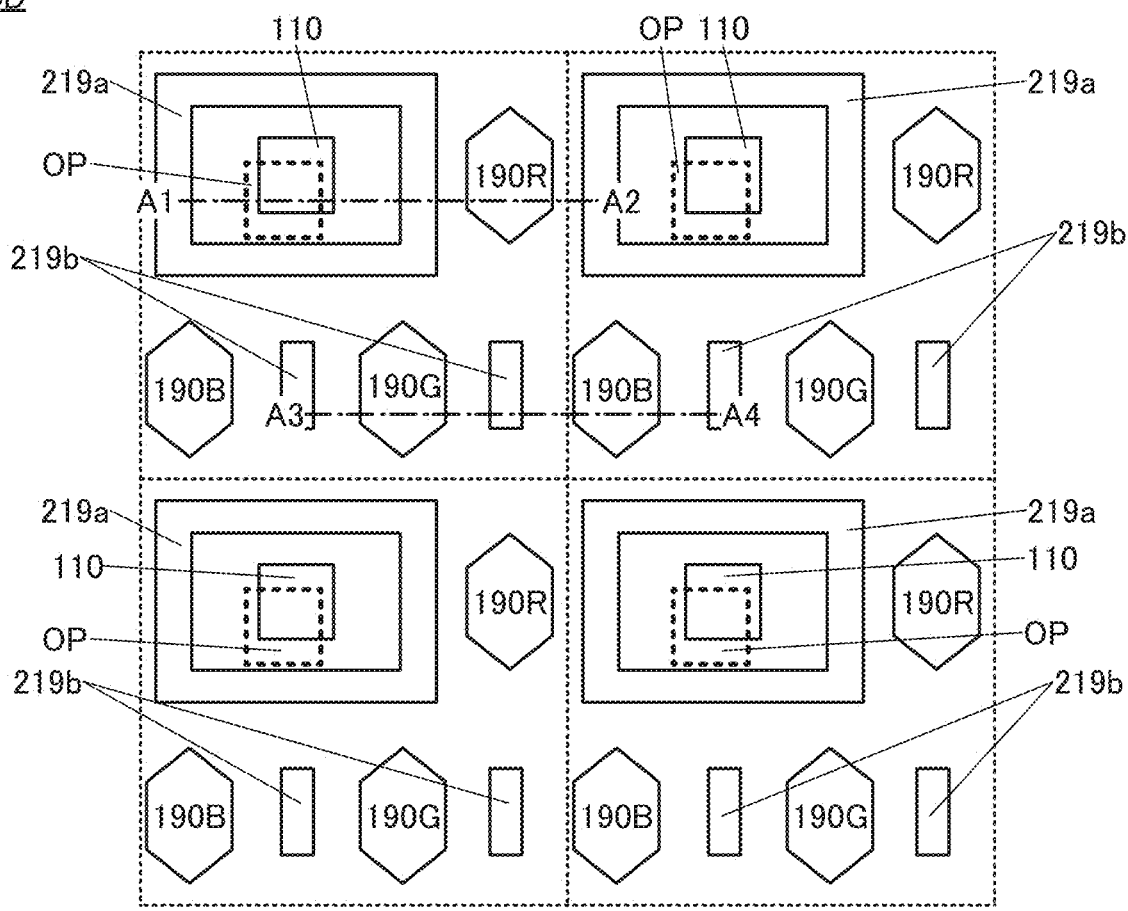
FIG. 15A is a top view illustrating an example of a display unit.
Figure 15B:
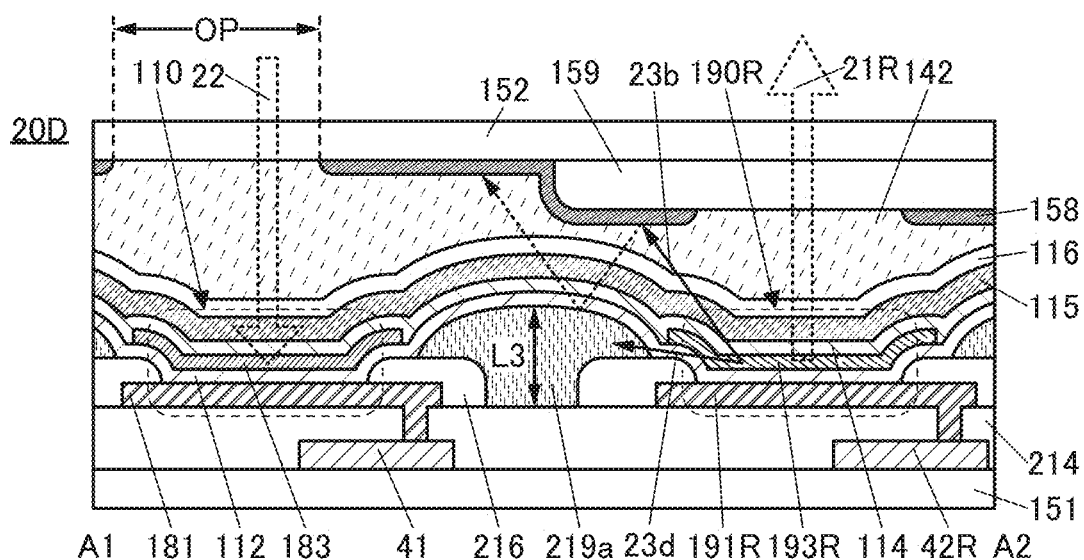
FIG. 15B is a cross-sectional view illustrating an example of a display unit.
Figure 16A:
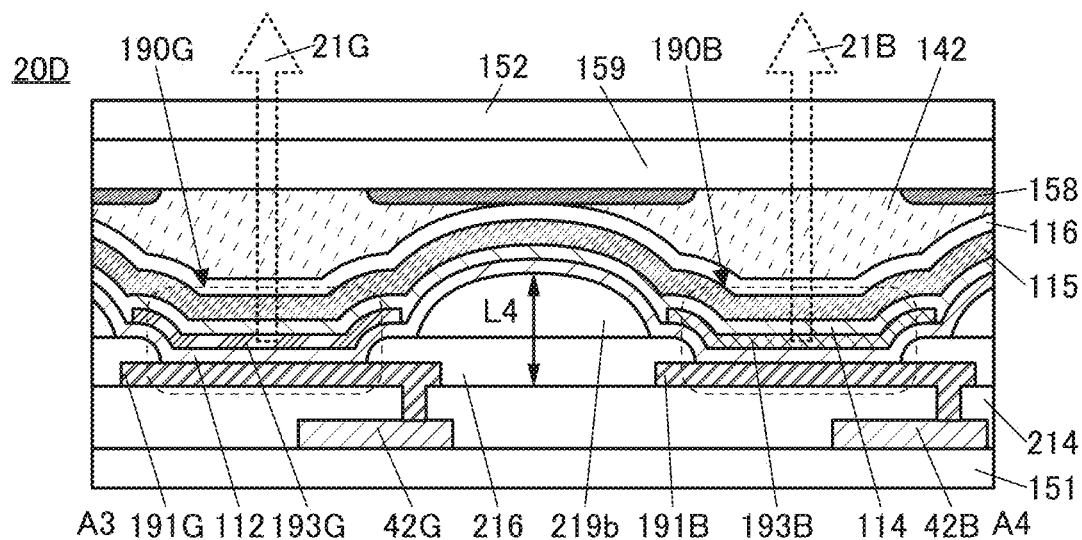
FIGS. 16A and 16B are cross-sectional views each illustrating an example of a display unit.

FIG. 15A is a top view of a display unit 20D. FIG. 15B is a cross-sectional view along the dashed-dotted line A1-A2 in FIG. 15A. FIG. 16A is a cross-sectional view along the dashed-dotted line A3-A4 in FIG. 15A.

In FIG. 15A, a portion surrounded by a thin dotted frame corresponds to one pixel. One pixel includes the light-receiving device 110, a red light-emitting device 190R, a green light-emitting device 190G, and a blue light-emitting device 190B.

There is no particular limitation on the top surface shapes of the light-receiving device 110 and the light-emitting devices 190R, 190G, and 190B. In the pixel layout illustrated in FIG. 15A, a hexagonal close-packed arrangement is employed. The hexagonal close-packed arrangement is preferable because the aperture ratio of the light-receiving device 110 and the light-emitting devices 190R, 190G, and 190 can be increased. In the top view, the light-receiving region of the light-receiving device 110 is quadrilateral, and the light-emitting region of each of the light-emitting devices 190R, 190G, and 190B is hexagonal.

In the top view, the light-receiving device 110 is provided on the inner side of a frame-shaped light-blocking layer 219a. The four sides of the light-receiving device 110 are completely surrounded by the light-blocking layer 219a, thereby inhibiting entry of stray light into the light-receiving device 110. Note that the frame-shaped light-blocking layer 219a may have a gap (also referred to as a space, a disconnected portion, or a missing portion).

In the top view, a spacer 219b is provided between the green light-emitting device 190G and the blue light-emitting device 190B.

As illustrated in FIG. 15B and FIG. 16A, the display unit 20D includes the light-receiving device 110, the red light-emitting device 190R, the green light-emitting device 190G, and the blue light-emitting device 190B.

The light-emitting device 190R includes a pixel electrode 191R, the common layer 112, a light-emitting layer 193R, the common layer 114, and the common electrode 115 which are stacked in this order. The light-emitting layer 193R contains an organic compound that emits the red light 21R. The light-emitting device 190R has a function of emitting red light.

The light-emitting device 190G includes a pixel electrode 191G, the common layer 112, a light-emitting layer 193G, the common layer 114, and the common electrode 115 which are stacked in this order. The light-emitting layer 193G contains an organic compound that emits green light 21G. The light-emitting device 190G has a function of emitting green light.

The light-emitting device 190B includes a pixel electrode 191B, the common layer 112, a light-emitting layer 193B, the common layer 114, and the common electrode 115 which are stacked in this order. The light-emitting layer 193B contains an organic compound that emits the blue light 21B. The light-emitting device 190B has a function of emitting blue light.

The light-receiving device 110 includes the pixel electrode 181, the common layer 112, the active layer 183, the common layer 114, and the common electrode 115 which are stacked in this order. The active layer 183 contains an organic compound. The light-receiving device 110 has a function of sensing visible light.

In the display unit 20D, the light-receiving device 110, the light-emitting device 190R, the light-emitting device 190G, the light-emitting device 190B, the transistor 41, a transistor 42R, a transistor 42G, a transistor 42B, and the like are provided between the pair of substrates (the substrate 151 and the substrate 152).

End portions of the pixel electrodes 181, 191R, 191G, and 191B are covered with the partition 216.

The pixel electrode 181 is electrically connected to the source or the drain of the transistor 41 through an opening provided in the insulating layer 214. The pixel electrode 191R is electrically connected to a source or a drain of the transistor 42R through an opening provided in the insulating layer 214. Similarly, the pixel electrode 191G is electrically connected to a source or a drain of the transistor 42G through an opening provided in the insulating layer 214. The pixel electrode 191B is electrically connected to a source or a drain of the transistor 42B through an opening provided in the insulating layer 214.

The light-receiving device 110 and the light-emitting devices 190R, 190G, and 190B are covered with the protective layer 116.

The resin layer 159 is provided on a surface of the substrate 152 on the substrate 151 side. The resin layer 159 is provided in positions overlapping with the light-emitting devices 190R, 190G, and 190B and is not provided in a position overlapping with the light-receiving device 110.

The light-blocking layer 158 is provided on the surfaces of the substrate 152 and the resin layer 159 on the substrate 151 side. The light-blocking layer 158 has openings in positions overlapping with the light-emitting devices 190R, 190G, and 190B and in a position overlapping with the light-receiving device 110.

In the top view, a frame-shaped opening is provided in the partition 216. In FIG. 15B, the partition 216 has an opening between the light-receiving device 110 and the light-emitting device 190R. The light-blocking layer 219a is provided to cover the opening. The light-blocking layer 219a preferably covers the opening of the partition 216 and a side surface of the partition 216 exposed at the opening. Furthermore, the light-blocking layer 219a preferably covers at least part of a top surface of the partition 216.

Although the light-blocking layer 219a can be provided over the partition 216 that does not have an opening, there is a possibility that stray light passes through the partition 216 and enters the light-receiving device 110. When the partition 216 has an opening and the light-blocking layer 219a is provided to fill the opening, stray light that passes through the partition 216 is absorbed by the light-blocking layer 219a in the opening of the partition 216. This can inhibit entry of stray light into to the light-receiving device 110.

The light-blocking layer 219a preferably has a forward tapered shape. This can improve the coverage of the light-blocking layer 219a with the films provided thereover (e.g., the common layer 112, the common layer 114, the common electrode 115, and the protective layer 116).

The light-blocking layer 219a preferably absorbs at least a wavelength of light that is sensed by the light-receiving device 110. For example, in the case where the light-receiving device 110 senses blue light emitted by the light-emitting device 190G, the light-blocking layer 219a preferably absorbs at least blue light. For example, when the light-blocking layer 219a includes a red color filter, the light-blocking layer 219a can absorb blue light and thus reflected light can be prevented from entering the light-receiving device 110. The light-blocking layer 219a may be a black matrix formed using a resin material containing a pigment or dye, for example. The light-blocking layer 219a may have a stacked-layer structure of a red color filter, a green color filter, and a blue color filter. Alternatively, as the light-blocking layer 219a, a colored insulating layer may be formed using a brown resist material.

For example, when the light-receiving device 110 senses blue light emitted by the light-emitting device 190G, in some cases, light emitted by the light-emitting device 190B is reflected by the substrate 152 and the partition 216, and the reflected light enters the light-receiving device 110. In other cases, light emitted by the light-emitting device 190B passes through the partition 216 and is reflected by the transistor, the wiring, or the like, and thus the reflected light enters the light-receiving device 110. In the display unit 20D, such reflected light can be prevented from entering the light-receiving device 110 because light is absorbed by the light-blocking layer 158 and the light-blocking layer 219a. Hence, noise can be reduced, and the sensitivity of the sensor using the light-receiving device 110 can be increased.

For example, the light-blocking layer 158 can absorb most of the stray light 23b before the stray light 23b reaches the resin layer 159. Furthermore, even when part of the stray light 23b is reflected by the light-blocking layer 158, the light-blocking layer 219a absorbs the stray light 23b, thereby inhibiting entry of the stray light 23b into the transistor, the wiring, or the like. Thus, stray light can be prevented from reaching the light-receiving device 110. With a larger number of times the stray light 23b strikes the light-blocking layer 158 and the light-blocking layer 219a, the amount of absorbed light can be increased and the amount of stray light reaching the light-receiving device 110 can be extremely small. The resin layer 159 is preferably thick, in which case the number of times the stray light 23b strikes the light-blocking layer 158 and the light-blocking layer 219a can be increased. The thick resin layer 159 is also preferable in terms of display quality, because a shorter distance from the light-blocking layer 158 to the light-emitting device of each color can reduce viewing angle dependence of display.

Since the light-blocking layer 219a absorbs light, the stray light 23d that enters the light-blocking layer 219a directly from the light-emitting device can be absorbed by the light-blocking layer 219a. This also demonstrates that providing the light-blocking layer 219a can reduce the amount of stray light incident on the light-receiving device 110.

Providing the light-blocking layer 158 can control the light sensing range of the light-receiving device 110. When the distance from the light-blocking layer 158 to the light-receiving device 110 is long, the image-capturing range is narrowed, and the image-capturing resolution can be increased.

The spacer 219b is positioned over the partition 216, and is positioned between the light-emitting device 190G and the light-emitting device 190B in the top view. A top surface of the spacer 219b is preferably closer to the light-blocking layer 158 than a top surface of the light-blocking layer 219a is. When a thickness L3 of the light-blocking layer 219a is greater than or equal to a total thickness L4 of the partition 216 and the spacer 219b, the inside of the frame-shaped light-blocking layer 219a is not sufficiently filled with the adhesive layer 142 in some cases, which might reduce the reliability of the light-receiving device 110 or even the reliability of the display unit 20D. Therefore, the total thickness L4 of the partition 216 and the spacer 219b is preferably larger than the thickness L3 of the light-blocking layer 219a. Thus, filling with the adhesive layer 142 can be facilitated. As illustrated in FIG. 16A, the light-blocking layer 158 may be in contact with the protective layer 116 (or the common electrode 115) in a portion where the spacer 219b and the light-blocking layer 158 overlap with each other.

[Display Unit 20E]

Figure 16B:
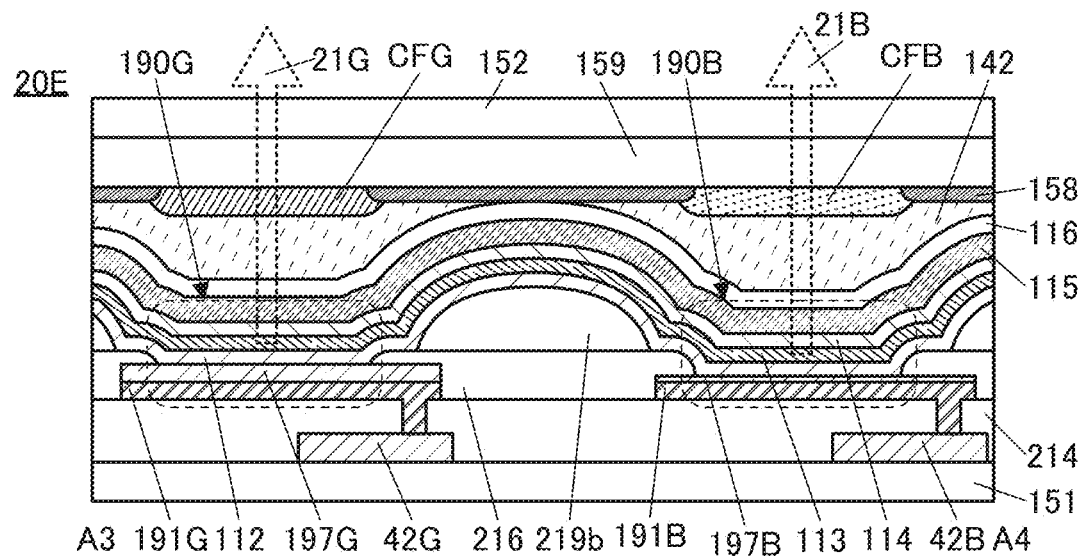

FIG. 16B is a cross-sectional view of a display unit 20E.

In the display unit 20E, the light-emitting devices 190R, 190G, and 190B include the same light-emitting layer. FIG. 16B corresponds to a cross-sectional view along the dashed-dotted line A3-A4 in FIG. 15A.

The light-emitting device 190G in FIG. 16B includes the pixel electrode 191G, an optical adjustment layer 197G, the common layer 112, a light-emitting layer 113, the common layer 114, and the common electrode 115. The light-emitting device 190B in FIG. 16B includes the pixel electrode 191B, an optical adjustment layer 197B, the common layer 112, the light-emitting layer 113, the common layer 114, and the common electrode 115. The common layer 112, the light-emitting layer 113, and the common layer 114 are common components between the light-emitting devices 190R, 190G, and 190B. The light-emitting layer 113 includes, for example, the light-emitting layer 193R that emits red light, the light-emitting layer 193G that emits green light, and the light-emitting layer 193B that emits blue light.

Although the common layer 112, the light-emitting layer 113, and the common layer 114 are shown as the EL layer in FIG. 16B, this embodiment is not limited thereto. The light-emitting device may have a single structure in which one light-emitting unit is provided between the pixel electrode 191 and the common electrode 115, or a tandem structure in which a plurality of light-emitting units are provided between the electrodes.

The light-emitting layer 113 is shared by the light-emitting devices that emit light of different colors. Light emitted by the light-emitting device 190G is extracted as the green light 21G through the coloring layer CFG. Light emitted by the light-emitting device 190B is extracted as the blue light 21B through the coloring layer CFB.

The light-emitting device 190G and the light-emitting device 190B have the same structure except that they include optical adjustment layers with different thicknesses. A reflective electrode is used as the pixel electrode 191G and the pixel electrode 191B. As the optical adjustment layer, a transparent electrode over the reflective electrode can be used. The thickness of the optical adjustment layer 197 preferably varies between the light-emitting devices of different colors. The light-emitting device 190G illustrated in FIG. 16B has been optically adjusted using the optical adjustment layer 197G so that the optical path length between the pixel electrode 191G and the common electrode 115 intensifies green light. Similarly, the light-emitting device 190B has been optically adjusted using the optical adjustment layer 197B so that the optical path length between the pixel electrode 191B and the common electrode 115 intensifies blue light.

A more detailed structure of the display unit of one embodiment of the present invention will be described below with reference to FIG. 17, FIG. 18, FIGS. 19A and 19B, FIG. 20, and FIGS. 21A and 21B.

[Display Unit 100A]

Figure 17:
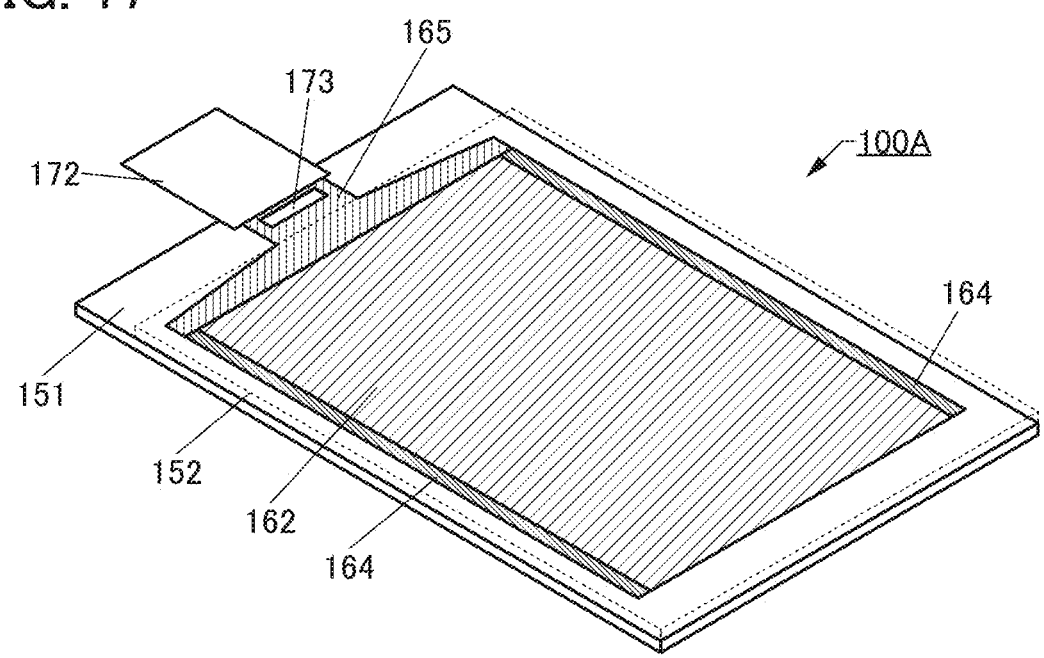
FIG. 17 is a perspective view illustrating an example of a display unit.
Figure 18:
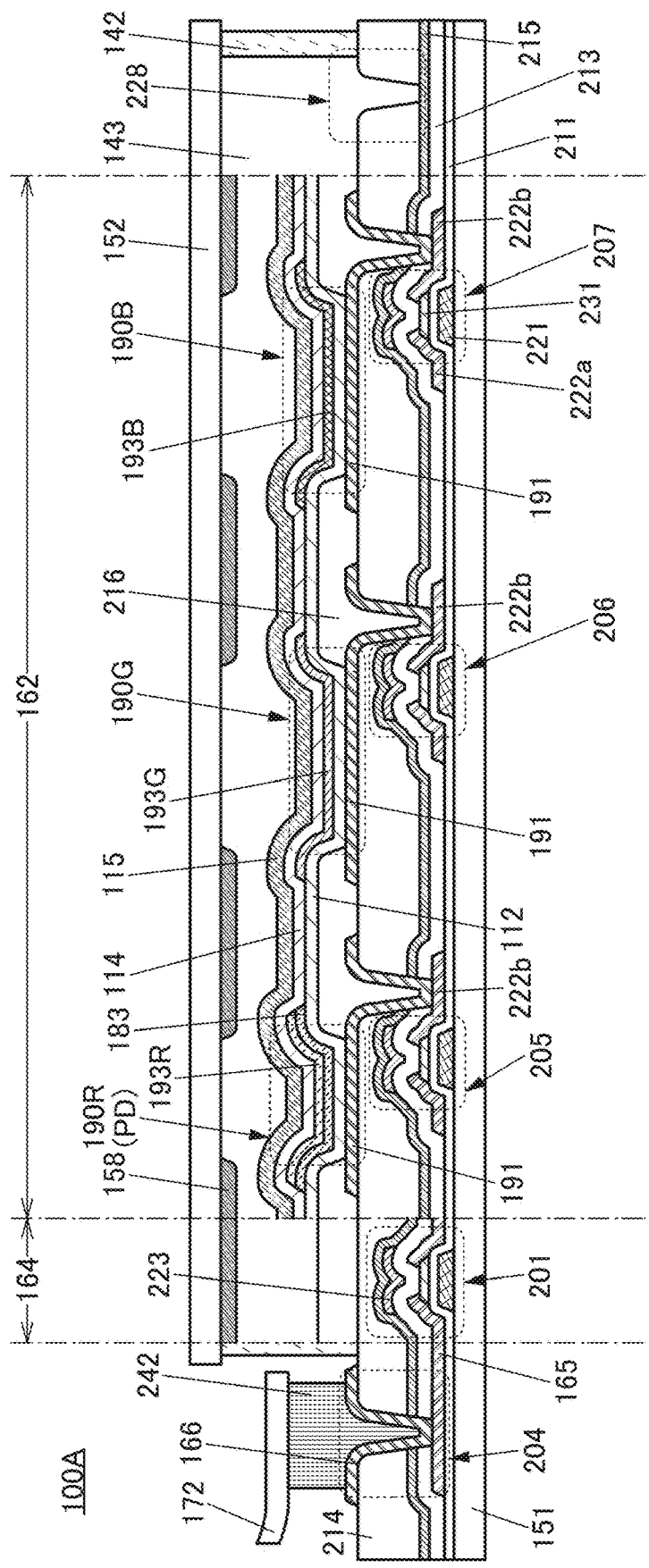
FIG. 18 is a cross-sectional view illustrating an example of a display unit.

FIG. 17 is a perspective view of a display unit 100A, and FIG. 18 is a cross-sectional view of the display unit 100A.

In the display unit 100A, the substrate 152 and the substrate 151 are attached to each other. In FIG. 17, the substrate 152 is denoted by a dashed line.

The display unit 100A includes a display portion 162, a circuit 164, a wiring 165, and the like. FIG. 17 illustrates an example in which an integrated circuit (IC) 173 and an FPC 172 are mounted on the display unit 100A. Thus, the structure illustrated in FIG. 17 can be regarded as a display module including the display unit 100A, the IC, and the FPC.

As the circuit 164, a scan line driver circuit can be used, for example.

The wiring 165 has a function of supplying a signal and power to the display portion 162 and the circuit 164. The signal and power are input to the wiring 165 from the outside through the FPC 172 or from the IC 173.

FIG. 17 illustrates an example in which the IC 173 is provided over the substrate 151 by a chip on glass (COG) method, a chip on film (COF) method, or the like. An IC including a scan line driver circuit, a signal line driver circuit, or the like can be used as the IC 173, for example. Note that the display unit 100A and the display module are not necessarily provided with an IC. The IC may be mounted on the FPC by a COF method or the like.

FIG. 18 illustrates an example of cross sections of part of a region including the FPC 172, part of a region including the circuit 164, part of a region including the display portion 162, and part of a region including an end portion of the display unit 100A illustrated in FIG. 17.

The display unit 100A in FIG. 18 includes a transistor 201, a transistor 205, a transistor 206, a transistor 207, the light-emitting device 190B, the light-emitting device 190G, the light-emitting and light-receiving device 190R(PD), and the like between the substrate 151 and the substrate 152.

The substrate 152 and the insulating layer 214 adhere to each other with the adhesive layer 142. A solid sealing structure, a hollow sealing structure, or the like can be employed to seal the light-emitting device 190B, the light-emitting device 190G, and the light-emitting and light-receiving device 190R(PD). In FIG. 18, a hollow sealing structure is employed in which the space 143 surrounded by the substrate 152, the adhesive layer 142, and the insulating layer 214 is filled with an inert gas (e.g., nitrogen or argon). The adhesive layer 142 may be provided to overlap with the light-emitting device 190B, the light-emitting device 190G, and the light-emitting and light-receiving device 190R(PD). The space 143 surrounded by the substrate 152, the adhesive layer 142, and the insulating layer 214 may be filled with a resin different from that of the adhesive layer 142.

The light-emitting device 190B has a stacked-layer structure in which the pixel electrode 191, the common layer 112, the light-emitting layer 193, the common layer 114, and the common electrode 115 are stacked in this order from the insulating layer 214 side. The pixel electrode 191 is connected to a conductive layer 222b included in the transistor 207 through an opening provided in the insulating layer 214. The transistor 207 has a function of controlling the driving of the light-emitting device 190B. An end portion of the pixel electrode 191 is covered with the partition 216. The pixel electrode 191 contains a material that reflects visible light, and the common electrode 115 contains a material that transmits visible light.

The light-emitting device 190G has a stacked-layer structure in which the pixel electrode 191, the common layer 112, the light-emitting layer 193G, the common layer 114, and the common electrode 115 are stacked in this order from the insulating layer 214 side. The pixel electrode 191 is connected to the conductive layer 222b included in the transistor 206 through an opening provided in the insulating layer 214. The transistor 206 has a function of controlling the driving of the light-emitting device 190G.

The light-emitting and light-receiving device 190R(PD) has a stacked-layer structure in which the pixel electrode 191, the common layer 112, the active layer 183, the light-emitting layer 193R, the common layer 114, and the common electrode 115 are stacked in this order from the insulating layer 214 side. The pixel electrode 191 is electrically connected to the conductive layer 222b included in the transistor 205 through an opening provided in the insulating layer 214. The transistor 205 has a function of controlling the driving of the light-emitting and light-receiving device 190R(PD).

Light emitted by the light-emitting device 190B, the light-emitting device 190G, and the light-emitting and light-receiving device 190R(PD) is emitted toward the substrate 152. Light enters the light-emitting and light-receiving device 190R(PD) through the substrate 152 and the space 143. For the substrate 152, a material having a high visible-light-transmitting property is preferably used.

The pixel electrodes 191 included in the light-emitting device 190B, the light-emitting device 190G, and the light-emitting and light-receiving device 190R(PD) can be formed using the same material through the same process. The common layer 112, the common layer 114, and the common electrode 115 are used in common in the light-emitting device 190B, the light-emitting device 190G, and the light-emitting and light-receiving device 190R(PD). The light-emitting and light-receiving device 190R(PD) has the structure of the red-light-emitting device to which the active layer 183 is added. The light-emitting device 190B, the light-emitting device 190G, and the light-emitting and light-receiving device 190R(PD) can have common components except the active layer 183 and the light-emitting layer 193. Thus, a light-receiving function can be added to the display portion 162 of the display unit 100A without a significant increase in the number of manufacturing steps.

The light-blocking layer 158 is provided on a surface of the substrate 152 on the substrate 151 side. The light-blocking layer 158 includes openings in a position overlapping with the light-emitting device 190B, a position overlapping with the light-emitting device 190G, and a position overlapping with the light-emitting and light-receiving device 190R(PD). With the light-blocking layer 158, the light sensing range of the light-emitting and light-receiving device 190R(PD) can be controlled. As described above, it is preferable to control light incident on the light-emitting and light-receiving device by adjusting the position of the opening which is of the light-blocking layer and provided in a position overlapping with the light-emitting and light-receiving device 190R(PD). Moreover, the light-blocking layer 158 can inhibit direct entry of light into the light-emitting and light-receiving device 190R(PD) from the light-emitting device 190 without via an object. Hence, a sensor with little noise and high sensitivity can be obtained.

The transistor 201, the transistor 205, the transistor 206, and the transistor 207 are formed over the substrate 151. These transistors can be fabricated using the same material in the same step.

An insulating layer 211, an insulating layer 213, an insulating layer 215, and the insulating layer 214 are provided in this order over the substrate 151. Part of the insulating layer 211 functions as a gate insulating layer of each transistor. Part of the insulating layer 213 functions as a gate insulating layer of each transistor. The insulating layer 215 is provided to cover the transistors. The insulating layer 214 is provided to cover the transistors and has a function of a planarization layer. Note that the number of gate insulating layers and the number of insulating layers covering the transistors are not limited and may each be one or two or more.

A material through which impurities such as water and hydrogen do not easily diffuse is preferably used for at least one of the insulating layers covering the transistors, in which case the insulating layer can function as a barrier layer. Such a structure can effectively inhibit diffusion of impurities into the transistors from the outside and increase the reliability of the display unit.

An inorganic insulating film is preferably used as each of the insulating layers 211, 213, and 215. As the inorganic insulating film, a silicon nitride film, a silicon oxynitride film, a silicon oxide film, a silicon nitride oxide film, an aluminum oxide film, or an aluminum nitride film can be used, for example. A hafnium oxide film, a hafnium oxynitride film, a hafnium nitride oxide film, an yttrium oxide film, a zirconium oxide film, a gallium oxide film, a tantalum oxide film, a magnesium oxide film, a lanthanum oxide film, a cerium oxide film, a neodymium oxide film, or the like may be used. A stack including two or more of the above insulating films may also be used. Note that a base film may be provided between the substrate 151 and the transistors. Any of the above-described inorganic insulating film can be used as the base film.

An organic insulating film often has a lower barrier property than an inorganic insulating film. Therefore, the organic insulating film preferably has an opening in the vicinity of an end portion of the display unit 100A. This can inhibit entry of impurities from the end portion of the display unit 100A through the organic insulating film. Alternatively, the organic insulating film may be formed so that its end portion is positioned on the inner side compared to the end portion of the display unit 100A, to prevent the organic insulating film from being exposed at the end portion of the display unit 100A.

An organic insulating film is suitable for the insulating layer 214 functioning as a planarization layer. Examples of materials that can be used for the organic insulating film include an acrylic resin, a polyimide resin, an epoxy resin, a polyamide resin, a polyimide-amide resin, a siloxane resin, a benzocyclobutene-based resin, a phenol resin, and precursors of these resins.

In a region 228 illustrated in FIG. 18, an opening is formed in the insulating layer 214. This can inhibit entry of impurities into the display portion 162 from the outside through the insulating layer 214 even when an organic insulating film is used as the insulating layer 214. Consequently, the reliability of the display unit 100A can be increased.

Each of the transistors 201, 205, 206, and 207 includes a conductive layer 221 functioning as a gate, the insulating layer 211 functioning as a gate insulating layer, a conductive layer 222a and the conductive layer 222b functioning as a source and a drain, a semiconductor layer 231, the insulating layer 213 functioning as a gate insulating layer, and a conductive layer 223 functioning as a gate. Here, a plurality of layers obtained by processing the same conductive film are shown with the same hatching pattern. The insulating layer 211 is positioned between the conductive layer 221 and the semiconductor layer 231. The insulating layer 213 is positioned between the conductive layer 223 and the semiconductor layer 231.

There is no particular limitation on the structure of the transistors included in the display unit of this embodiment. For example, a planar transistor, a staggered transistor, or an inverted staggered transistor can be used. A top-gate transistor or a bottom-gate transistor can be used. Alternatively, gates may be provided above and below a semiconductor layer where a channel is formed.

The transistors 201, 205, 206, and 207 employ a structure in which the semiconductor layer where a channel is formed is positioned between two gates. The two gates may be connected to each other and supplied with the same signal to operate the transistor. Alternatively, the threshold voltage of the transistor may be controlled by supplying a potential for controlling the threshold voltage to one of the two gates and a potential for driving to the other.

There is no particular limitation on the crystallinity of a semiconductor material used in the transistor, and an amorphous semiconductor or a semiconductor having crystallinity (a microcrystalline semiconductor, a polycrystalline semiconductor, a single crystal semiconductor, or a semiconductor partly including crystal regions) can be used. It is preferable to use a semiconductor having crystallinity, in which case degradation of the transistor characteristics can be suppressed.

The semiconductor layer of the transistor preferably contains a metal oxide (also referred to as an oxide semiconductor). Alternatively, the semiconductor layer of the transistor may contain silicon. Examples of silicon include amorphous silicon and crystalline silicon (e.g., low-temperature polysilicon and single crystal silicon).

The semiconductor layer preferably contains indium, M (M is one or more kinds selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. Specifically, M is preferably one or more kinds selected from aluminum, gallium, yttrium, and tin.

It is particularly preferable to use an oxide containing indium (In), gallium (Ga), and zinc (Zn) (also referred to as IGZO) for the semiconductor layer.

When the semiconductor layer is an In-M-Zn oxide, the atomic ratio of In is preferably greater than or equal to the atomic ratio of M in the In-M-Zn oxide. Examples of the atomic ratio of the metal elements in such an In-M-Zn oxide are In:M:Zn=1:1:1, 1:1:1.2, 2:1:3, 3:1:2, 4:2:3, 4:2:4.1, 5:1:3, 5:1:6, 5:1:7, 5:1:8, 6:1:6, and 5:2:5 and a composition in the vicinity of any of the above atomic ratios. Note that the vicinity of the atomic ratio includes ±30% of an intended atomic ratio.

For example, in the case of describing an atomic ratio of In:Ga:Zn=4:2:3 or a composition in the vicinity thereof, the case is included in which with the atomic proportion of In being 4, the atomic proportion of Ga is greater than or equal to 1 and less than or equal to 3 and the atomic proportion of Zn is greater than or equal to 2 and less than or equal to 4. In the case of describing an atomic ratio of In:Ga:Zn=5:1:6 or a composition in the vicinity thereof, the case is included in which with the atomic proportion of In being 5, the atomic proportion of Ga is greater than 0.1 and less than or equal to 2 and the atomic proportion of Zn is greater than or equal to 5 and less than or equal to 7. In the case of describing an atomic ratio of In:Ga:Zn=1:1:1 or a composition in the vicinity thereof, the case is included in which with the atomic proportion of In being 1, the atomic proportion of Ga is greater than 0.1 and less than or equal to 2 and the atomic proportion of Zn is greater than 0.1 and less than or equal to 2.

The transistor included in the circuit 164 and the transistor included in the display portion 162 may have the same structure or different structures. One structure or two or more kinds of structures may be employed for a plurality of transistors included in the circuit 164. Similarly, one structure or two or more kinds of structures may be employed for a plurality of transistors included in the display portion 162.

A connection portion 204 is provided in a region of the substrate 151 where the substrate 152 does not overlap. In the connection portion 204, the wiring 165 is electrically connected to the FPC 172 through a conductive layer 166 and a connection layer 242. On the top surface of the connection portion 204, the conductive layer 166 obtained by processing the same conductive film as the pixel electrode 191 is exposed. Thus, the connection portion 204 and the FPC 172 can be electrically connected to each other through the connection layer 242.

A variety of optical members can be arranged on the outer surface of the substrate 152. Examples of the optical members include a polarizing plate, a retardation plate, a light diffusion layer (e.g., a diffusion film), an anti-reflective layer, and a light-condensing film. Furthermore, an antistatic film preventing the attachment of dust, a water repellent film suppressing the attachment of stain, a hard coat film suppressing generation of a scratch caused by the use, an impact-absorbing layer, or the like may be arranged on the outer surface of the substrate 152.

For each of the substrates 151 and 152, glass, quartz, ceramic, sapphire, a resin, or the like can be used. When the substrates 151 and 152 are formed using a flexible material, the flexibility of the display unit can be increased.

As the adhesive layer, a variety of curable adhesives such as a reactive curable adhesive, a thermosetting adhesive, an anaerobic adhesive, and a photocurable adhesive such as an ultraviolet curable adhesive can be used. Examples of these adhesives include an epoxy resin, an acrylic resin, a silicone resin, a phenol resin, a polyimide resin, an imide resin, a polyvinyl chloride (PVC) resin, a polyvinyl butyral (PVB) resin, and an ethylene vinyl acetate (EVA) resin. In particular, a material with low moisture permeability, such as an epoxy resin, is preferred. A two-component-mixture-type resin may be used. An adhesive sheet or the like may be used.

As the connection layer, an anisotropic conductive film (ACF), an anisotropic conductive paste (ACP), or the like can be used.

For the structures, materials, and the like of the light-emitting devices 190G and 190B and the light-emitting and light-receiving device 190R(PD), the above description can be referred to.

As materials for the gates, the source, and the drain of a transistor and conductive layers functioning as wirings and electrodes included in the display unit, any of metals such as aluminum, titanium, chromium, nickel, copper, yttrium, zirconium, molybdenum, silver, tantalum, and tungsten, or an alloy containing any of these metals as its main component can be used. A single-layer structure or a stacked-layer structure including a film containing any of these materials can be used.

As a light-transmitting conductive material, a conductive oxide such as indium oxide, indium tin oxide, indium zinc oxide, zinc oxide, or zinc oxide containing gallium, or graphene can be used. It is also possible to use a metal material such as gold, silver, platinum, magnesium, nickel, tungsten, chromium, molybdenum, iron, cobalt, copper, palladium, or titanium; an alloy material containing any of these metal materials; or a nitride of the metal material (e.g., titanium nitride). Alternatively, a nitride of the metal material (for example, titanium nitride) or the like may be used. In the case of using the metal material or the alloy material (or the nitride thereof), the thickness is preferably set small enough to be able to transmit light. Alternatively, a stacked film of any of the above materials can be used as the conductive layers. For example, a stacked film of indium tin oxide and an alloy of silver and magnesium is preferably used, in which case the conductivity can be increased. The above materials can also be used for conductive layers functioning as wirings and electrodes included in the display unit and the conductive layers (conductive layers functioning as pixel electrodes or common electrodes) of the light-emitting devices and the light-receiving device (or the light-emitting and light-receiving device).

Examples of insulating materials that can be used for the insulating layers include a resin such as an acrylic resin and an epoxy resin, and an inorganic insulating material such as silicon oxide, silicon oxynitride, silicon nitride oxide, silicon nitride, and aluminum oxide.

[Display Unit 100B]

FIG. 19A is a cross-sectional view of a display unit 100B.

The display unit 100B illustrated in FIG. 19A includes the transistor 201, the transistor 205, the transistor 206, the light-emitting device 190, the light-receiving device 110, and the like between the substrate 151 and the substrate 152.

The resin layer 159 and the protective layer 116 are bonded to each other with the adhesive layer 142. The adhesive layer 142 is provided so as to overlap with the light-emitting device 190 and the light-receiving device 110; that is, the display unit 100B employs a solid sealing structure.

The light-emitting device 190 has a stacked-layer structure in which the pixel electrode 191, the common layer 112, the light-emitting layer 193, the common layer 114, and the common electrode 115 are stacked in this order from the insulating layer 214 side. The pixel electrode 191 is connected to the conductive layer 222b included in the transistor 206 through an opening provided in the insulating layer 214.

The light-receiving device 110 has a stacked-layer structure in which the pixel electrode 191, the common layer 112, the active layer 183, the common layer 114, and the common electrode 115 are stacked in this order from the insulating layer 214 side. The pixel electrode 191 is electrically connected to the conductive layer 222b included in the transistor 205 through an opening provided in the insulating layer 214.

An end portion of the pixel electrode 191 is covered with the partition 217. The pixel electrode 191 contains a material that reflects visible light, and the common electrode 115 contains a material that transmits visible light.

Light emitted by the light-emitting device 190 is emitted toward the substrate 152. Light enters the light-emitting device 110 through the substrate 152 and the adhesive layer 142. For the substrate 152, a material having a high visible-light-transmitting property is preferably used.

The pixel electrodes 191 included in the light-receiving device 110 and the light-emitting device 190 can be formed using the same material through the same process. The common layer 112, the common layer 114, and the common electrode 115 are used in both the light-receiving device 110 and the light-emitting device 190. The light-receiving device 110 and the light-emitting device 190 can have common components except the active layer 183 and the light-emitting layer 193. Thus, the light-receiving device 110 can be incorporated in the display unit 100B without a significant increase in the number of manufacturing steps.

The resin layer 159 and the light-blocking layer 158 are provided on a surface of the substrate 152 on the substrate 151 side. The resin layer 159 is provided in a position overlapping with the light-emitting device 190 and is not provided in a position overlapping with the light-receiving device 110. The light-blocking layer 158 is provided to cover the surface of the substrate 152 on the substrate 151 side, a side surface of the resin layer 159, and a surface of the resin layer 159 on the substrate 151 side. The light-blocking layer 158 has an opening in a position overlapping with the light-receiving device 110 and an opening in a position overlapping with the light-emitting device 190. With the light-blocking layer 158, the light sensing range of the light-receiving device 110 can be controlled. Moreover, the light-blocking layer 158 can inhibit direct entry of light into the light-receiving device 110 from the light-emitting device 190 without via an object. Hence, a sensor with little noise and high sensitivity can be obtained. Providing the resin layer 159 allows the distance from the light-blocking layer 158 to the light-emitting device 190 to be shorter than the distance from the light-blocking layer 158 to the light-receiving device 110. Accordingly, viewing angle dependence of display can be reduced while noise of the sensor is reduced. Thus, both the display quality and imaging quality can be increased.

The partition 217 covers an end portion of the pixel electrode 191. The light-blocking layer 219a is provided over the partition 217. The light-blocking layer 219a is positioned between the light-receiving device 110 and the light-emitting device 190.

The partition 217 has a function of blocking visible light. The partition 217 preferably absorbs light emitted by the light-emitting device 190. As the partition 217, a black matrix can be formed using a resin material containing a pigment or dye, for example. Moreover, the partition 217 can be formed of a colored insulating layer by using a brown resist material.

In the display unit 10A (FIG. 18), in some cases, light emitted by the light-emitting device 190 is reflected by the substrate 152 and the partition 216, and the reflected light enters the light-emitting and light-receiving device 190R (PD). In other cases, light emitted by the light-emitting device 190 passes through the partition 216 and is reflected by the transistor, a wiring, or the like, and thus the reflected light enters the light-emitting and light-receiving device 190R(PD). In the display unit 100B, such reflected light can be prevented from entering the light-receiving device 110 because light is absorbed by the partition 217. Thus, noise can be reduced, and the sensitivity of the sensor using the light-receiving device 110 can be increased. Note that a similar effect can be obtained by combining the display unit including the light-emitting and light-receiving device with the partition 217 having a function of blocking visible light.

The partition 217 preferably absorbs at least a wavelength of light that is sensed by the light-receiving device 110 (or the light-emitting and light-receiving device). For example, in the case where the light-receiving device 110 senses green light emitted by the light-emitting device 190, the partition 217 preferably absorbs at least green light. For example, when the partition 217 includes a red color filter, the partition 217 can absorb green light and thus reflected light can be prevented from entering the light-receiving device 110.

Although the light-blocking layer 158 can absorb most of the stray light before the stray light reaches the resin layer 159, part of the stray light may be reflected and enter the partition 217. When the partition 217 is configured to absorb stray light, the stray light can be prevented from entering the transistor, the wiring, or the like. Thus, stray light can be prevented from reaching the light-receiving device 110. With a larger number of times the stray light strikes the light-blocking layer 158 and the partition 217, the amount of absorbed light can be increased and the amount of stray light reaching the light-receiving device 110 can be extremely small. The resin layer 159 is preferably thick, in which case the number of times the stray light strikes the light-blocking layer 158 and the partition 217 can be increased.

Since the partition 217 absorbs light, stray light that enters the partition 217 directly from the light-emitting device 190 can be absorbed by the partition 217. This also demonstrates that providing the partition 217 can reduce the amount of stray light incident on the light-receiving device 110.

The light-blocking layer 219a is positioned over the partition 217 having a function of blocking visible light. The partition 217 can absorb light emitted by the light-emitting device 190. Unlike the partition 216 illustrated in FIG. 15B, the partition 217 does not require the opening which is formed between the light-receiving device 110 and the light-emitting device 190 and in which the light-blocking layer 219a is embedded. Stray light that enters the partition 217 from the light-emitting device 190 is absorbed by the partition 217. The stray light that enters the light-blocking layer 219a from the light-emitting device 190 is absorbed by the light-blocking layer 219a.

In this manner, the partition 217 and the light-blocking layer 219a absorb a wavelength of light that is sensed by the light-receiving device 110, so that stray light incident on the light-receiving device 110 can be suppressed.

The transistor 201, the transistor 205, the transistor 206, and the connection portion 204 which are provided over the substrate 151 can have the same structure as the display unit 100A.

Providing the protective layer 116 that covers the light-emitting device 190 and the light-receiving device 110 can inhibit entry of impurities such as water into the light-emitting device 190 and the light-receiving device 110, thereby increasing the reliability of the light-emitting device 190 and the light-receiving device 110.

In the region 228 in the vicinity of an end portion of the display unit 100B, the insulating layer 215 and the protective layer 116 are preferably in contact with each other through an opening in the insulating layer 214. In particular, the inorganic insulating film included in the insulating layer 215 and the inorganic insulating film included in the protective layer 116 are preferably in contact with each other. Thus, entry of impurities from the outside into the display portion 162 through the organic insulating film can be inhibited. Accordingly, the reliability of the display unit 100B can be increased.

The protective layer 116 may have either a single-layer structure or a stacked-layer structure.

FIG. 19B illustrates an example in which the protective layer 116 has a three-layer structure. In FIG. 19B, the protective layer 116 includes an inorganic insulating layer 116a over the common electrode 115, an organic insulating layer 116b over the inorganic insulating layer 116a, and an inorganic insulating layer 116c over the organic insulating layer 116b.

An end portion of the inorganic insulating layer 116a and an end portion of the inorganic insulating layer 116c extend beyond an end portion of the organic insulating layer 116b and are in contact with each other. The inorganic insulating layer 116a is in contact with the insulating layer 215 (inorganic insulating layer) at the opening in the insulating layer 214 (organic insulating layer). Accordingly, the light-emitting device 190 and the light-receiving device 110 can be surrounded by the insulating layer 215 and the protective layer 116, whereby the reliability of the light-emitting device 190 and the light-receiving device 110 can be increased.

As described above, the protective layer 116 may have a stacked-layer structure of an organic insulating film and an inorganic insulating film. In that case, an end portion of the inorganic insulating film preferably extends beyond an end portion of the organic insulating film.

[Display Unit 100C]

Figure 20:
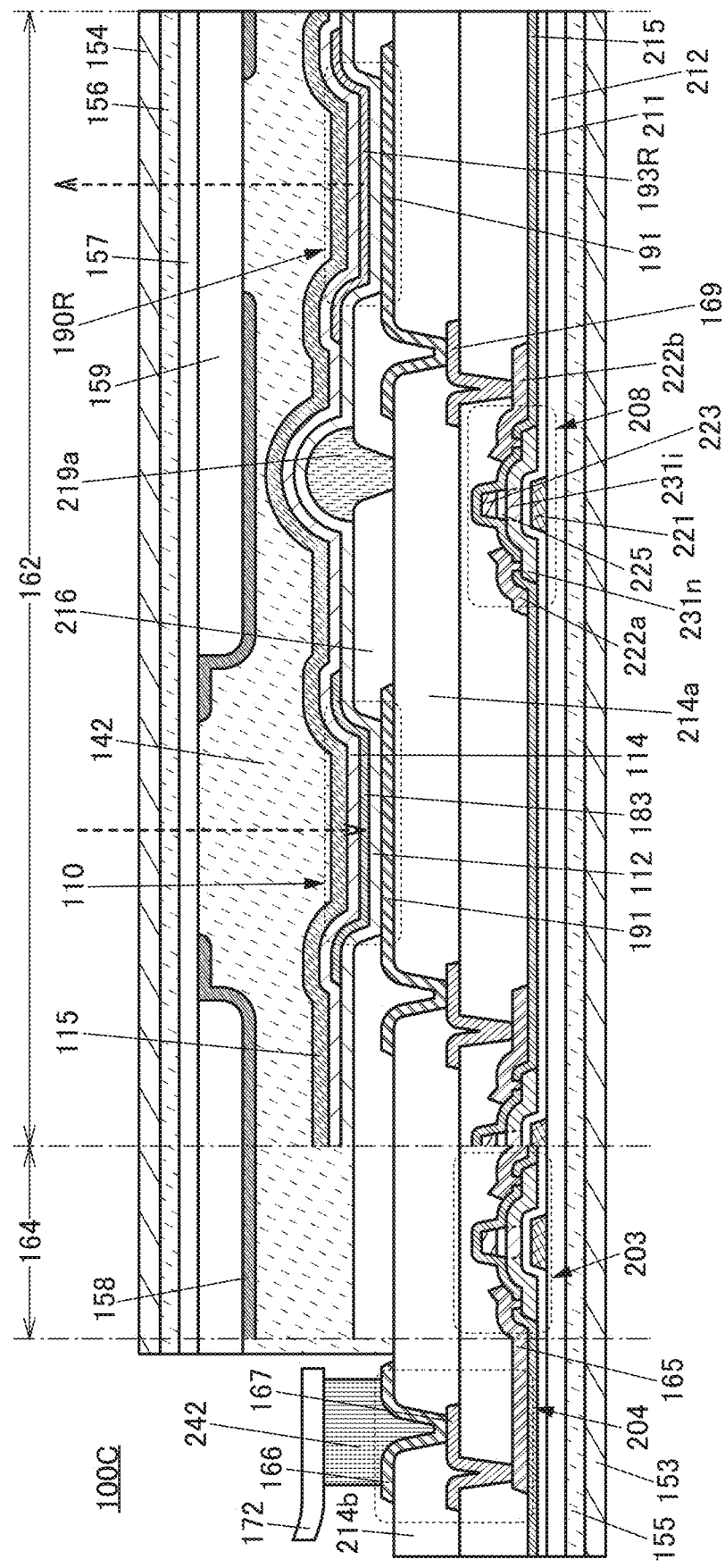
FIG. 20 is a cross-sectional view illustrating an example of a display unit.
Figure 21A:
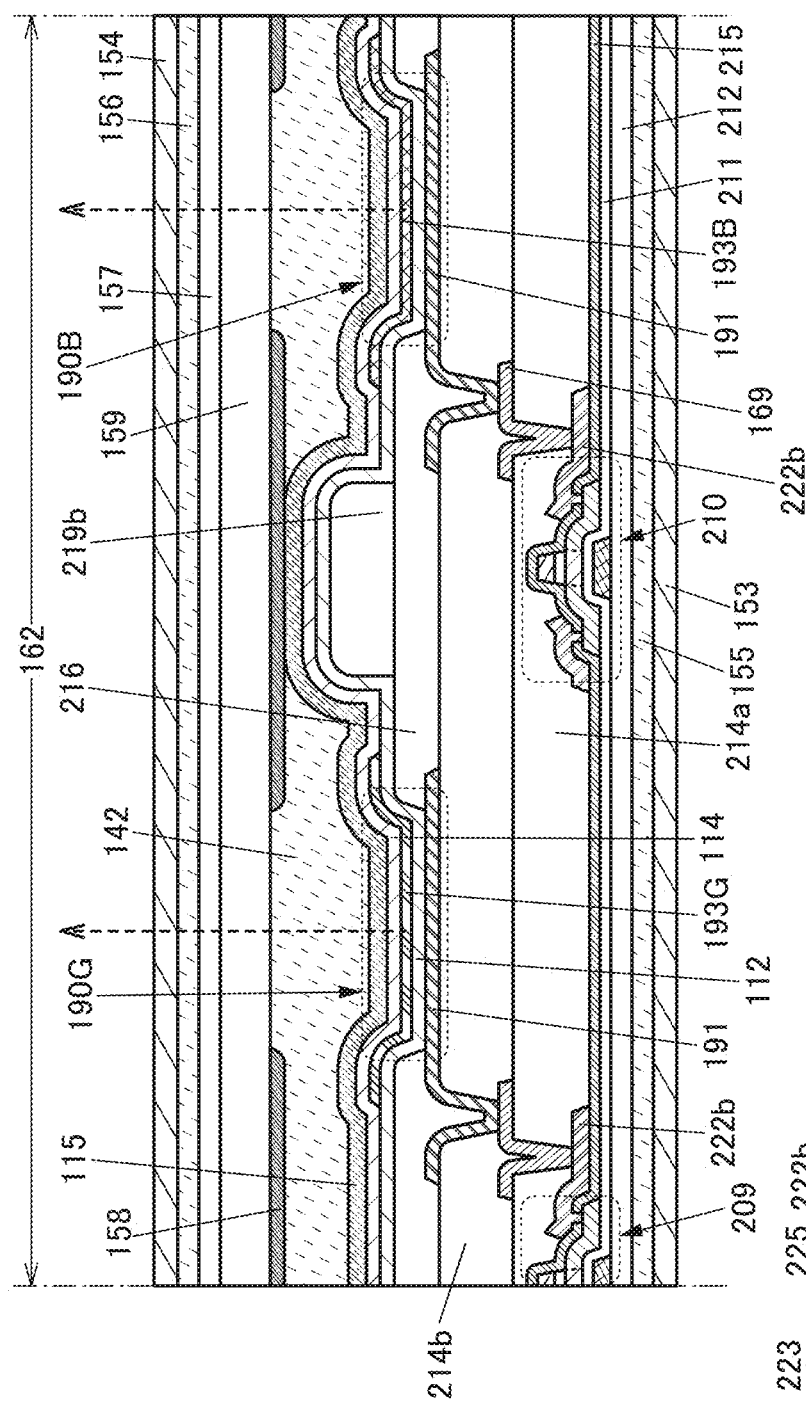
FIG. 21A is a cross-sectional view illustrating an example of a display unit.

FIG. 20 and FIG. 21A are cross-sectional views of a display unit 100C. A perspective view of the display unit 100C is similar to that of the display unit 100A (FIG. 17). FIG. 20 illustrates an example of cross sections of part of a region including the FPC 172, part of the circuit 164, and part of the display portion 162 in the display unit 100C. FIG. 21A illustrates an example of a cross section of part of the display portion 162 in the display unit 100C. FIG. 20 specifically illustrates an example of a cross section of a region including the light-receiving device 110 and the light-emitting device 190R that emits red light in the display portion 162. FIG. 16A specifically shows an example of a cross section of a region including the light-emitting device 190G that emits green light and the light-emitting device 190B that emits blue light in the display portion 162.

The display unit 100C illustrated in FIG. 20 and FIG. 21A includes a transistor 203, a transistor 208, a transistor 209, a transistor 210, the light-emitting device 190R, the light-emitting device 190G, the light-emitting device 190B, the light-receiving device 110, and the like between a substrate 153 and a substrate 154.

The resin layer 159 and the common electrode 115 adhere to each other with the adhesive layer 142; thus, the display unit 100C employs a solid sealing structure.

The substrate 153 and an insulating layer 212 are attached to each other with an adhesive layer 155. The substrate 154 and an insulating layer 157 are attached to each other with an adhesive layer 156.

To fabricate the display unit 100C, first, a first formation substrate provided with the insulating layer 212, the transistors, the light-receiving device 110, the light-emitting devices, and the like and a second formation substrate provided with the insulating layer 157, the resin layer 159, the light-blocking layer 158, and the like are attached to each other with the adhesive layer 142. Then, the substrate 153 is attached to a surface exposed by separation of the first formation substrate, and the substrate 154 is attached to a surface exposed by separation of the second formation substrate, whereby the components formed over the first formation substrate and the second formation substrate are transferred to the substrate 153 and the substrate 154. The substrate 153 and the substrate 154 are preferably flexible. Thus, the flexibility of the display unit 100C can be increased.

The inorganic insulating film that can be used as the insulating layer 211, the insulating layer 213, and the insulating layer 215 can be used as the insulating layer 212 and the insulating layer 157.

The light-emitting device 190R has a stacked-layer structure in which the pixel electrode 191, the common layer 112, the light-emitting layer 193R, the common layer 114, and the common electrode 115 are stacked in this order from an insulating layer 214b side. The pixel electrode 191R is connected to a conductive layer 169 through an opening provided in the insulating layer 214b. The conductive layer 169 is connected to the conductive layer 222b included in the transistor 208 through an opening provided in an insulating layer 214a. The conductive layer 222b is connected to a low-resistance region 231n through an opening provided in the insulating layer 215. That is, the pixel electrode 191R is electrically connected to the transistor 208. The transistor 208 has a function of controlling the driving of the light-emitting device 190R.

Similarly, the light-emitting device 190G has a stacked-layer structure in which the pixel electrode 191, the common layer 112, the light-emitting layer 193G, the common layer 114, and the common electrode 115 are stacked in this order from the insulating layer 214b side. The pixel electrode 191G is electrically connected to the low-resistance region 231n of the transistor 209 through the conductive layer 169 and the conductive layer 222b of the transistor 209. That is, the pixel electrode 191G is electrically connected to the transistor 209. The transistor 209 has a function of controlling the driving of the light-emitting device 190G.

The light-emitting device 190B has a stacked-layer structure in which the pixel electrode 191, the common layer 112, the light-emitting layer 193B, the common layer 114, and the common electrode 115 are stacked in this order from the insulating layer 214b side. The pixel electrode 191B is electrically connected to the low-resistance region 231n of the transistor 210 through the conductive layer 169 and the conductive layer 222b of the transistor 210. That is, the pixel electrode 191B is electrically connected to the transistor 210. The transistor 210 has a function of controlling the driving of the light-emitting device 190B.

The light-receiving device 110 has a stacked-layer structure in which the pixel electrode 191, the common layer 112, the active layer 183, the common layer 114, and the common electrode 115 are stacked in this order from the insulating layer 214b side.

An end portion of the pixel electrode 191 is covered with the partition 216. The pixel electrode 191 contains a material that reflects visible light, and the common electrode 115 contains a material that transmits visible light.

Light from the light-emitting devices 190R, 190G, and 190B is emitted toward the substrate 154. Light enters the light-receiving device 110 through the substrate 154 and the adhesive layer 142. For the substrate 154, a material having a high visible-light-transmitting property is preferably used.

The pixel electrodes 191 can be formed using the same material through the same process. The common layer 112, the common layer 114, and the common electrode 115 are used in common in the light-receiving device 110 and the light-emitting devices 190R, 190G, and 190B. The light-receiving device 110 and the light-emitting device of each color can have common components except the active layer 183 and the light-emitting layer. Thus, the light-receiving device 110 can be incorporated in the display unit 100C without a significant increase in the number of manufacturing steps.

The resin layer 159 and the light-blocking layer 158 are provided on a surface of the insulating layer 157 on the substrate 153 side. The resin layer 159 is provided in positions overlapping with the light-emitting devices 190R, 190G, and 190B and is not provided in a position overlapping with the light-receiving device 110. The light-blocking layer 158 is provided to cover the surface of the substrate 157 on the substrate 153 side, a side surface of the resin layer 159, and a surface of the resin layer 159 on the substrate 153 side. The light-blocking layer 158 has an opening in a position overlapping with the light-receiving device 110 and openings in positions overlapping with the light-emitting devices 190R, 190G, and 190B. With the light-blocking layer 158, the light sensing range of the light-receiving device 110 can be controlled. Moreover, the light-blocking layer 158 can inhibit direct entry of light into the light-receiving device 110 from the light-emitting devices 190R, 190G, and 190B without via an object. Hence, a sensor with little noise and high sensitivity can be obtained. Since the resin layer 159 is provided, the distance from the light-blocking layer 158 to the light-emitting device of each color is shorter than the distance from the light-blocking layer 158 to the light-receiving device 110. Accordingly, viewing angle dependence of display can be reduced while noise of the sensor is reduced. Thus, both the display quality and imaging quality can be increased.

As illustrated in FIG. 20, the partition 216 has an opening between the light-receiving device 110 and the light-emitting device 190R. The light-blocking layer 219a is provided so as to fill the opening. The light-blocking layer 219a is positioned between the light-receiving device 110 and the light-emitting device 190R. The light-blocking layer 219a absorbs light emitted by the light-emitting device 190R. This can reduce stray light that enters the light-receiving device 110.

The spacer 219b is provided over the partition 216 and positioned between the light-emitting device 190G and the light-emitting device 190B. A top surface of the spacer 219b is preferably closer to the light-blocking layer 158 than a top surface of the light-blocking layer 219a is. For example, the sum of the height (thickness) of the partition 216 and the height (thickness) of the spacer 219b is preferably larger than the height (thickness) of the light-blocking layer 219a. Thus, filling with the adhesive layer 142 can be facilitated. As illustrated in FIG. 21A, the light-blocking layer 158 may be in contact with the common electrode 115 (or the protective layer) in a portion where the spacer 219b and the light-blocking layer 158 overlap with each other.

The connection portion 204 is provided in a region of the substrate 153 where the substrate 154 does not overlap. In the connection portion 204, the wiring 165 is electrically connected to the FPC 172 through a conductive layer 167, the conductive layer 166, and the connection layer 242. The conductive layer 167 can be obtained by processing the same conductive film as the conductive layer 169. On the top surface of the connection portion 204, the conductive layer 166 obtained by processing the same conductive film as the pixel electrode 191 is exposed. Thus, the connection portion 204 and the FPC 172 can be electrically connected to each other through the connection layer 242.

Each of the transistors 203, 208, 209, and 210 includes the conductive layer 221 functioning as a gate, the insulating layer 211 functioning as a gate insulating layer, a semiconductor layer including a channel formation region 231i and a pair of low-resistance regions 231n, the conductive layer 222a connected to one of the pair of low-resistance regions 231n, the conductive layer 222b connected to the other of the pair of low-resistance region 231n, an insulating layer 225 functioning as a gate insulating layer, the conductive layer 223 functioning as a gate, and the insulating layer 215 covering the conductive layer 223. The insulating layer 211 is positioned between the conductive layer 221 and the channel formation region 231i. The insulating layer 225 is positioned between the conductive layer 223 and the channel formation region 231i.

The conductive layer 222a and the conductive layer 222b are connected to the corresponding low-resistance regions 231n through openings provided in the insulating layer 215. One of the conductive layers 222a and 222b functions as a source, and the other functions as a drain.

In FIG. 20 and FIG. 21A, the insulating layer 225 overlaps with the channel formation region 231i of the semiconductor layer 231 and does not overlap with the low-resistance regions 231n. The structure illustrated in FIG. 20 and FIG. 21A is obtained by processing the insulating layer 225 with the conductive layer 223 as a mask, for example. In FIG. 20 and FIG. 21A, the insulating layer 215 is provided to cover the insulating layer 225 and the conductive layer 223, and the conductive layer 222a and the conductive layer 222b are connected to the low-resistance regions 231n through the openings in the insulating layer 215. Furthermore, an insulating layer that covers the transistor may be provided over the conductive layer 222a and the conductive layer 222b.

Figure 21B:
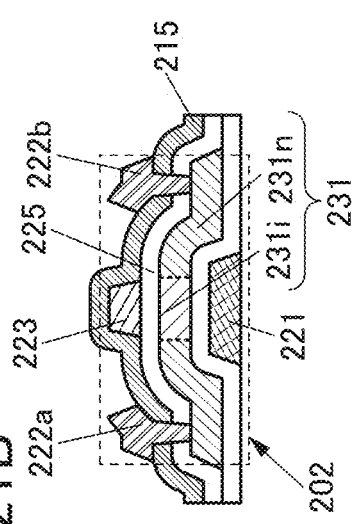
FIG. 21B is a cross-sectional view illustrating an example of a transistor.

FIG. 21B illustrates an example of the transistor 202 in which the insulating layer 225 covers a top surface and a side surface of the semiconductor layer. The conductive layer 222a and the conductive layer 222b are connected to the corresponding low-resistance regions 231n through openings provided in the insulating layer 225 and the insulating layer 215.

As described above, in the display unit of one embodiment of the present invention, a difference between the distances from two light-emitting devices to the light-receiving device (or the light-emitting and light-receiving device) is different from a difference between the distances from the two light-emitting devices to the opening of the light-blocking layer overlapping with the light-receiving device (or the light-emitting and light-receiving device). With this structure, the light-receiving device or the light-emitting and light-receiving device can receive light coming from one of the two light-emitting devices more than light coming from the other. Accordingly, much light coming from the light-emitting device used as a light source can be made to enter the light-receiving device or the light-emitting and light-receiving device in the display unit of one embodiment of the present invention, for example.

This embodiment can be combined with any of the other embodiments as appropriate. In this specification, in the case where a plurality of structure examples are shown in one embodiment, the structure examples can be combined as appropriate.

Embodiment 2

In this embodiment, the display unit of one embodiment of the present invention will be described with reference to FIGS. 22A to 22C.

Pixel Circuit Example 1

In the display unit of one embodiment of the present invention, a display portion includes first pixel circuits each including a light-receiving device and second pixel circuits each including a light-emitting device. The first pixel circuits and the second pixel circuits are each arranged in a matrix.

Figure 22A:
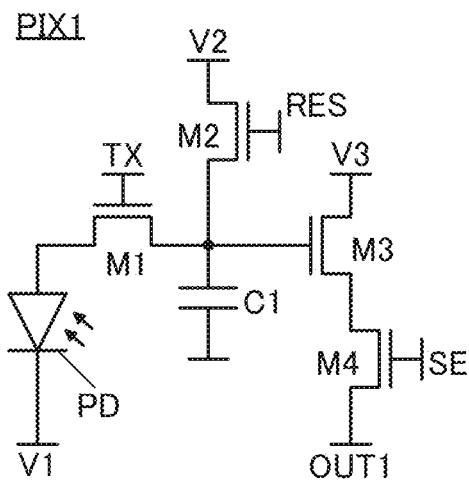
FIGS. 22A to 22C are circuit diagrams each illustrating an example of a pixel circuit.

FIG. 22A illustrates an example of the first pixel circuit including a light-receiving device. FIG. 22B illustrates an example of the second pixel circuit including a light-emitting device.

A pixel circuit PIX1 illustrated in FIG. 22A includes the light-receiving device PD, a transistor M1, a transistor M2, a transistor M3, a transistor M4, and a capacitor C1. Here, a photodiode is used as an example of the light-receiving device PD.

A cathode of the light-receiving device PD is electrically connected to a wiring V1, and an anode of the light-receiving device PD is electrically connected to one of a source and a drain of the transistor M1. A gate of the transistor M1 is electrically connected to a wiring TX, and the other of the source and the drain of the transistor M1 is electrically connected to one electrode of the capacitor C1, one of a source and a drain of the transistor M2, and a gate of the transistor M3. A gate of the transistor M2 is electrically connected to a wiring RES, and the other of the source and the drain of the transistor M2 is electrically connected to a wiring V2. One of a source and a drain of the transistor M3 is electrically connected to a wiring V3, and the other of the source and the drain of the transistor M3 is electrically connected to one of a source and a drain of the transistor M4. A gate of the transistor M4 is electrically connected to a wiring SE, and the other of the source and the drain of the transistor M4 is electrically connected to a wiring OUT1.

A constant potential is supplied to the wiring V1, the wiring V2, and the wiring V3. When the light-receiving device PD is driven with a reverse bias, the wiring V2 is supplied with a potential lower than the potential of the wiring V1. The transistor M2 is controlled by a signal supplied to the wiring RES and has a function of resetting the potential of a node connected to the gate of the transistor M3 to a potential supplied to the wiring V2. The transistor M1 is controlled by a signal supplied to the wiring TX and has a function of controlling the timing at which the potential of the node changes, in accordance with a current flowing through the light-receiving device PD. The transistor M3 functions as an amplifier transistor for outputting a signal corresponding to the potential of the node. The transistor M4 is controlled by a signal supplied to the wiring SE and functions as a selection transistor for reading an output corresponding to the potential of the node by an external circuit connected to the wiring OUT1.

Figure 22B:
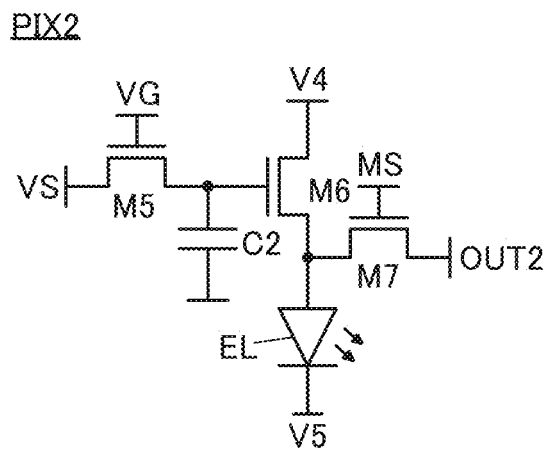

A pixel circuit PIX2 illustrated in FIG. 22B includes a light-emitting device EL, a transistor M5, a transistor M6, a transistor M7, and a capacitor C2. Here, a light-emitting diode is used as an example of the light-emitting device EL. In particular, an organic EL device is preferably used as the light-emitting device EL.

A gate of the transistor M5 is electrically connected to a wiring VG, one of a source and a drain of the transistor M5 is electrically connected to a wiring VS, and the other of the source and the drain of the transistor M5 is electrically connected to one electrode of the capacitor C2 and a gate of the transistor M6. One of a source and a drain of the transistor M6 is electrically connected to a wiring V4, and the other is electrically connected to an anode of the light-emitting device EL and one of a source and a drain of the transistor M7. A gate of the transistor M7 is electrically connected to a wiring MS, and the other of the source and the drain of the transistor M7 is electrically connected to a wiring OUT2. A cathode of the light-emitting device EL is electrically connected to a wiring V5.

A constant potential is supplied to each of the wiring V4 and the wiring V5. The anode of the light-emitting device EL can be set to a high potential, and the cathode can be set to a lower potential than the anode. The transistor M5 is controlled by a signal supplied to the wiring VG and functions as a selection transistor for controlling a selection state of the pixel circuit PIX2. The transistor M6 functions as a driving transistor that controls a current flowing through the light-emitting device EL in accordance with a potential supplied to the gate of the transistor M6. When the transistor M5 is on, a potential supplied to the wiring VS is supplied to the gate of the transistor M6, and the luminance of the light-emitting device EL can be controlled in accordance with the potential. The transistor M7 is controlled by a signal supplied to the wiring MS and has a function of outputting a potential between the transistor M6 and the light-emitting device EL to the outside through the wiring OUT2.

The wiring V1, to which the cathode of the light-receiving device PD is electrically connected, and the wiring V5, to which the cathode of the light-emitting device EL is electrically connected, can be provided in the same layer and have the same level of potential.

In the display unit of one embodiment of the present invention, it is preferable to use transistors including a metal oxide (also referred to as an oxide semiconductor) in their semiconductor layers where channels are formed (such transistors are also referred to as OS transistors below) as all the transistors included in the pixel circuit PIX1 and the pixel circuit PIX2. An OS transistor has an extremely low off-state current and enables charge stored in a capacitor that is series-connected to the transistor to be held for a long time. Furthermore, the power consumption of the display unit can be reduced with the OS transistors.

Alternatively, in the display unit of one embodiment of the present invention, it is preferable to use transistors including silicon in their semiconductor layers where channels are formed (such transistors are also referred to as Si transistors below) as all the transistors included in the pixel circuit PIX1 and the pixel circuit PIX2. Examples of silicon include single crystal silicon, polycrystalline silicon, and amorphous silicon. In particular, transistors including low-temperature polysilicon (LTPS) in their semiconductor layers are preferably used. An LTPS transistor has high field-effect mobility and can operate at high speed.

With the use of Si transistors such as LTPS transistors, a variety of circuits formed using a CMOS circuit and a display portion can be easily formed on the same substrate. Thus, external circuits mounted on the display unit can be simplified, and costs of parts and mounting costs can be reduced.

Alternatively, in the display unit of one embodiment of the present invention, two kinds of transistors are preferably used in the pixel circuit PIX1. Specifically, the pixel circuit PIX1 preferably includes an OS transistor and an LTPS transistor. Changing the material of the semiconductor layer depending on the desired function of the transistors can increase the quality of the pixel circuit PIX1 and the accuracy of sensing and image capturing. In that case, the pixel circuit PIX2 may use either or both of OS transistors and LTPS transistors.

Furthermore, even when two kinds of transistors (e.g., OS transistors and LTPS transistors) are used in the pixels, using the LTPS transistors facilitates formation of a variety of circuits formed using a CMOS circuit and a display portion on the same substrate. Thus, external circuits mounted on the display unit can be simplified, and costs of parts and mounting costs can be reduced.

A transistor using a metal oxide having a wider band gap and a lower carrier density than silicon can achieve an extremely low off-state current. Such a low off-state current enables retention of charge accumulated in a capacitor that is connected in series to the transistor for a long time. Therefore, it is particularly preferable to use OS transistors as the transistors M1, M2, and M5 each of which is connected in series to the capacitor C1 or the capacitor C2.

As the transistor M3, a Si transistor is preferably used. This enables a high-speed reading operation of imaging data.

Note that the display unit which includes, in the display portion, the first pixel circuits each including a light-receiving device and the second pixel circuits each including a light-emitting device can be driven in any of an image display mode, an image capture mode, and a mode of simultaneously performing image display and image capturing. In the image display mode, a full-color image can be displayed using the light-emitting device, for example. In the image capture mode, an image for image capturing (e.g., a green monochromatic image or a blue monochromatic image) can be displayed using the light-emitting device and image capturing can be performed using the light-receiving device, for example. Fingerprint identification can be performed in the image capture mode, for example. In the mode of simultaneously performing image display and image capturing, an image for image capturing can be displayed using the light-emitting device and image capturing can be performed using the light-receiving device in some pixels, and a full-color image can be displayed using the light-emitting device in the other pixels, for example.

Pixel Circuit Example 2

In the display unit of one embodiment of the present invention, a display portion includes third pixel circuits each including a light-emitting and light-receiving device and the second pixel circuits each including a light-emitting device. The third pixel circuits and the second pixel circuits each have a matrix arrangement. An example of the second pixel circuit is as described above (FIG. 22B).

Figure 22C:
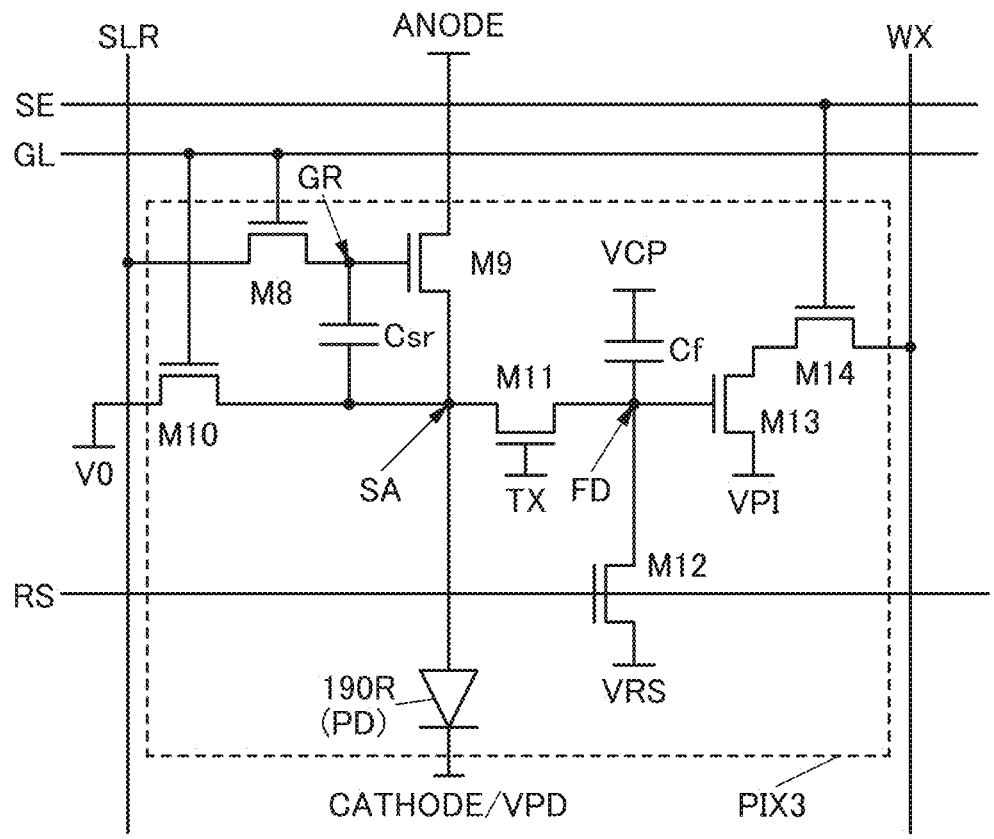

FIG. 22C illustrates an example of the third pixel circuit including a light-emitting and light-receiving device.

A pixel circuit PIX3 illustrated in FIG. 22C includes a light-emitting and light-receiving device 190R(PD) which emits red light and has a light-receiving function. For example, a pixel of the display unit can be formed of the pixel circuit PIX3, the pixel circuit PIX2 including the light-emitting device which emits green light, and the pixel circuit PIX2 including the light-emitting device which emits blue light.

The pixel circuit PIX3 further includes a transistor M8, a transistor M9, a transistor M10, a transistor M11, a transistor M12, a transistor M13, a transistor M14, a capacitor Csr, and a capacitor Cf. The transistor M8, the transistor M10, the transistor M11, the transistor M12, and the transistor M14 each function as a switch.

A gate of the transistor M8 is electrically connected to a wiring GL, one of a source and a drain of the transistor M8 is electrically connected to a wiring SLR, and the other thereof is electrically connected to a gate of the transistor M9 and one electrode of the capacitor Csr. One of a source and a drain of the transistor M9 is electrically connected to one of a source and a drain of the transistor M10, one of a source and a drain of the transistor M11, the other electrode of the capacitor Csr, and an anode of the light-emitting and light-receiving device 190R(PD), and the other thereof is electrically connected to a wiring ANODE. A gate of the transistor M10 is electrically connected to the wiring GL, and the other of the source and the drain of the transistor M10 is electrically connected to a wiring V0. A gate of the transistor M11 is electrically connected to the wiring TX, and the other of the source and the drain of the transistor M11 is electrically connected to one of a source and a drain of the transistor M12, a gate of the transistor M13, and one electrode of the capacitor Cf. A gate of the transistor M12 is electrically connected to a wiring RS, and the other of the source and the drain of the transistor M12 is electrically connected to a wiring VRS. One of a source and a drain of the transistor M13 is electrically connected to one of a source and a drain of the transistor M14, and the other thereof is electrically connected to a wiring VPI. A gate of the transistor M14 is electrically connected to the wiring SE, and the other of the source and the drain of the transistor M14 is electrically connected to a wiring WX. The other electrode of the capacitor Cf is electrically connected to a wiring VCP. A cathode of the light-emitting and light-receiving device 190R(PD) is electrically connected to a wiring CATHODE/VPD.

Signals for controlling operations of the transistors are supplied to the wiring GL, the wiring SE, the wiring TX, and the wiring RS.

In the case where image display is performed, an image signal VdataR is supplied to the wiring SLR.

Predetermined potentials are supplied to the wiring V0, the wiring VPI, the wiring VCP, the wiring VRS, the wiring ANODE, and the wiring CATHODE/VPD. A potential Vo corresponding to black display of the image signal VdataR (e.g., 0 V) is supplied to the wiring V0. A potential higher than a gate voltage range of the transistor M13 is supplied to the wiring VPI. An arbitrary potential (e.g., 0 V) can be supplied to the wiring VCP. A potential lower than that of the wiring CATHODE/VPD is supplied to the wiring VRS. A potential higher than that of the wiring CATHODE/VPD is supplied to the wiring ANODE.

The wiring CATHODE/VPD and the wiring V5 illustrated in FIG. 22B can be provided in the same layer and have the same level of potential.

The transistor M8 and the transistor M10 are controlled with the signal supplied to the wiring GL and function as selection transistors for controlling the selection state of the pixel.

The transistor M9 functions as a driving transistor that controls a current flowing through the light-emitting and light-receiving device 190R(PD) in accordance with a potential supplied to the gate.

When the transistor M8 is in a conducting state, the transistor M10 is also in a conducting state at the same time, so that a potential supplied to the wiring SLR (e.g., the image signal VdataR) is supplied to the gate of the transistor M9 and the potential Vo supplied to the wiring V0 is supplied to the other of the source and the drain of the transistor M10. Charge corresponding to the voltage VdataR—Vo is accumulated in the capacitor Csr. The light-emitting and light-receiving device 190R(PD) can emit light with a luminance corresponding to the potential of a node GR (the gate potential of the transistor M9).

The transistor M11 is controlled with the signal supplied to the wiring TX and has a function of controlling the timing at which the potential of a node FD changes, in accordance with a current flowing through the light-emitting and light-receiving device 190R(PD). The transistor M12 is controlled with the signal supplied to the wiring RS and has a function of resetting the potential of the node FD connected to the gate of the transistor M13 to a potential supplied to the wiring VRS. The transistor M13 functions as an amplifier transistor that outputs a signal corresponding to the potential of the node FD. The transistor M14 is controlled with the signal supplied to the wiring SE and functions as a selection transistor for reading an output corresponding to the potential of the node FD by an external circuit connected to the wiring WX.

Note that the display unit which includes, in the display portion, the third pixel circuits each including a light-emitting and light-receiving device and the second pixel circuits each including a light-emitting device can be driven in any of an image display mode, an image capture mode, and a mode of simultaneously performing image display and image capturing. In the image display mode, a full-color image can be displayed using the light-emitting and light-receiving device and the light-emitting device, for example. In the image capture mode, an image for image capturing (e.g., a green monochromatic image or a blue monochromatic image) can be displayed using the light-emitting device and image capturing can be performed using the light-emitting and light-receiving device, for example. Fingerprint identification can be performed in the image capture mode, for example. In the mode of simultaneously performing image display and image capturing, an image for image capturing can be displayed using the light-emitting device and image capturing can be performed using the light-emitting and light-receiving device in some pixels, and a full-color image can be displayed using the light-emitting and light-receiving device and the light-emitting device in the other pixels, for example.

In the display unit of one embodiment of the present invention, all the transistors included in the pixel circuit PIX3 and the pixel circuit PIX2 are preferably OS transistors. An OS transistor has an extremely low off-state current and enables charge stored in a capacitor that is series-connected to the transistor to be held for a long time. Furthermore, the power consumption of the display unit can be reduced with the OS transistors.

Alternatively, in the display unit of one embodiment of the present invention, all the transistors included in the pixel circuit PIX3 and the pixel circuit PIX2 are preferably Si transistors. It is particularly preferable to use LTPS transistors. An LTPS transistor has high field-effect mobility and can operate at high speed.

With the use of Si transistors such as LTPS transistors, a variety of circuits formed using a CMOS circuit and a display portion can be easily formed on the same substrate. Thus, external circuits mounted on the display unit can be simplified, and costs of parts and mounting costs can be reduced.

Alternatively, in the display unit of one embodiment of the present invention, two kinds of transistors are preferably used in the pixel circuit PIX3. Specifically, the pixel circuit PIX3 preferably includes an OS transistor and an LTPS transistor. Changing the material of the semiconductor layer depending on the desired function of the transistor can increase the quality of the pixel circuit PIX3 and the accuracy of sensing and image capturing. In that case, the pixel circuit PIX2 may use either or both of OS transistors and LTPS transistors.

Furthermore, even when two kinds of transistors (e.g., OS transistors and LTPS transistors) are used in the pixels, using the LTPS transistors facilitates formation of a variety of circuits formed using a CMOS circuit and a display portion on the same substrate. Thus, external circuits mounted on the display unit can be simplified, and costs of parts and mounting costs can be reduced.

A transistor using a metal oxide having a wider band gap and a lower carrier density than silicon can achieve an extremely low off-state current. Such a low off-state current enables retention of charge accumulated in a capacitor that is connected in series to the transistor for a long time. Therefore, it is particularly preferable to use OS transistors as the transistors M8, M10, M11, and M12 each of which is connected in series to the capacitor Csr, or the capacitor Cf.

As the transistor M13, a Si transistor is preferably used. This enables a high-speed reading operation of imaging data.

Although the transistors illustrated in FIGS. 22A to 22C are of n-channel type, the transistors may be of p-channel type. Furthermore, the transistors are not limited to single-gate transistors and may include a backgate.

One or more layers including the transistor and/or the capacitor are preferably provided in a position overlapping with the light-receiving device PD, the light-emitting device EL, or the light-emitting and light-receiving device 190R (PD). Thus, the effective area of each pixel circuit can be reduced, and a high-resolution display portion can be achieved.

This embodiment can be combined with any of the other embodiments as appropriate.

Embodiment 3

Described in this embodiment is a metal oxide (also referred to as an oxide semiconductor) applicable to an OS transistor described in the above embodiment.

The metal oxide preferably contains at least indium or zinc. In particular, indium and zinc are preferably contained. In addition, aluminum, gallium, yttrium, tin, or the like is preferably contained. Furthermore, one or more elements selected from boron, silicon, titanium, iron, nickel, germanium, zirconium, molybdenum, lanthanum, cerium, neodymium, hafnium, tantalum, tungsten, magnesium, cobalt, and the like may be contained.

<Classification of Crystal Structure>

Amorphous (including a completely amorphous structure), c-axis-aligned crystalline (CAAC), nanocrystalline (nc), cloud-aligned composite (CAC), single-crystal, and polycrystalline structures can be given as examples of a crystal structure of an oxide semiconductor.

The crystal structure of a film or a substrate can be evaluated with an X-ray diffraction (XRD) spectrum. For example, evaluation is possible using an XRD spectrum which is obtained by grazing-incidence XRD (GIXD) measurement. Note that a GIXD method is also called a thin film method or a Seemann-Bohlin method.

For example, the peak of the XRD spectrum of the quartz glass substrate has a bilaterally symmetrical shape. On the other hand, the peak of the XRD spectrum of the IGZO film having a crystal structure has a bilaterally asymmetrical shape. The bilaterally asymmetrical peak shows the existence of crystal in the film or the substrate. In other words, the crystal structure of the film or the substrate cannot be regarded as "amorphous" unless it has a bilaterally symmetrical peak in the XRD spectrum.

The crystal structure of a film or a substrate can be analyzed with a diffraction pattern obtained by nanobeam electron diffraction (NBED) (also referred to as a nanobeam electron diffraction pattern). For example, a halo pattern is observed in the diffraction pattern of the quartz glass substrate, which indicates that the quartz glass substrate is in an amorphous state. Furthermore, not a halo pattern but a spot-like pattern is observed in the diffraction pattern of the IGZO film formed at room temperature. Thus, it is presumed that the IGZO film formed at room temperature is in an intermediate state, which is neither a crystal state nor an amorphous state, and it cannot be concluded that the IGZO film is in an amorphous state.

<<Oxide Semiconductor Structure>>

Oxide semiconductors might be classified in a manner different from the above-described one when classified in terms of the structure. Oxide semiconductors are classified into a single crystal oxide semiconductor and a non-single-crystal oxide semiconductor, for example. Examples of the non-single-crystal oxide semiconductor include the above-described CAAC-OS and nc-OS. A polycrystalline oxide semiconductor, an amorphous-like oxide semiconductor (a-like OS), and an amorphous oxide semiconductor are also given as examples of the non-single-crystal oxide semiconductors.

Here, the above-described CAAC-OS, nc-OS, and a-like OS will be described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the size of the crystal region may be approximately several tens of nanometers.

Furthermore, in an In-M-Zn oxide (the element M is one or more of aluminum, gallium, yttrium, tin, titanium, and the like), the CAAC-OS tends to have a layered crystal structure (also referred to as a layered structure) in which a layer containing indium (In) and oxygen (hereinafter, In layer) and a layer containing the element M, zinc (Zn), and oxygen (hereinafter, (M,Zn) layer) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution transmission electron microscope (TEM) image, for example.

When the CAAC-OS film is subjected to structural analysis by out-of-plane XRD measurement with an XRD apparatus using a θ/2θ scan, for example, a peak indicating c-axis alignment is detected at 2θ=31° or in the vicinity thereof. Note that the position of the peak indicating c-axis alignment (the value of 2θ) may change depending on the kind, composition, or the like of the metal element contained in the CAAC-OS.

Moreover, in the electron diffraction pattern of the CAAC-OS film, a plurality of bright spots appear, for example. Note that one spot and another spot are symmetric with respect to a spot of the incident electron beam which passes through a sample (also referred to as a direct spot).

In the case where the crystal region is observed from the above-described specific direction, the shape of the lattice alignment in the crystal region is basically a hexagon but is not always a regular hexagon and is a non-regular hexagon in some cases. A pentagonal lattice arrangement, a heptagonal lattice arrangement, and the like are included in the distortion in some cases. Note that a clear grain boundary cannot be observed even in the vicinity of distortion in the CAAC-OS. That is, formation of a grain boundary is inhibited by the distortion of a lattice arrangement. This is probably because the CAAC-OS can tolerate distortion owing to a low density of arrangement of oxygen atoms in the a-b plane direction, an interatomic bond distance changed by substitution of a metal atom, and the like.

A crystal structure in which a clear grain boundary is observed is a so-called poly crystal structure. It is highly possible that the grain boundary serves as a recombination center and traps a carrier, and thus the on-state current and field-effect mobility of a transistor are decreased, for example. Thus, the CAAC-OS in which no clear grain boundary is observed is one of oxides with crystallinity having a favorable crystal structure for a semiconductor layer of a transistor. Note that the CAAC-OS preferably contains Zn. For example, an In—Zn oxide and an In—Ga—Zn oxide are suitable because they can inhibit generation of a grain boundary as compared with an In oxide.

The CAAC-OS is an oxide semiconductor with high crystallinity in which no clear grain boundary is observed. Thus, in the CAAC-OS, a reduction in electron mobility due to the grain boundary is less likely to occur. Entry of impurities, formation of defects, or the like might decrease the crystallinity of an oxide semiconductor. This means that the CAAC-OS can be referred to as an oxide semiconductor having small amounts of impurities and defects (e.g., oxygen vacancies). Thus, an oxide semiconductor including the CAAC-OS is physically stable. Accordingly, the oxide semiconductor including the CAAC-OS is resistant to heat and has high reliability. In addition, the CAAC-OS is stable with respect to high temperature in the manufacturing process (what is called thermal budget). Accordingly, the use of the CAAC-OS for the OS transistor can extend a degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a fine crystal. Note that the size of the fine crystal is greater than or equal to 1 nm and less than or equal to 10 nm, in particular, greater than or equal to 1 nm and less than or equal to 3 nm, and thus the fine crystal is also referred to as a nanocrystal. There is no regularity of crystal orientation between different nanocrystals in the nc-OS. Thus, the orientation in the whole film is not observed. Accordingly, in some cases, the nc-OS cannot be distinguished from an a-like OS or an amorphous oxide semiconductor, depending on an analysis method. For example, when the nc-OS film is subjected to structural analysis by out-of-plane XRD measurement with an XRD apparatus using a θ/2θ scan, no peak indicating crystallinity is detected. Furthermore, a halo pattern is found in a selected-area electron diffraction pattern of the nc-OS film obtained by using an electron beam having a probe diameter larger than the diameter of a nanocrystal (e.g., larger than or equal to 50 nm). Meanwhile, in some cases, a plurality of spots are observed in a ring-like region whose center is a direct spot in an electron diffraction pattern (also referred to as nanobeam electron diffraction pattern) of the nc-OS film, which is obtained using an electron beam with a probe diameter close to or smaller than the diameter of a nanocrystal (e.g., larger than or equal to 1 nm and smaller than or equal to 30 nm).

[a-Like OS]

The a-like OS is an oxide semiconductor having a structure between those of the nc-OS and the amorphous oxide semiconductor. The a-like OS has a void or a low-density region. That is, the a-like OS has lower crystallinity than the nc-OS and the CAAC-OS. Moreover, the a-like OS has higher hydrogen concentration than the nc-OS and the CAAC-OS.

<<Oxide Semiconductor Structure>>

Next, the above-described CAC-OS will be described in detail. Note that the CAC-OS relates to the material composition.

[CAC-OS]

The CAC-OS has, for example, a composition in which elements included in a metal oxide are unevenly distributed. Materials including unevenly distributed elements each have a size greater than or equal to 0.5 nm and less than or equal to 10 nm, preferably greater than or equal to 1 nm and less than or equal to 3 nm, or a similar size. Note that in the following description of a metal oxide, a state in which one or more metal elements are unevenly distributed and regions including the metal element(s) are mixed is referred to as a mosaic pattern or a patch-like pattern. The regions each have a size greater than or equal to 0.5 nm and less than or equal to 10 nm, preferably greater than or equal to 1 nm and less than or equal to 3 nm, or a similar size.

The CAC-OS has a composition in which materials are separated into first regions and second regions, and a mosaic pattern is formed. The first regions are distributed in the film. Hereinafter, this composition is also referred to as a cloud-like composition. In other words, the CAC-OS is a composite metal oxide having a composition in which the first regions and the second regions are mixed.

Here, the atomic ratios of In, Ga, and Zn to a metal element included in a CAC-OS in an In—Ga—Zn oxide are expressed as [In], [Ga], and [Zn], respectively. For example, the first region of the CAC-OS in the In—Ga—Zn oxide has [In], which is greater than that in the composition of a CAC-OS film. In addition, the second region of the CAC-OS in the In—Ga—Zn oxide has [Ga], which is greater than that in the composition of the CAC-OS film. Alternatively, for example, [In] of the first region is greater than that in the second region, and [Ga] of the first region is less than that in the second region. In addition, [Ga] of the second region is greater than that in the first region, and [In] of the second region is less than that in the first region.

Specifically, the first region includes indium oxide, indium zinc oxide, or the like as a main component. The second region includes gallium oxide, gallium zinc oxide, or the like as a main component. That is, the first region can also be referred to as a region containing In as a main component. The second region can also be referred to as a region containing Ga as a main component.

Note that a boundary between the first region and the second region is not clearly observed in some cases.

In a material composition of a CAC-OS in an In—Ga—Zn oxide that contains In, Ga, Zn, and O, regions containing Ga as a main component are observed in part of the CAC-OS and regions containing In as a main component are observed in part thereof. These regions are randomly dispersed to form a mosaic pattern. Thus, it is suggested that the CAC-OS has a structure in which metal elements are unevenly distributed.

The CAC-OS can be formed by a sputtering method under a condition where a substrate is intentionally not heated, for example. In the case of forming the CAC-OS by a sputtering method, one or more selected from an inert gas (typically, argon), an oxygen gas, and a nitrogen gas may be used as a deposition gas. The ratio of the flow rate of an oxygen gas to the total flow rate of the deposition gas at the time of film formation is preferably as low as possible, and for example, the flow ratio of an oxygen gas is preferably higher than or equal to 0% and less than 30%, further preferably higher than or equal to 0% and less than or equal to 10%.

For example, energy dispersive X-ray spectroscopy (EDX) is used to obtain EDX mapping, and according to the EDX mapping, the CAC-OS in the In—Ga—Zn oxide has a composition in which the regions containing In as a main component (the first regions) and the regions containing Ga as a main component (the second regions) are unevenly distributed and mixed.

Here, the first region has a higher conductivity than the second region. In other words, when carriers flow through the first region, the conductivity of a metal oxide is exhibited. Accordingly, when the first regions are distributed in a metal oxide as a cloud, high field-effect mobility ($\mu$) can be achieved.

The second region has a higher insulating property than the first region. In other words, when the second regions are distributed in a metal oxide, leakage current can be inhibited.

Thus, in the case where a CAC-OS is used for a transistor, by the complementary function of the conducting function due to the first region and the insulating function due to the second region, the CAC-OS can have a switching function (on/off function). That is, a CAC-OS has a conducting function in part of the material and has an insulating function in another part of the material; as a whole, the CAC-OS has a function of a semiconductor. Separation of the conducting function and the insulating function can maximize each function. Accordingly, when a CAC-OS is used for a transistor, a high on-state current ($I_{on}$), a high field-effect mobility ($\mu$), and favorable switching operation can be achieved.

A transistor including a CAC-OS is highly reliable. Thus, the CAC-OS is suitably used in a variety of semiconductor devices typified by a display device.

An oxide semiconductor can have any of various structures that show various different properties. Two or more kinds of the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, a transistor including the above oxide semiconductor is described.

When the oxide semiconductor is used for a transistor, the transistor can have high field-effect mobility. In addition, the transistor can have high reliability.

The transistor preferably has an oxide semiconductor with a low carrier concentration. For example, the carrier density of an oxide semiconductor is lower than or equal to $1\times10^{17}$ cm$^{-3}$, preferably lower than or equal to $1\times10^{15}$ cm$^{-3}$, further preferably lower than or equal to $1\times10^{13}$ cm$^{-3}$, still further preferably lower than or equal to $1\times10^{11}$ cm$^3$, yet further preferably lower than $1\times10^{10}$ cm$^{-3}$, and higher than or equal to $1\times10^{-9}$ cm$^3$. In order to reduce the carrier density of an oxide semiconductor film, the impurity concentration in the oxide semiconductor film is reduced so that the density of defect states can be reduced. In this specification and the like, a state with a low concentration of impurities and a low density of defect states is referred to as a highly purified intrinsic or substantially highly purified intrinsic state. Note that an oxide semiconductor with a low carrier concentration may be referred to as a highly purified intrinsic or substantially highly purified intrinsic oxide semiconductor.

A highly purified intrinsic or substantially highly purified intrinsic oxide semiconductor film has a low density of defect states and accordingly has a low density of trap states in some cases.

Charges trapped by the trap states in an oxide semiconductor take a long time to be released and may behave like fixed charges. A transistor whose channel formation region is formed in an oxide semiconductor having a high density of trap states has unstable electrical characteristics in some cases.

In order to obtain stable electrical characteristics of the transistor, it is effective to reduce impurity concentrations in the oxide semiconductor. In order to reduce the concentration of impurities in the oxide semiconductor, impurity concentrations in a film that is adjacent to the oxide semiconductor is preferably reduced. Examples of impurities include hydrogen, nitrogen, alkali metal, alkaline earth metal, iron, nickel, and silicon.

<Impurities>

The influence of impurities in the oxide semiconductor is described.

When silicon or carbon, which is a Group 14 element, is contained in an oxide semiconductor, defect states are formed in the oxide semiconductor. Thus, the concentration of silicon or carbon in the oxide semiconductor and in the vicinity of an interface with the oxide semiconductor (measured by secondary ion mass spectrometry (SIMS)) is lower than or equal to $2\times10^{18}$ atoms/cm$^3$, preferably lower than or equal to $2\times10^{17}$ atoms/cm$^3$.

When the oxide semiconductor contains alkali metal or alkaline earth metal, defect states are formed and carriers are generated, in some cases. Accordingly, a transistor including an oxide semiconductor that contains alkali metal or alkaline earth metal tends to have normally-on characteristics. Thus, the concentration of alkali metal or alkaline earth metal in the oxide semiconductor measured by SIMS is set lower than or equal to $1\times10^{18}$ atoms/cm$^3$, and preferably lower than or equal to $2\times10^{16}$ atoms/cm$^3$.

An oxide semiconductor containing nitrogen easily becomes n-type by generation of electrons serving as carriers and an increase in carrier concentration. A transistor including an oxide semiconductor that contains nitrogen as the semiconductor tends to have normally-on characteristics. When nitrogen is contained in the oxide semiconductor, a trap state is sometimes formed. This might make the electrical characteristics of the transistor unstable. Thus, the concentration of nitrogen in the oxide semiconductor, which is measured by SIMS, can be lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in an oxide semiconductor reacts with oxygen, which reacts with metal atoms, to be water, and thus causes an oxygen vacancy in some cases. Entry of hydrogen into the oxygen vacancy generates an electron serving as a carrier in some cases. Furthermore, some hydrogen may react with oxygen bonded to a metal atom and generate an electron serving as a carrier. Thus, a transistor including an oxide semiconductor that contains hydrogen tends to have normally-on characteristics. Accordingly, hydrogen in the oxide semiconductor is preferably reduced as much as possible. Specifically, the hydrogen concentration in the oxide semiconductor measured by SIMS is lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

An oxide semiconductor with sufficiently reduced impurities is used for a channel formation region of a transistor, so that the transistor can have stable electrical characteristics.

This embodiment can be combined with any of the other embodiments as appropriate.

Embodiment 4

In this embodiment, electronic devices of one embodiment of the present invention will be described with reference to FIGS. 23A and 23B, FIGS. 24A to 24D, and FIGS. 25A to 25F.

An electronic device of this embodiment includes the display unit of one embodiment of the present invention. For example, the display unit of one embodiment of the present invention can be used in a display portion of the electronic device. The display unit of one embodiment of the present invention has a function of sensing light, and thus can perform biological authentication with the display portion or detect a touch or a near touch on the display portion, thereby improving the functionality and convenience of the electronic device, for example.

Examples of the electronic devices include a digital camera, a digital video camera, a digital photo frame, a mobile phone, a portable game console, a portable information terminal, and an audio reproducing device, in addition to electronic devices with a relatively large screen, such as a television device, a desktop or laptop personal computer, a monitor of a computer or the like, digital signage, and a large game machine such as a pachinko machine.

The electronic device in this embodiment may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays).

The electronic device in this embodiment can have a variety of functions. For example, the electronic device can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Figure 23A:
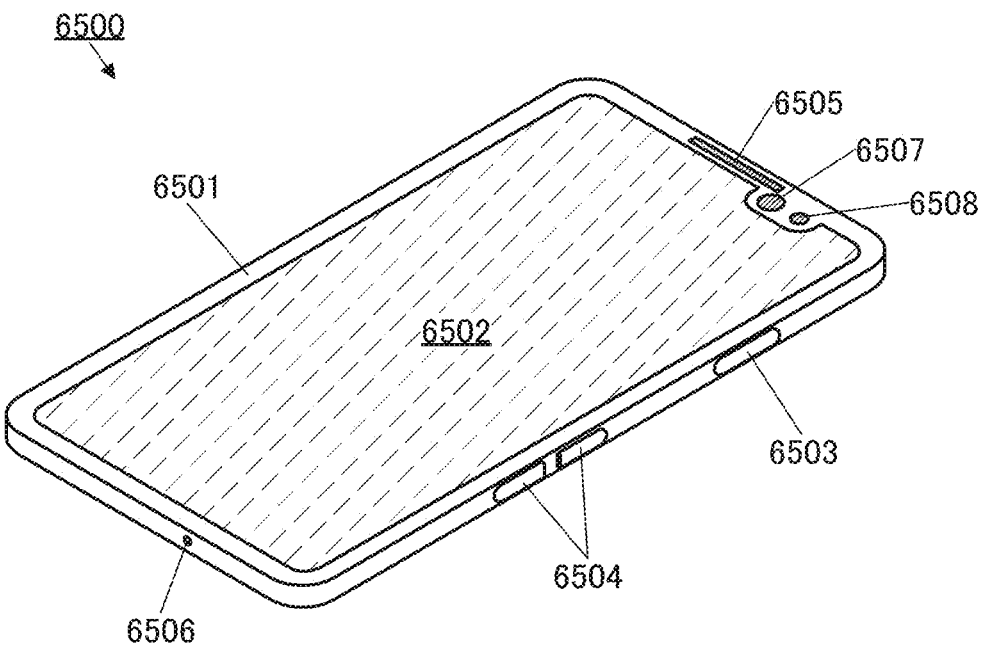
FIGS. 23A and 23B are views each illustrating an example of an electronic device.

An electronic device 6500 in FIG. 23A is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function.

The display unit of one embodiment of the present invention can be used in the display portion 6502.

Figure 23B:
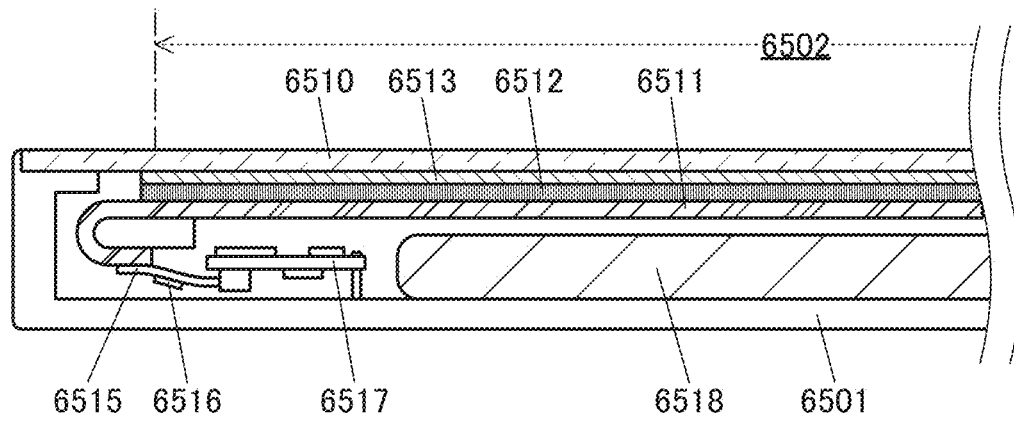

FIG. 23B is a schematic cross-sectional view including an end portion of the housing 6501 on the microphone 6506 side.

A protective component 6510 having a light-transmitting property is provided on the display surface side of the housing 6501. A display panel 6511, an optical component 6512, a touch sensor panel 6513, a printed circuit board 6517, a battery 6518, and the like are provided in a space surrounded by the housing 6501 and the protective component 6510.

The display panel 6511, the optical component 6512, and the touch sensor panel 6513 are fixed to the protective component 6510 with an adhesive layer (not illustrated).

Part of the display panel 6511 is folded back in a region outside the display portion 6502, and an FPC 6515 is connected to the part that is folded back. An IC 6516 is mounted on the FPC 6515. The FPC 6515 is connected to a terminal provided on the printed circuit board 6517.

A flexible display of one embodiment of the present invention can be used as the display panel 6511. Thus, an extremely lightweight electronic device can be provided. Since the display panel 6511 is extremely thin, the battery 6518 with high capacity can be mounted with the thickness of the electronic device controlled. An electronic device with a narrow frame can be obtained when part of the display panel 6511 is folded back so that the portion connected to the FPC 6515 is positioned on the rear side of a pixel portion.

Using the display unit of one embodiment of the present invention as the display panel 6511 allows image capturing on the display portion 6502. For example, an image of a fingerprint is captured by the display panel 6511; thus, fingerprint identification can be performed.

By further including the touch sensor panel 6513, the display portion 6502 can have a touch panel function. A variety of types such as a capacitive type, a resistive type, a surface acoustic wave type, an infrared type, an optical type, and a pressure-sensitive type can be used for the touch sensor panel 6513. Alternatively, the display panel 6511 may function as a touch sensor; in such a case, provision of the touch sensor panel 6513 may be omitted.

Figure 24A:
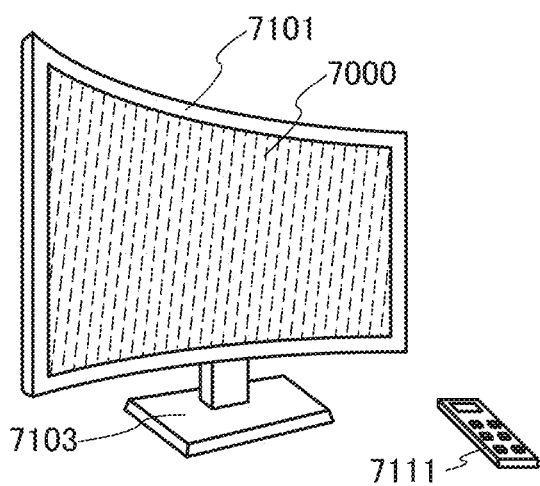
FIGS. 24A to 24D are views each illustrating an example of an electronic device.

FIG. 24A illustrates an example of a television device. In a television device 7100, a display portion 7000 is incorporated in a housing 7101. Here, a structure in which the housing 7101 is supported by a stand 7103 is illustrated.

The display unit of one embodiment of the present invention can be used in the display portion 7000.

The television device 7100 illustrated in FIG. 24A can be operated with an operation switch provided in the housing 7101 or a separate remote controller 7111. Alternatively, the display portion 7000 may include a touch sensor, and the television device 7100 may be operated by touch on the display portion 7000 with a finger or the like. The remote controller 7111 may be provided with a display portion for displaying information output from the remote controller 7111. With a touch panel or operation keys provided in the remote controller 7111, channels and volume can be controlled, and videos displayed on the display portion 7000 can be controlled.

Note that the television device 7100 is provided with a receiver, a modem, and the like. A general television broadcast can be received with the receiver. When the television device is connected to a communication network with or without wires via the modem, one-way (from a transmitter to a receiver) or two-way (between a transmitter and a receiver or between receivers, for example) data communication can be performed.

Figure 24B:
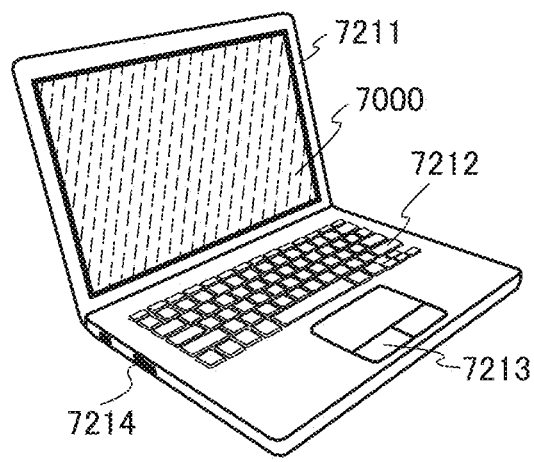

FIG. 24B illustrates an example of a laptop personal computer. A laptop personal computer 7200 includes a housing 7211, a keyboard 7212, a pointing device 7213, an external connection port 7214, and the like. The display portion 7000 is incorporated in the housing 7211.

The display unit of one embodiment of the present invention can be used in the display portion 7000.

Figure 24C:
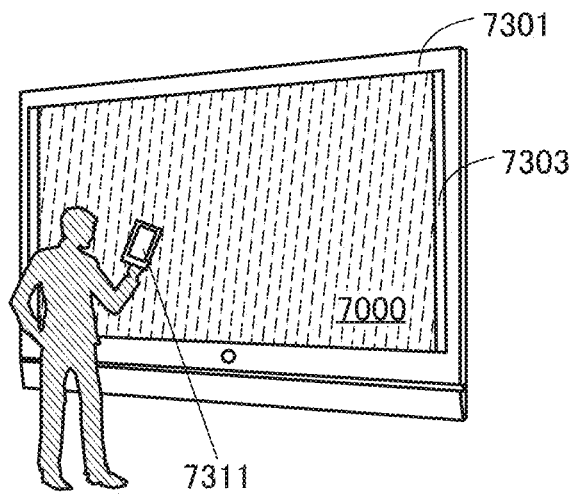
Figure 24D:
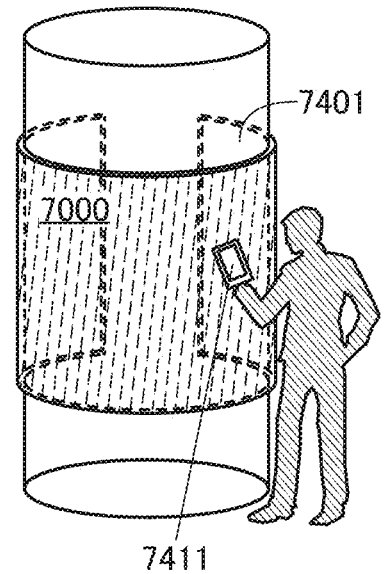

FIGS. 24C and 24D illustrate examples of digital signage.

Digital signage 7300 illustrated in FIG. 24C includes a housing 7301, the display portion 7000, a speaker 7303, and the like. Furthermore, the digital signage can include an LED lamp, operation keys (including a power switch or an operation switch), a connection terminal, a variety of sensors, a microphone, and the like.

FIG. 24D illustrates digital signage 7400 mounted on a cylindrical pillar 7401. The digital signage 7400 includes the display portion 7000 provided along a curved surface of the pillar 7401.

The display unit of one embodiment of the present invention can be used in the display portion 7000 illustrated in each of FIGS. 24C and 24D.

A larger area of the display portion 7000 can increase the amount of data that can be provided at a time. The larger display portion 7000 attracts more attention, so that the effectiveness of the advertisement can be increased, for example.

It is preferable to use a touch panel in the display portion 7000 because a device with such a structure does not just display still or moving images on the display portion 7000 but can be operated by users intuitively. Moreover, for an application for providing information such as route information or traffic information, usability can be enhanced by intuitive operation.

It is preferable that the digital signage 7300 or the digital signage 7400 work with an information terminal 7311 or an information terminal 7411 such as a user's smartphone through wireless communication, as illustrated in FIGS. 24C and 24D. For example, information of an advertisement displayed on the display portion 7000 can be displayed on a screen of the information terminal 7311 or the information terminal 7411. By operation of the information terminal 7311 or the information terminal 7411, display on the display portion 7000 can be switched.

It is possible to make the digital signage 7300 or the digital signage 7400 execute a game with the use of the screen of the information terminal 7311 or the information terminal 7411 as an operation means (controller). Thus, an unspecified number of people can join in and enjoy the game concurrently.

Electronic devices illustrated in FIGS. 25A to 25F include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays), a microphone 9008, and the like.

The electronic devices illustrated in FIGS. 25A to 25F have a variety of functions. For example, the electronic devices can have a function of displaying a variety of data (a still image, a moving image, a text image, and the like) on the display portion, a touch panel function, a function of displaying a calendar, date, time, and the like, a function of controlling processing with the use of a variety of software (programs), a wireless communication function, and a function of reading out and processing a program or data stored in a recording medium. Note that the functions of the electronic devices are not limited thereto, and the electronic devices can have a variety of functions. The electronic devices may include a plurality of display portions. The electronic devices may include a camera or the like and have a function of taking a still image or a moving image and storing the taken image in a recording medium (an external recording medium or a recording medium incorporated in the camera), a function of displaying the taken image on the display portion, or the like.

The electronic devices illustrated in FIGS. 25A to 25F are described in detail below.

Figure 25A:
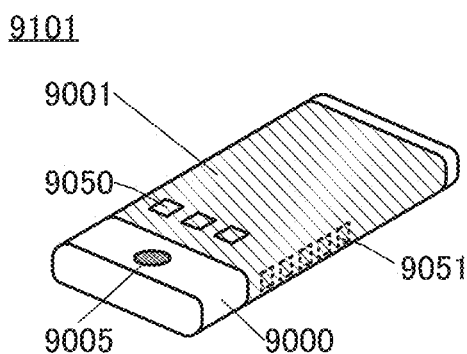
FIGS. 25A to 25F are views each illustrating an example of an electronic device.

FIG. 25A is a perspective view illustrating a portable information terminal 9101. The portable information terminal 9101 can be used as a smartphone, for example. Note that the portable information terminal 9101 may be provided with the speaker 9003, the connection terminal 9006, the sensor 9007, or the like. The portable information terminal 9101 can display text and image information on its plurality of surfaces. FIG. 25A shows an example where three icons 9050 are displayed. Information 9051 indicated by dashed rectangles can be displayed on another surface of the display portion 9001. Examples of the information 9051 include notification of reception of an e-mail, an SNS message, or an incoming call, the title and sender of an e-mail, an SNS message, or the like, the date, the time, remaining battery, and the reception strength of an antenna. Alternatively, the icon 9050 or the like may be displayed in the position where the information 9051 is displayed.

Figure 25C:
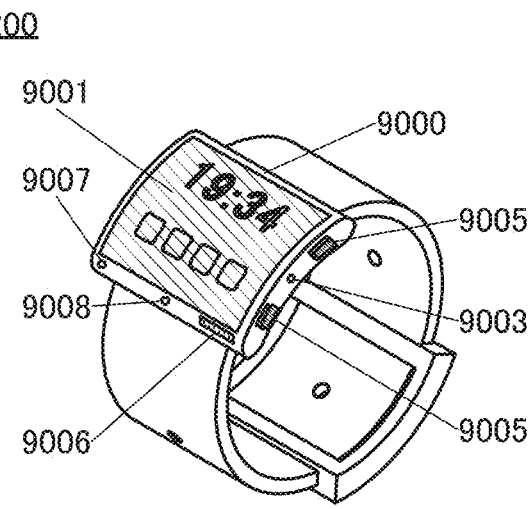
Figure 25B:
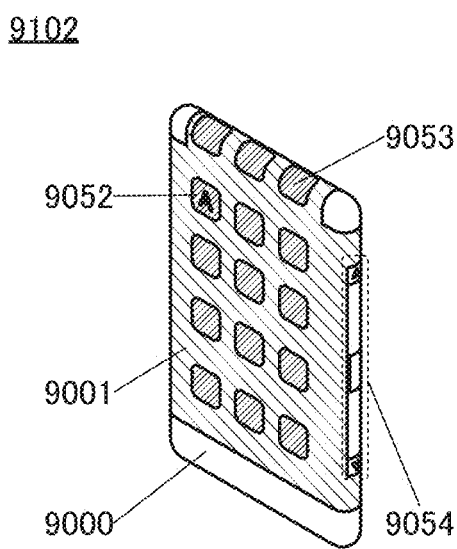

FIG. 25B is a perspective view illustrating a portable information terminal 9102. The portable information terminal 9102 has a function of displaying information on three or more surfaces of the display portion 9001. Here, an example in which information 9052, information 9053, and information 9054 are displayed on different surfaces is shown. For example, the user can check the information 9053 displayed in a position that can be observed from above the portable information terminal 9102, with the portable information terminal 9102 put in a breast pocket of his/her clothes. The user can see the display without taking out the portable information terminal 9102 from the pocket and decide whether to answer the call, for example.

FIG. 25C is a perspective view illustrating a watch-type portable information terminal 9200. The portable information terminal 9200 can be used as a smart watch, for example. The display surface of the display portion 9001 is curved, and display can be performed along the curved display surface. Furthermore, for example, mutual communication between the portable information terminal 9200 and a headset capable of wireless communication can be performed, and thus hands-free calling is possible. With the connection terminal 9006, the portable information terminal 9200 can perform mutual data transmission with another information terminal and charging. Note that the charging operation may be performed by wireless power feeding.

Figure 25D:
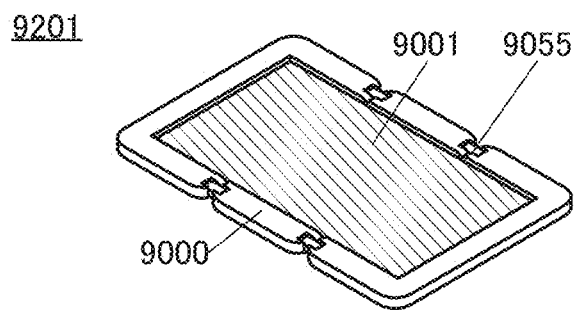
Figure 25E:
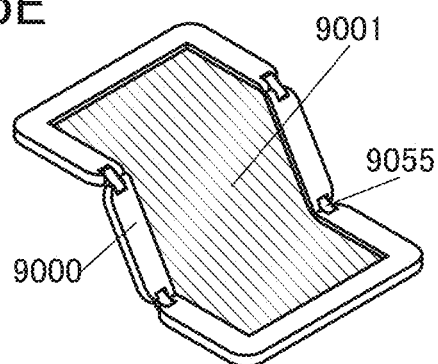
Figure 25F:
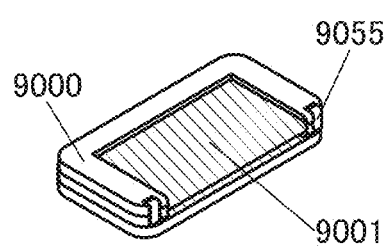

FIGS. 25D to 25F are perspective views of a foldable portable information terminal 9201 that is opened, that is shifted from the opened state to the folded state or from the folded state to the opened state, and that is folded, respectively. The portable information terminal 9201 is highly portable in the folded state and is highly browsable in the opened state because of a seamless large display region. The display portion 9001 of the portable information terminal 9201 is supported by three housings 9000 joined by hinges 9055. For example, the display portion 9001 can be folded with a radius of curvature of greater than or equal to 0.1 mm and less than or equal to 150 mm.

This embodiment can be combined with any of the other embodiments as appropriate.

Example

As described in Embodiment 1, one way of removing the influence of ambient light which is noise in touch sensing is to obtain a difference in detection intensity of a light-receiving device (or a light-emitting and light-receiving device) between a lighting period and a non-lighting period by periodically repeating lighting and non-lighting of a light-emitting device (see FIGS. 4A to 4F).

In this example, results of two types of evaluations are described. In Evaluation 1, a difference in detection intensity of a light-receiving device between a lighting period and a non-lighting period of a light-emitting device was evaluated. In Evaluation 2, an influence of the position of an opening which is of a light-blocking layer and provided in a position overlapping with a light-receiving device on light detection of the light-receiving device was evaluated.

[Evaluation 1]

In Evaluation 1, a display unit including organic EL devices and organic photodiodes in its display portion was used.

Figure 26:
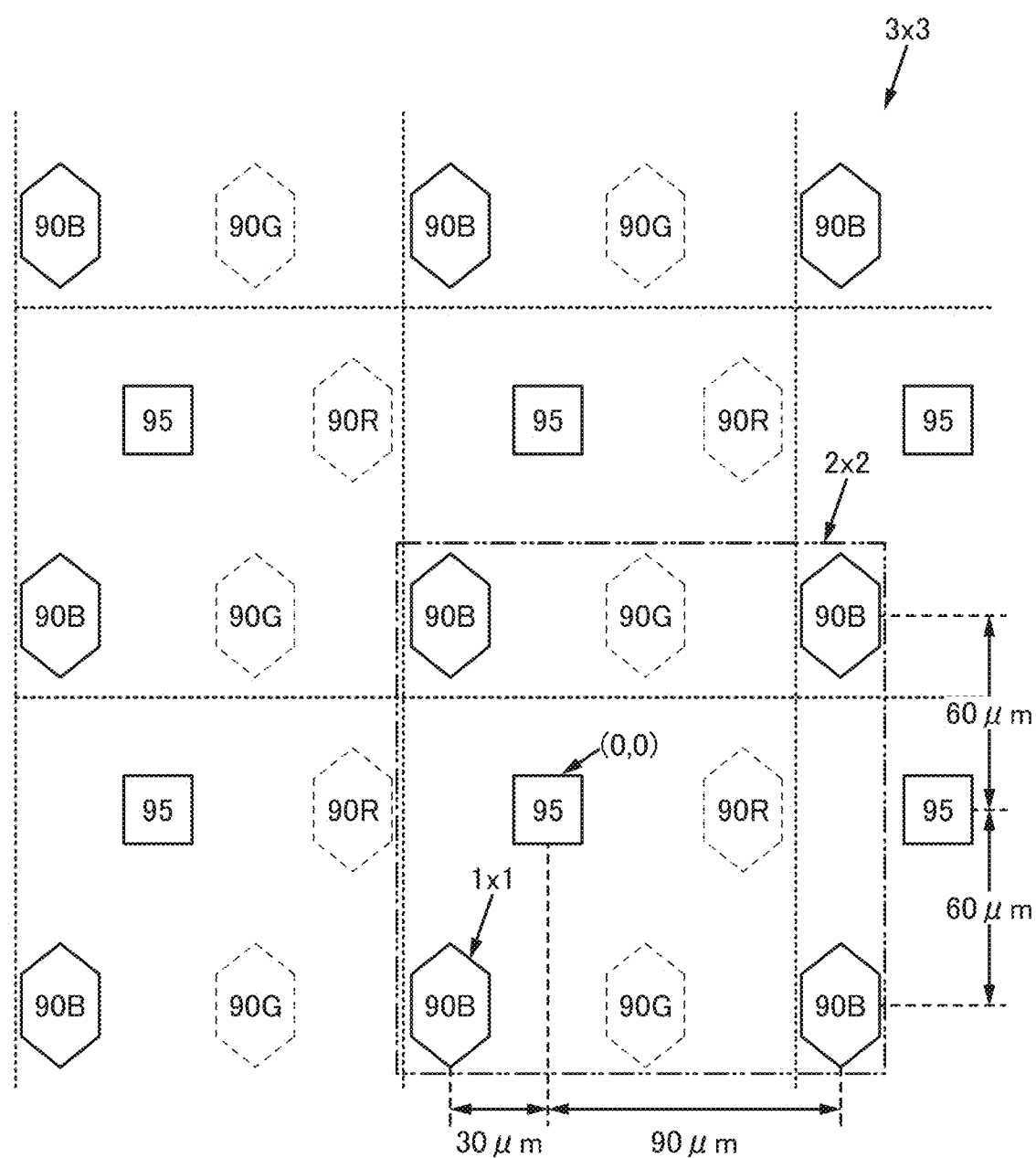
FIG. 26 is a view illustrating a pixel layout of a display unit of Example.

FIG. 26 illustrates a pixel layout of the display unit used for Evaluation 1. In Evaluation 1, the light-emitting device 90B which emits blue light was used as a light source and light detection was performed by the light-receiving device 95. For this reason, in FIG. 26, the light-emitting device 90B and the light-receiving device 95 are shown by solid lines and the light-emitting device 90R which emits red light and the light-emitting device 90G which emits green light are shown by broken lines.

The organic EL devices and the organic photodiodes were formed by a side-by-side method. The display unit was designed so that the light-emitting devices 90R, 90G, and 90B of the colors and the light-receiving device 95 are evenly arranged as illustrated in FIG. 26. Note that the shape and size of openings of the light-blocking layer were designed to be equal to those of the light-emitting regions of the light-emitting devices 90R, 90G, and 90B and the light-receiving region of the light-receiving device 95.

In Evaluation 1, touch sensing was performed by the light-receiving device 95 at the address (0, 0). Monochromatic display was performed in the areas of the following three conditions, 1×1 pixel, 2×2 pixels, and 3×3 pixels, with the display unit touched by an object, and the light-emitting device(s) 90B was made to emit light and to stop emitting light. Light was sensed by the light-receiving device 95 in each of a lighting period and a non-lighting period, and a difference in detection intensity was calculated. In the monochromatic display, black display was performed under conditions which assume touch sensing on a dark screen, and blue display was performed under conditions which assume touch sensing on a bright screen.

In the case where lighting and non-lighting repeat in one pixel, the lower-left light-emitting device 90B which was one of the light-emitting devices 90B which are the closest to the light-receiving device 95 at the address (0, 0) was used to perform lighting and non-lighting. In the case where the number of pixels where lighting and non-lighting repeat is 2×2, four light-emitting devices 90B provided in the 2×2 pixels surrounded by dashed double-dotted lines were used to perform lighting and non-lighting. In the case where the number of pixels where lighting and non-lighting repeat is 3×3, all the nine light-emitting devices 90B provided in the 3×3 pixels in FIG. 26 were used to perform lighting and non-lighting.

Figure 27A:
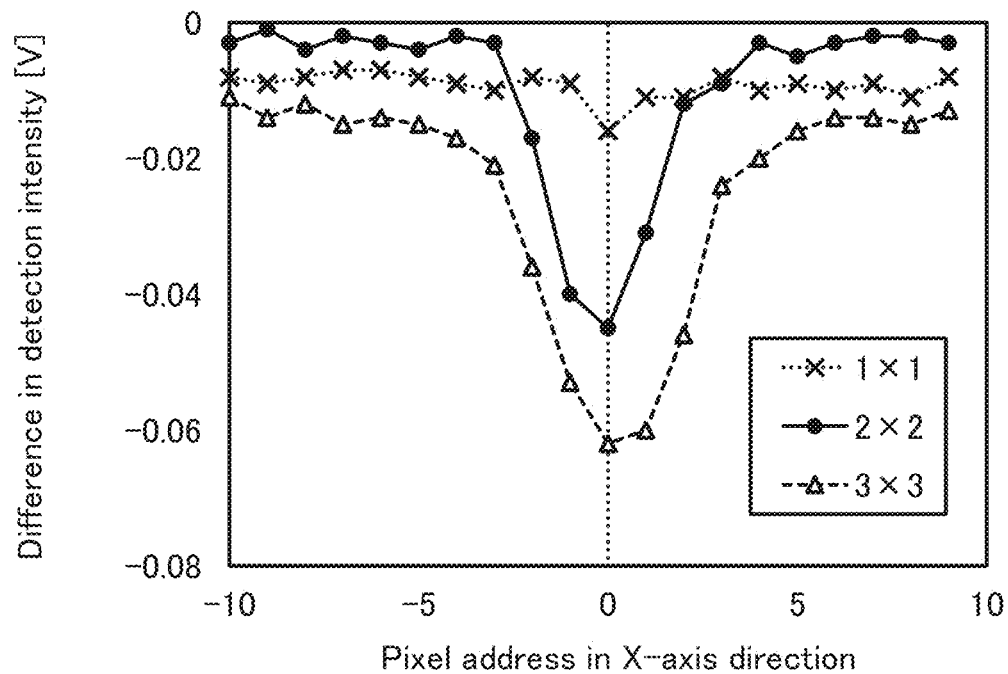
FIGS. 27A and 27B are graphs showing a difference in detection intensity of a light-receiving device between a lighting period and a non-lighting period of a light-emitting device(s)
Figure 27B:
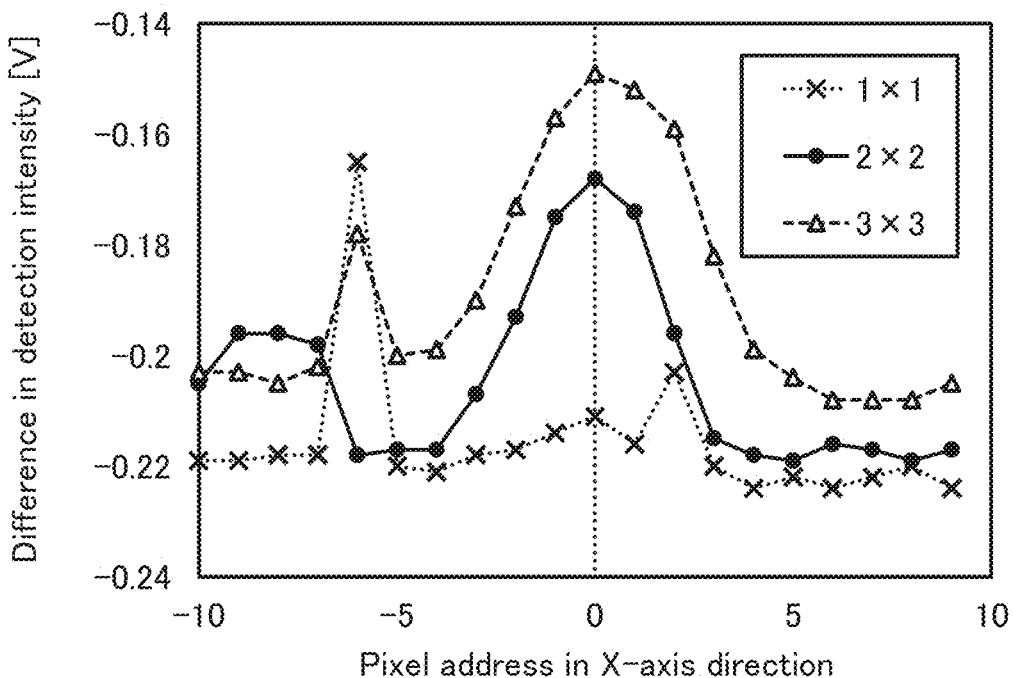

FIG. 27A shows results under conditions which assume the dark screen, and FIG. 27(B) shows results which assume the bright screen.

As shown in FIGS. 27A and 27B, any difference in detection intensity of the light-receiving device between lighting and non-lighting periods of the 1×1 pixel was not observed in both of the dark and bright screen conditions. In contrast, a difference in detection intensity of the light-receiving device between lighting and non-lighting periods of the 2×2 pixels and the 3×3 pixels was observed in both of the dark and bright screen conditions. Furthermore, the results were not largely different between the case where lighting and non-lighting repeat in the 2×2 pixels and the case where lighting and non-lighting repeat in the 3×3 pixels.

From the results of Evaluation 1, it was found that the surrounding light-emitting devices provided in the 2×2 pixels work on light sensing of the light-receiving device.

[Evaluation 2]

In Evaluation 2, whether changing the position of the opening which is of the light-blocking layer and provided in a position overlapping with the light-receiving device can increase the influence of a particular light-emitting device on light sensing of the light-receiving device was evaluated by ray tracing simulation.

Figure 28A:
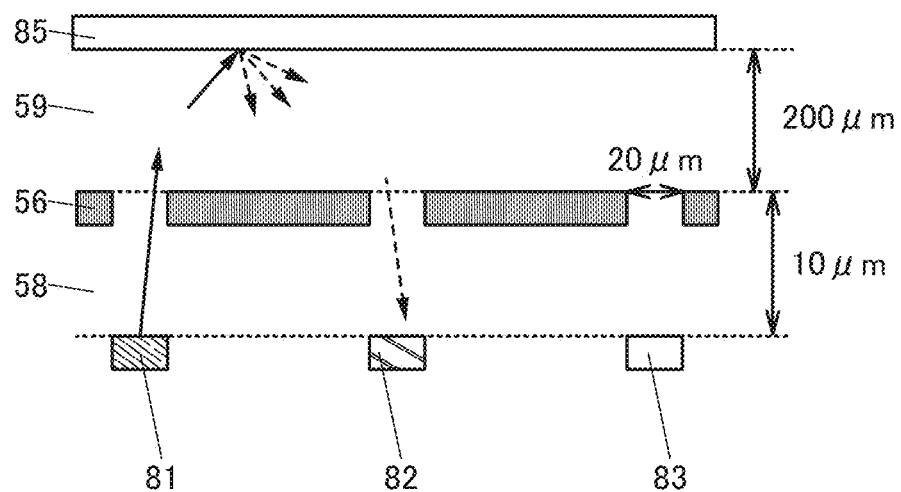
FIGS. 28A and 28B are a cross-sectional view and a top view, respectively, illustrating simulation conditions of Example.
Figure 28B:
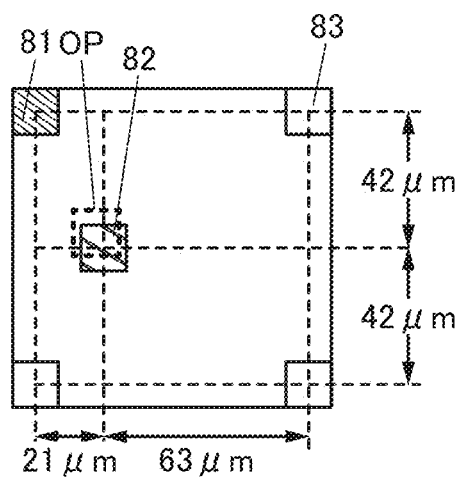

An optical system used for Evaluation 2 is schematically illustrated in FIGS. 28A and 28B.

As illustrated in FIG. 28A, a light-emitting device 81 which repeats lighting and non-lighting, a light-receiving device 82, and a light-emitting device 83 which is continuously in a lighting state were arranged on the same plane. Light emitted by the light-emitting device 81 and the light-emitting device 83 enters the space 58 (thickness: 10 μm, refractive index n=1.5) filled with a sealing resin, the opening OP (size: 12 μm square) of the light-blocking layer 56, and the substrate 59 (thickness: 200 μm, refractive index n=1.52) in this order and is reflected by a scatterer 85 (corresponding to a finger) in contact with the substrate 59. The light reflected by the scatterer 85 passes through the substrate 59, another opening of the light-blocking layer 56, and the sealing resin in this order and enters the light-receiving device 82.

As illustrated in FIG. 28B, one light-emitting device 81 which repeats lighting and non-lighting and three light-emitting devices 83 which are continuously in a lighting state were arranged around one light-receiving device 82. The light-emitting device 81, the light-receiving device 82, the light-emitting devices 83, and the opening of the light-blocking layer 56 were each formed with a size of 12 μm square. The pixel layout was designed so that the resolution of the display unit can correspond to 302 ppi.

The number of received rays of light of the light-receiving device 82 was calculated for a case where the light-emitting device 81 and the three light-emitting devices 83 are all in a lighting state and a case where the light-emitting device 81 is in a non-lighting state and the three light-emitting devices 83 are in a lighting state. Furthermore, the number of received rays of light of the light-receiving device 82 was calculated under several conditions where the opening OP of the light-blocking layer 56 overlapping with the light-receiving device 82 was moved closer to the light-emitting device 81 while keeping the size of 12 μm square, for the above-described two cases.

Figure 29:
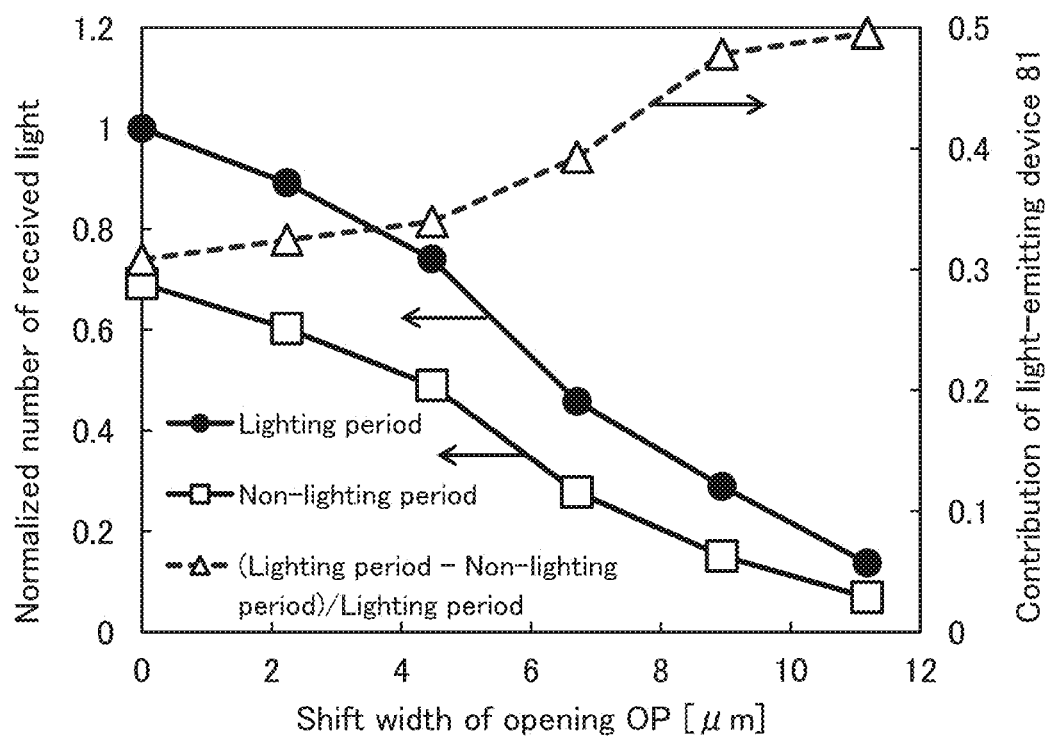
FIG. 29 is a graph showing simulation results of Example.

FIG. 29 shows calculation results. The state in which the opening OP of the light-blocking layer 56 is provided in a position completely overlapping with the light-receiving device 82 corresponds to a shift width of 0 μm. The standardized number of received rays of light was calculated with the number of received rays of light of the light-receiving device 82 obtained when the shift width of the opening OP was 0 μm and the light-emitting device 81 was in a lighting state set at 1.

Both in the lighting period and the non-lighting period, shifting the opening OP reduced the number of received rays of light of the light-receiving device 82. This is probably because the amount of received light coming from the three light-emitting devices 83 was reduced when the opening OP was moved closer to the light-emitting device 81.

Furthermore, when the shift width of the opening OP is too large, the difference in the number of received rays of light between the lighting period and the non-lighting period is small and sensitivity decreased. The difference in the number of received rays of light between the lighting period and the non-lighting period corresponds to the amount of received light coming from the light-emitting device 81 which repeats lighting and non-lighting. It seems that the number of rays of light increased by moving the opening OP closer to the light-emitting device 81 and the light receiving area reduced by an overlap of the light-receiving device 82 and the light-blocking layer 56 are well balanced until the shift width of 5 μm. However, when the shift width becomes over 5 μm, it seems that a reduction of the light receiving area gives a more significant influence and the amount of received light coming from the light-emitting device 81 decreases.

The contribution of the light-emitting device 81 shown in FIG. 29 represents the amount of received light coming from the light-emitting device 81 which repeats lighting and non-lighting when the total amount of received light is assumed to be 1. The contribution of the light-emitting device 81 was approximately 30% at a shift width of 0 μm and was increased to 50% by shifting the opening OP.

The results of Evaluation 2 have revealed that shifting the position of the opening of the light-blocking layer 56 overlapping with the light-receiving device 82 can increase the influence of a particular light-emitting device on light sensing of the light-receiving device.

In Evaluation 1, the difference in detection intensity of the light-receiving device between the lighting period and the non-lighting period of the light-emitting device was evaluated. Enough differences in detection intensity were observed under the conditions where lighting and non-lighting were performed in 4 pixels (2×2 pixels), and almost no difference in detection intensity was seen under the conditions where lighting and non-lighting were performed in one pixel. However, when the number of pixels which repeat lighting and non-lighting becomes larger, flashing of the pixels is more easily recognized by a user of the display unit and the number of pixels used for image display is reduced. It was also found from the results of Evaluation 2 that shifting the position of the opening of the light-blocking layer overlapping with the light-receiving device can increase the influence of a particular light-emitting device on light sensing of the light-receiving device. This will make it possible to obtain an enough difference in detection intensity of the light-receiving device even when the number of pixels which repeat lighting and non-lighting is reduced (even when the number is less than four, for example, one under the conditions of Evaluation 1). The aforementioned results indicate that shifting the position of the opening of the light-blocking layer overlapping with the light-receiving device enables light sensing of the light-receiving device at high accuracy and favorable image display.

This application is based on Japanese Patent Application Serial No. 2019-156895 filed with Japan Patent Office on Aug. 29, 2019, the entire contents of which are hereby incorporated by reference.

What is claimed is:

1. A display unit comprising:
   a first light-emitting device configured to emit light of a first color;
   a second light-emitting device configured to emit light of the first color;
   a first light-receiving device; and
   a light-blocking layer over the first light-emitting device, the second light-emitting device and the first light-receiving device, the light-blocking layer comprising a first opening,
   wherein the light emitted from each of the first light-emitting device and the second light-emitting device is configured to be received by the first light-receiving device through the first opening,
   wherein a is defined as a shortest distance from the first light-emitting device to the first light-receiving device in a top view of the display unit,
   wherein b is defined as a shortest distance from the second light-emitting device to the first light-receiving device in the top view,
   wherein c is defined as a shortest distance from the first light-emitting device to the first opening in the top view,
   wherein d is defined as a shortest distance from the second light-emitting device to the first opening in the top view,
   wherein an absolute value |a−b| is smaller than an absolute value |c−d|, and
   wherein c is shorter than d.

2. The display unit according to claim 1, wherein a is equal to or substantially equal to b.

3. The display unit according to claim 1, wherein the first light-emitting device is the closest to the first light-receiving device among the group consisting of the first light-emitting device and the second light-emitting device.

4. The display unit according to claim 1,
   wherein the first light-emitting device comprises:
   a first pixel electrode;
   a common electrode; and
   a first light-emitting layer between the first pixel electrode and the common electrode,
   wherein the first light-receiving device comprises:
   a second pixel electrode;
   the common electrode; and
   an active layer between the second pixel electrode and the common electrode, and
   wherein the active layer comprises an organic compound.

5. The display unit according to claim 4,
   wherein the first light-emitting device further comprises a first layer between the first pixel electrode and the common electrode, and
   wherein the first light-receiving device further comprises the first layer between the second pixel electrode and the common electrode.

6. The display unit according to claim 4, further comprising a resin layer and a substrate,
   wherein each of the resin layer and the light-blocking layer is positioned between the common electrode and the substrate,
   wherein the resin layer comprises a second opening,
   wherein the second opening and the first light-receiving device overlap each other,
   wherein the resin layer comprises a portion overlapping the first light-emitting device, and
   wherein the light-blocking layer comprises a portion positioned between the common electrode and the resin layer.

7. The display unit according to claim 6, wherein the light-blocking layer covers at least part of the second opening and at least part of a side surface of the resin layer exposed at the second opening.

8. The display unit according to claim 6, further comprising an adhesive layer between the common electrode and the substrate,
   wherein each of the resin layer and the light-blocking layer is positioned between the adhesive layer and the substrate,
   wherein a first portion of the adhesive layer and the first light-receiving device overlap each other,
   wherein a second portion of the adhesive layer and the first light-emitting device overlap each other, and
   wherein the first portion is thicker than the second portion.

9. The display unit according to claim 4, further comprising a resin layer and a substrate,
   wherein each of the resin layer and the light-blocking layer is positioned between the common electrode and the substrate,
   wherein the resin layer has an island shape,
   wherein the resin layer and the first light-emitting device overlap each other,
   wherein the light-blocking layer comprises a portion positioned between the common electrode and the resin layer, and
   wherein at least part of light having passed through the substrate enters the first light-receiving device without passing through the resin layer.

10. The display unit according to claim 9, wherein the light-blocking layer covers at least part of a side surface of the resin layer.

11. The display unit according to claim 1, further comprising a plurality of light-receiving devices including the first light-receiving device,
    wherein the display unit has:
    a first mode to capture an image by all the plurality of light-receiving devices, and
    a second mode to capture an image by a part of the plurality of light-receiving devices.

12. The display unit according to claim 1, wherein the display unit has flexibility.

13. A display module comprising:
    the display unit according to claim 1; and
    a connector or an integrated circuit.

14. An electronic device comprising:
    the display module according to claim 13; and
    at least one of an antenna, a battery, a housing, a camera, a speaker, a microphone and an operation button.

15. A display unit comprising:
    a first light-emitting device configured to emit light of a first color;
    a second light-emitting device configured to emit light of the first color;
    a first light-emitting and light-receiving device configured to emit light of a second color; and
    a light-blocking layer over the first light-emitting device, the second light-emitting device and the first light-emitting and light-receiving device, the light-blocking layer comprising a first opening, wherein the light emitted from each of the first light-emitting device and the second light-emitting device is configured to be received by the first light-emitting and light-receiving device through the first opening, wherein a is defined as a shortest distance from the first light-emitting device to the first light-emitting and light-receiving device in a top view of the display unit, wherein b is defined as a shortest distance from the second light-emitting device to the first light-emitting and light-receiving device in the top view, wherein c is defined as a shortest distance from the first light-emitting device to the first opening in the top view, wherein d is defined as a shortest distance from the second light-emitting device to the first opening in the top view, wherein an absolute value |a−b| is smaller than an absolute value |c−d|, and wherein c is shorter than d.

16. The display unit according to claim 15, wherein a is equal to or substantially equal to b.

17. The display unit according to claim 15, wherein the first light-emitting device is the closest to the first light-emitting and light-receiving device among the group consisting of the first light-emitting device and the second light-emitting device.

18. The display unit according to claim 15,
wherein the first light-emitting device comprises:
   a first pixel electrode;
   a common electrode; and
   a first light-emitting layer between the first pixel electrode and the common electrode,
wherein the light-receiving device comprises:
   a second pixel electrode;
   the common electrode;
   a second light-emitting layer between the second pixel electrode and the common electrode; and
   an active layer between the second pixel electrode and the common electrode, and
wherein the active laser comprises an organic compound.

19. The display unit according to claim 18,
wherein the first light-emitting device further comprises a first layer between the first pixel electrode and the common electrode, and
wherein the first light-emitting and light-receiving device further comprises the first layer between the second pixel electrode and the common electrode.

20. The display unit according to claim 18, further comprising a resin layer and a substrate,
wherein each of the resin layer and the light-blocking layer is positioned between the common electrode and the substrate,
wherein the resin layer comprises a second opening,
wherein the second opening and the first light-receiving device overlap each other,
wherein the resin layer comprises a portion overlapping the first light-emitting device, and
wherein the light-blocking layer comprises a portion positioned between the common electrode and the resin layer.

21. The display unit according to claim 20, wherein the light-blocking layer covers at least part of the second opening and at least part of a side surface of the resin layer exposed at the second opening.

22. The display unit according to claim 20, further comprising an adhesive layer between the common electrode and the substrate,
wherein each of the resin layer and the light-blocking layer is positioned between the adhesive layer and the substrate,
wherein a first portion of the adhesive layer and the first light-emitting and light-receiving device overlap each other,
wherein a second portion of the adhesive layer and the first light-emitting device overlap each other, and
wherein the first portion is thicker than the second portion.

23. The display unit according to claim 18, further comprising a resin layer and a substrate,
wherein each of the resin layer and the light-blocking layer is positioned between the common electrode and the substrate,
wherein the resin layer has an island shape,
wherein the resin layer and the first light-emitting device overlap each other,
wherein the light-blocking layer comprises a portion positioned between the common electrode and the resin layer, and
wherein at least part of light having passed through the substrate enters the first light-receiving device without passing through the resin layer.

24. The display unit according to claim 23, wherein the light-blocking layer covers at least part of a side surface of the resin layer.

25. The display unit according to claim 15, further comprising a plurality of light-emitting and light-receiving devices including the first light-emitting and light-receiving device,
wherein the display unit has:
   a first mode to capture an image by all the plurality of light-emitting and light-receiving devices, and
   a second mode to capture an image by a part of the plurality of light-emitting and light-receiving devices.

26. The display unit according to claim 15, further comprising a plurality of light-emitting and light-receiving devices including the first light-emitting and light-receiving device,
wherein the display unit has:
   a first mode for performing display;
   a second mode for performing image capturing; and
   a third mode for simultaneously performing display and image capturing,
wherein, in the first mode, the display is performed using the first light-emitting device, the second light-emitting device, and all the plurality of light-emitting and light-receiving devices,
wherein, in the second mode, the image capturing is performed by emission from each of the first light-emitting device and the second light-emitting device and by receiving the light using all the plurality of light-emitting and light-receiving devices, and
wherein, in the third mode, image capturing is performed by emission from the first light-emitting device and receiving the light using part of the plurality of light-emitting and light-receiving devices, and the display is performed using the second light-emitting device and the other part of the plurality of light-emitting and light-receiving devices.

* * * * *